US009077602B2

(12) United States Patent
Kumar

(10) Patent No.: US 9,077,602 B2
(45) Date of Patent: Jul. 7, 2015

(54) SYSTEMS AND METHODS FOR FAST AND PRECISE FREQUENCY ESTIMATION

(75) Inventor: Rajendra Kumar, Cerritos, CA (US)

(73) Assignee: The Aerospace Corporation, El Segundo, CA (US)

(*) Notice: Subject to any disclaimer, the term of this patent is extended or adjusted under 35 U.S.C. 154(b) by 293 days.

(21) Appl. No.: 13/486,601

(22) Filed: Jun. 1, 2012

(65) Prior Publication Data

US 2013/0322579 A1  Dec. 5, 2013

(51) Int. Cl.
*H04L 27/00* (2006.01)
*H04L 27/26* (2006.01)
*H04L 27/20* (2006.01)
*H03H 21/00* (2006.01)

(52) U.S. Cl.
CPC ............. *H04L 27/2657* (2013.01); *H04L 27/20* (2013.01); *H03H 21/003* (2013.01); *H04L 27/2676* (2013.01); *H04L 27/2688* (2013.01)

(58) Field of Classification Search
CPC .................................. H04L 1/00; H04L 27/00
USPC .......... 375/343, 341, 340, 316, 229, 232, 233
See application file for complete search history.

(56) References Cited

U.S. PATENT DOCUMENTS

| | | | |
|---|---|---|---|
| 4,959,656 A | 9/1990 | Kumar | |
| 5,019,824 A | 5/1991 | Kumar | |
| 5,165,051 A | 11/1992 | Kumar | |
| 5,283,811 A * | 2/1994 | Chennakeshu et al. | ........ 375/233 |
| 7,317,361 B2 | 1/2008 | Duven et al. | |
| 7,336,597 B2 | 2/2008 | Maltsev et al. | |
| 7,457,366 B2 | 11/2008 | Maltsev et al. | |
| 7,769,703 B2 | 8/2010 | Calise et al. | |
| 7,894,512 B2 | 2/2011 | Beadle et al. | |
| 2005/0207477 A1* | 9/2005 | Monsen | ........................ 375/147 |
| 2006/0098727 A1* | 5/2006 | Kuijk | ............................. 375/232 |
| 2007/0009023 A1* | 1/2007 | Kimata et al. | ................. 375/229 |
| 2007/0248198 A1 | 10/2007 | Voloshin et al. | |
| 2009/0232231 A1 | 9/2009 | Sipila | |
| 2010/0134256 A1* | 6/2010 | Mihota | ........................ 340/10.1 |

OTHER PUBLICATIONS

W. Hurd, J. Statman, and V. Vilnrotter; "High Dynamic GPS Receiver Using Maximum Likelihood Estimation and Frequency Tracking," IEEE Transactions on Aerospace and Electronic Systems, Jul. 1987, pp. 425-437, vol. AES-23, No. 4.

* cited by examiner

*Primary Examiner* — Kevin M Burd
(74) *Attorney, Agent, or Firm* — Sutherland Asbill & Brennan LLP

(57) ABSTRACT

Systems and methods are provided for fast and precise estimation of frequency with relatively minimal sampling and relatively high tolerance to noise.

25 Claims, 53 Drawing Sheets

SYSTEMS AND METHODS FOR FAST AND PRECISE FREQUENCY ESTIMATION

BACKGROUND

Frequency estimation systems are an important subsystem of communication, navigation, radar and various other engineering systems. In some cases, the ability to perform relatively efficient and precise estimation of frequency may be a critical component in system design. Indeed, an inability to perform relatively efficient and precise estimation may significantly limit the performance of these systems as measured by various metrics of performance. For example, in high dynamic global positioning satellite (GPS) receiver applications, effectively acquiring and tracking the GPS carrier signal under dynamic conditions may limit the performance and applicability of these receivers to various applications. For this reason, various architectures suited to such applications have been previously proposed that acquire and track the GPS carrier under dynamic conditions, with the various different methods having a variety of limitations in terms of signal-to-noise ratio, initial frequency uncertainty, and other metrics of performance.

In terms of communication systems, precise frequency and phase may be important in communication systems involving coherent modulation techniques such as multiple quadrature amplitude modulation (MQAM) and multiple phase shift keying (MPSK). In certain communication applications, techniques, such as square law loop or Costas type loop, are used to derive the carrier frequency and phase from modulated signals, or a pilot signal is used which is tracked. The use of square law loop or Costas type loop result in significant loss in terms of phase noise of the reference carrier and phase ambiguity problems associated with phase ambiguity in the carrier phase equal to integer multiple of $2\pi/M$ for the MPSK signal. The use of pilot carrier results in a loss of signal power because a significant part of available power is used up in the pilot. The ability to provide fast and accurate frequency and phase estimates at very low signal-to-noise ratios (SNRs) may reduce the loss due to pilot carrier to an insignificant value.

More recently, precise and fast frequency acquisition and tracking have become increasingly important with the evolution of the Orthogonal Frequency Division Multiplexing (OFDM) in mobile communication systems. The OFDM modulation scheme may reduce problems of inter symbol interference (ISI) caused by multipath propagation. It may also exhibit relatively high performance in selective fading environments. Due to these and other features, OFDM has become part of various standards such as Worldwide Interoperability for Microwave Access (WiMax). Because OFDM is based on the orthogonality among various subcarrier signals, it is very important that this orthogonality be maintained when these subcarriers are received at the receiver. However, the mobile wireless channels introduce frequency offsets which cause disruption of the orthogonality among the subcarriers resulting in mutual interference among the various subcarriers. Therefore, it is desirable to precisely estimate such frequency offsets and correct them to avoid problems associated with intercarrier interference. The offsets may be functions of time and may vary with different subcarriers. Therefore, it is further desirable that precise estimation of the frequency offset be made with a minimum requirement on the estimation time and SNR, which is also limited in systems involving error correction coding techniques.

Some of the previous techniques for frequency estimation are based on the extended Kalman filter (EKF). In these techniques, the state of the Kalman filter is comprised of the signal phase, frequency and possibly one or more derivatives of the frequency, and the measurement is a nonlinear function of the state vector. In this approach, the measurement function is linearized about the current estimate of the state. Thus the technique based on EKF is more appropriate in the tracking mode when the initial estimate of the state is close to the true state and under a relatively high signal-to-noise ratio condition. However, when fast acquisition is required starting with a relatively high frequency uncertainty and/or in low signal-to-noise ratio conditions, the EKF based methods may not meet the required performance as they have relatively high thresholds for required signal power to noise density ratio ($P/N_0$). Therefore, if the $P/N_0$ ratio is below the threshold, the EKF may fail to converge and instead it may diverge. In other words, when the EKF diverges, the state estimation error, instead of converging to relatively small value as more and more measurement samples are processed, increases with the number of samples processed and approaches a large estimation error. The EKF estimator also results in a phase locked loop (PLL) configuration with time-varying loop filter coefficients and is thus also an "optimum" PLL. Thus the PLLs have similar limitations as the EKFs.

In fast Fourier transform (FFT) methods for frequency estimation, the N-point Fourier transform of a signal is evaluated, and the peak of the absolute values of the FFT is searched. The FFT frequency corresponding to the peak is taken as the estimate of the unknown frequency associated with the signal. The FFT method has two limitations. First, the estimation error is of the order of the FFT resolution frequency that is equal to (2B/N) where 2B is the interval of frequency uncertainty. Second, in a relatively low SNR condition, selection of the peak among N noisy outputs of the transform involves detection errors corresponding to a large estimation error in the range of $-B$ to B Hz. Increasing the sampling (N) reduces the resolution frequency; however, concurrently it also increases the probability of detecting the incorrect peak thus exhibiting threshold effects with respect to the SNR level.

The techniques that have been used in the estimation of the frequency offset in OFDM systems, based on the assumption that the offset is same for all the sub-carriers, involve correlating the received signal with a reference signal and thereby determining the relative phase between the two signals. By estimating the relative phase at two different time instances and dividing the difference between the two relative phase differences by the time difference provides the frequency estimate. The correlation operation requires that the integration interval $T_I$ for the correlation operation may be much smaller than the inverse of the offset frequency $f_a$ else the signal amplitude at the correlator output will be small and close to zero if $T_I \cong 1/f_a$. On the other hand, selection of a small $T_I$ leads to relatively large noise at the integrator output which may result in a noisy phase estimate. Differencing the noisy phase estimates may further accentuate the estimation error. Thus the correlation based approach has limitations in terms of the magnitude of the frequency offset and the SNR condition under which it will provide a satisfactory result.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures.

DETAILED DESCRIPTION

Figure 1:
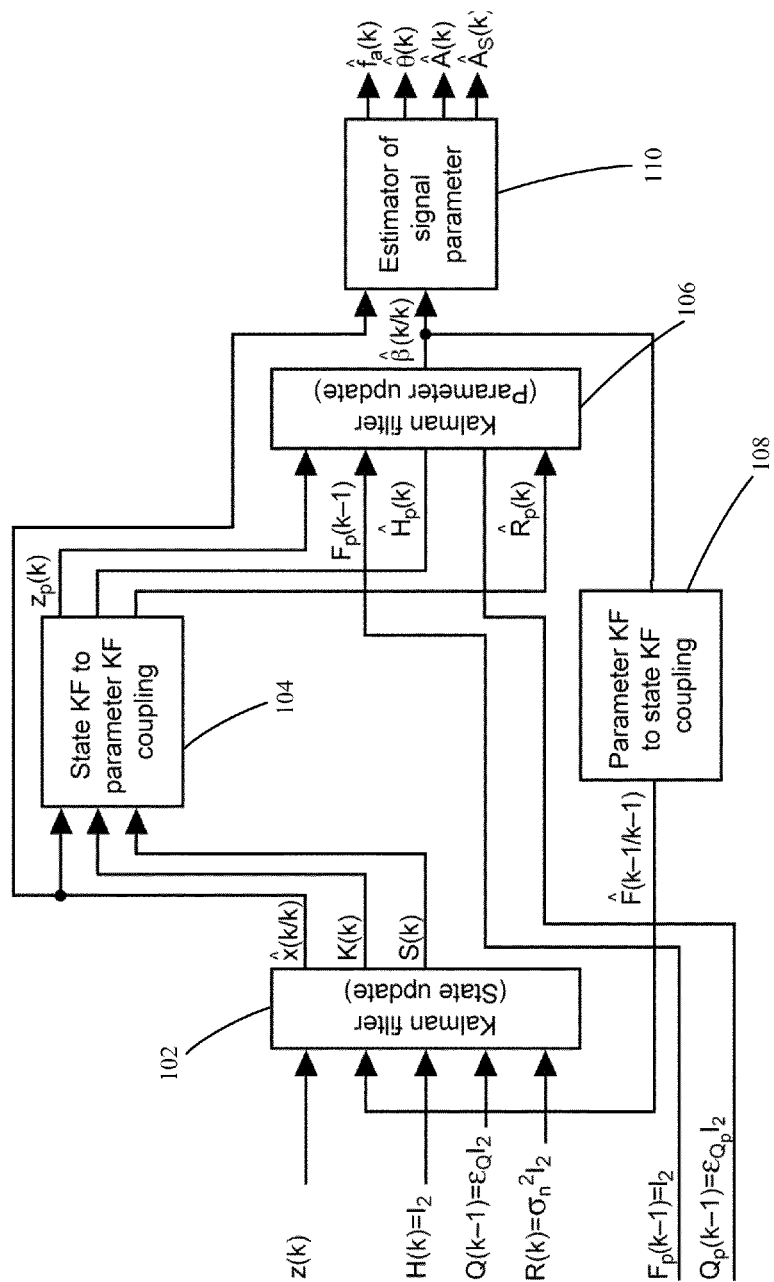
FIG. 1 is a block diagram illustrating an example architecture for providing signal parameter estimation, in accordance with embodiments of the disclosure.

Embodiments of the disclosure are described more fully hereinafter with reference to the accompanying drawings, in which embodiments of the disclosure are shown. This disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers refer to like elements throughout.

Embodiments of the disclosure are directed to, among other things, estimation of parameters associated with a signal. The disclosure provides a variety of architectures based on Adaptive Kalman filter (AKF) and Fast Fourier Transform (FFT) methods. These various architectures provide relatively fast and precise frequency estimates along with estimates of amplitudes, and phase for the case of single and multiple carriers present in the received signal. The various architectures operate on a vast range of signal-to-noise ratios wherein those operating in low signal-to-noise ratio conditions involve relatively higher computational effort such that over a relatively large range of SNRs, a high precision of estimation is achieved. The various architectures presented also provide precise estimates for the case involving significant frequency derivatives, wherein the frequency derivatives may also be estimated from the received signal and accurate tracking of time-varying frequency is achieved.

The various architectures presented in this disclosure may further be used for single or multiple sinusoidal signals present in the sampled received signal. These architectures include one or more adaptive Kalman filters (AKF). The adaptive Kalman filter is comprised of two coupled Kalman filters. The first Kalman filter (KF) is the state update Kalman filter (SUKF) that may estimate a state vector x(k) that may include in-phase and quadrature components of a sinusoidal signal received in the presence of noise. The SUKF may provide the filtered estimates of the in-phase and quadrature components of the sinusoidal signal, thus filtering out the additive noise from the measurements. The SUKF is based on a state model, where the elements of a state transition matrix associated with the state model are the cos and sin functions of the normalized frequency $\omega_0 = 2\pi f_d/F_s$ where $f_d$ is the frequency of the received signal and $F_s$ is the sampling frequency. Based on the information provided by the SUKF, the second Kalman filter, termed the parameter update Kalman filter (PUKF), provides the estimates of a parameter vector $\beta$ whose elements are $\cos(\omega_0)$ and $\sin(\omega_0)$. Based on a delayed filtered parameter vector estimate $\hat{\beta}(k-1/k-1)$, the state transition matrix for the SUKF is generated. The two Kalman filters operate in a back to back manner providing the state and the parameter vector estimates $\hat{x}(k/k)$ and $\hat{\beta}(k/k)$ for k=1, 2, .... From the state and the parameter vector estimates, the estimates for the frequency, phase, and amplitude are obtained in terms of simple functions of the state and parameter vector estimates. Unlike the EKF, the AKF does not involve any linearization; therefore, it provides fast frequency estimates when the initial frequency offset is relatively large and under medium SNR conditions. Simulations show that for an SNR of 7 dB, an RMS frequency estimation error of about 3 Hz is obtained in about 10 samples when the initial frequency is selected randomly from the range of −50 to +50 Hz and the sampling frequency is 400 Hz. With an increasing number of samples, the RMS error tends to be zero.

In the case of signals with randomly time-varying frequency with independent incremental change at each sample, the AKF may closely track the frequency with the estimation error close to the random independent change in frequency at each time instance. However, in the case of significant frequency derivatives that may themselves be slowly varying functions of time, the disclosure presents another embodiment wherein the frequency derivatives are explicitly estimated, thereby achieving a rapid acquisition followed by close tracking of frequency with relatively small error. Another embodiment of the disclosure presents acquisition and tracking of multiple, N sinusoidal signals present in the received signal, wherein the various frequencies may also have significant frequency derivatives. In this embodiment, the estimator referred to as the adaptive Kalman filter-multiple frequency (AKF-MF), the state update Kalman filter (SUKF) may have dimension 2N and the PUKF may have N KFs with each estimating a parameter vector of dimension 2. In yet another embodiment, the input signal is first filtered by a bank of M polyphase filters or the M FFT filters followed by the AKF-MFs thus resulting in the reduction of the dimension of the SUKF. The estimates from the M AKF-MFs are appropriately combined to provide the final estimates of the frequencies, frequency derivatives, amplitudes and phase of the N sinusoidal signals present in the received signal.

As the SNR is reduced below some value, there is a non-zero probability that the estimates do not converge to small values that are of the order of that predicted from the theoretical Cramer-Rao (C-R) bound. To avoid this possibility, in another embodiment of the disclosure, the input signal, or a segment thereof, is correlated with the complex exponential function of frequencies equal to the estimate provided by the AKF-MF. If the correlation values are not above a certain bound in magnitude, the AKF-MF is rerun with different initial frequency estimates. The process is repeated until a threshold condition is satisfied or the number of trials exceeds a specified number. At the end of the first estimation step, the input signal is reprocessed with N individual single frequency KFs, referred to herein as AKF-SFs, with their initial frequencies provided by the first stage estimation. The second stage may also involve processing of the input signal in segments and the operation of frequency shift at the end of processing each segment and reprocessing each segment multiple times such that the frequency to be estimated by the AKF-SF approaches zero at the end of each segment processing, and the estimates from adaptive Kalman filter sub-systems (AKF-SSs) are accumulated to provide final frequency estimates for the N input frequencies along with other parameters of interest. Simulation examples show that the use of this embodiment results in a root mean squared (RMS) frequency estimation error obtained with 50 random frequency selections in the range of −100 to 100 Hz, and with 100 simulation runs for each such frequency selection, of about 3 Hz for an SNR of 7 dB and in 10 input signal samples with no outliers. This compares to about a 2 Hz RMS theoretical C-R lower bound on the RMS error.

Another embodiment of the disclosure, for the case of very low SNRs (∼−10 dB), involves three stages of estimation. In the first stage, the input signal may be provided at the input to an M-point FFT with M≥N where N is the number of frequencies in the input signal. The FFT may provide, at its output, an estimate of average power present at the M FFT frequencies. A frequency selector block may select $N_f \leq M$ frequencies from the M FFT frequencies corresponding to the highest average power levels. The selected $N_f$ frequencies may be inputted to a bank of $N_f$ AKF-SS that processes the input signal to arrive at the final frequency estimates $f_m^K$, m=0, 1, ..., $N_f$−1. The average power present at the $N_f$ frequencies may be evaluated by correlation. For the case of N equal to 1, two frequencies out of the $N_f$ frequencies $f_m^K$ with the highest power levels may be selected and their corresponding respective values may be compared to threshold values. If the threshold condition is satisfied, the final estimate $f'$ from the stage 2 of estimation is determined from the two selected frequencies. If the threshold condition is not satisfied, the first and second processes of the estimation are repeated with a frequency offset introduced in the input signal. In the third process of the estimation, the input signal may be shifted in frequency by a complex exponential function at frequency $f'$. The resulting frequency shifted signal may be averaged over an appropriate interval, and the signal thus obtained may be reprocessed by the AKF to achieve the final estimate of the frequency $f_a$. For the case of N>1, instead of selecting two frequencies in the second stage, N frequencies with the highest power may be selected. The N estimates from the third stage may be provided to the third stage that is comprised of N AKFs, one for each of the N frequencies. Simulations show that this architecture provides very small frequency estimation error even at very low SNRs. For example, at an SNR of −10 dB, an RMS error equal to a fraction of 1 Hz is achieved in about 200 samples with the frequency selected randomly from the range of −200 to 200 Hz. While the disclosure presents various comprehensive architectures for the estimation of frequency and other parameters of multiple sinusoidal signals present in the input signal, these architectures can be adapted to a variety of applications that involve frequency estimation in one or more forms.

Frequency Estimation with Adaptive Kalman Filter (AKF)

Various embodiments of the disclosure describe the adaptive Kalman filter (AKF) estimator and the FFT and correlation based estimators for fast and precise estimation of the frequencies, amplitudes and phases of multiple sinusoidal signals received in the presence of noise when the interval of observation is relatively limited. The first embodiment of the disclosure describes the adaptive Kalman filter (AKF) estimator for the case of a single sinusoidal signal present in the presence of noise. The frequency of the signal may remain constant over the interval of observation or may have some random time-varying component associated with it. In alternative embodiments of the AKF estimator, both the frequency and the frequency derivative may be estimated when there is a significant non-zero frequency derivative present during the observation interval, and the derivative itself may be a constant or varying slowly during the interval of observation. Various embodiments of different computational complexity are presented for signal-to-noise ratios ranging over medium to relatively very low values.

Estimation of Single Frequency

The embodiment of the disclosure for the AKF estimator for estimating the frequency, amplitude and phase of a signal, including a single sinusoidal signal, is disclosed first. In this case, the intermediate frequency signal of some unknown but constant frequency received in the presence of band pass white Gaussian noise over an interval of time of length $T_0$ is given by $$z_{IF}(t) = A \cos(2\pi(f_c + f_a)t + \phi) + n(t); 0 \leq t \leq T_0 \quad (1)$$

In (1), $f_c$ is known IF frequency, and the unknown frequency $f_a$ has a value in the range of −B to B Hz. The parameters A and $\phi$ are the amplitude and phase, respectively, both of which are also unknown. The band pass white noise n(t) may have a one-side noise power spectral density of $N_0$ W/Hz. Thus the input signal to noise power ratio is $A^2/(4N_0B)$, and the signal power to noise power spectral density ratio is equal to $A^2/(2N_0)$ with the signal power $A^2/2$. The corresponding base band model obtained by the down conversion of the IF signal to complex baseband is given by $$z_i(t) = A \cos(\omega_a t + \phi) + n_i(t) \quad (2a)$$

$$z_q(t) = A \sin(\omega_a t + \phi) + n_q(t) \quad (2b)$$

In (2a, 2b) $z_i(t)$ and $z_q(t)$ are the in-phase and quadrature baseband signals and $\omega_a = 2\pi f_a$. The baseband noise processes $n_i(t)$ and $n_q(t)$ are independent white noise processes with the two-sided power spectral density $N_0$. This embodiment discloses an adaptive Kalman filter (AKF) estimator to estimate the unknown parameters A, $\omega_a$, and $\phi$ with minimum possible errors such that the performance is close to theoretical bounds on such errors. Each of the baseband signals has power $A^2/2$ with the total baseband signal power equal to $A^2$. In the embodiment, the signal power refers to the total baseband power.

The signals $z_i(t)$ and $z_q(t)$ are sampled at a sampling rate $F_s$ that is at least two times the maximum possible value of the unknown frequency $f_a = \omega_a/2\pi$. The corresponding discrete time version of the measurements is given by $$z_i(k) = A \cos(k\omega_0 + \phi) + n_i(k) \quad (3)$$

$$z_q(k) = A \sin(k\omega_0 + \phi) + n_q(k); k = 0, 1, \ldots, N_s \quad (4)$$

In equations (3) and (4), k denotes the discrete time index, and $\omega_0 = \omega_a T_s$ is the digital frequency in radians (rad), with $T_s = 1/F_s$, denoting the sampling period. The sampled noise sequences $n_i(k)$ and $n_q(k)$ are independent random sequences with zero mean and variance $\sigma_n^2 = N_0/T_s$. For the purpose of estimation of the unknown parameters A, $\omega_0$ and $\phi$ by the AKF, the state variables $x_1(k)$ and $x_2(k)$ are defined as $$x_1(k) = A\cos(k\omega_0 + \phi) \tag{5}$$

$$x_2(k) = A\sin(k\omega_0 + \phi) \tag{6}$$

Using trigonometric expansion yields $$x_1(k+1) = A\cos(\omega_0(k+1) + \varphi) \tag{7}$$
$$= A\cos(\omega_0 k + \varphi)\cos(\omega_0) - A\sin(\omega_0 k + \varphi)\sin(\omega_0)$$

From (5) (7), the following state update equation for the first state component $x_1(k)$ is obtained $$x_1(k+1) = \beta_1 x_1(k) - \beta_2 x_2(k) \tag{8}$$

where $\beta_1$ and $\beta_2$ are parameters given by $$\beta_1 = \cos(\omega_0); \beta_2 = \sin(\omega_0) \tag{9}$$

Similarly expansion of $x_2(k+1)$ yields $$x_2(k+1) = A\sin(\omega_0(k+1) + \varphi) \tag{10}$$
$$= A\sin(\omega_0 k + \varphi)\cos(\omega_0) + A\cos(\omega_0 k + \varphi)\sin(\omega_0)$$

From (5), (6), (8) and (10) one obtains $$x_2(k+1) = \beta_2 x_1(k) + \beta_1 x_2(k) \tag{11}$$

Equations (8) and (11) may be expressed in the following matrix vector form $$x(k+1) = Fx(k) \tag{12}$$

$$x(k) = \begin{bmatrix} x_1(k) \\ x_2(k) \end{bmatrix}; F = \begin{bmatrix} \beta_1 & -\beta_2 \\ \beta_2 & \beta_1 \end{bmatrix} \tag{13}$$

The measurement equations (3) and (4) for the AKF estimator may also be written in the matrix vector form $$z(k) = \begin{bmatrix} z_i(k) \\ z_q(k) \end{bmatrix} = Hx(k) + n(k); n(k) = \begin{bmatrix} n_i(k) \\ n_q(k) \end{bmatrix} \tag{14}$$

In (14), the measurement matrix H is equal to the 2×2 identity matrix.

FIG. 1 is a block diagram illustrating an example adaptive Kalman filter (AKF) 100 in accordance with embodiments of the disclosure. In one aspect, the AKF 100 may be configured for the estimation of the frequency $f_a$, amplitude A and phase $\phi$ of the received signal $z_{IF}(t)$ from the sampled noisy in-phase and quadrature signals $z_i(k)$ and $z_q(k)$ in (3)-(4). The AKF may include two coupled Kalman filters. The first Kalman filter (KF) may be the state update Kalman filter (SUKF) 102 that may estimate the state vector x(k) that may include the in-phase and quadrature components of the sinusoidal signal received in the presence of noise. The SUKF 102 may provide the filtered estimates of the in-phase and quadrature components of the sinusoidal signal, thus filtering out the additive noise from the measurements. The output of the SUKF 102 may be based on the state model, wherein the elements of the state transition matrix are the cos and sin functions of the normalized frequency $\omega_0 = 2\pi f_a/F_s$ where $f_a$ is the frequency of the received signal and $F_s$ is the sampling frequency. Based on the information provided by the SUKF 102, the second Kalman filter, termed the parameter update Kalman filter (PUKF) 106, may provide the estimates of a parameter vector $\beta$ with elements $\cos(\omega_0)$ and $\sin(\omega_0)$. In one aspect, the SUKF 102 may provide its output, including, for example, the state vector estimate $\hat{x}(k/k)$ and the SUKF gain K(k) to the PUKF 106 via a state KF to parameter KF coupling 104. Based on the delayed filtered parameter vector estimate $\hat{\beta}(k-1/k-1)$, the state transition matrix for the SUKF 102 may be generated.

The two Kalman filters 102, 106, therefore, operate in a back-to-back manner providing the state and the parameter vector estimates $\hat{x}(k/k)$ and $\hat{\beta}(k/k)$ for k=1, 2, .... From the state and the parameter vector estimates, the estimates for the frequency, phase, and amplitude may be obtained in terms of simple functions of these estimates by an estimator of signal parameter 110. Unlike an EKF, the AKF 100 does not involve any linearization. Therefore, it may provide fast frequency estimates when the initial frequency offset is relatively large and under medium SNR conditions.

It will be appreciated that one or more of the constituent SUKF 102, PUKF 106, and other elements 104, 108, and 110 of the AKF 100 may be implemented in a variety of mechanisms, including, for example, on a processor running instructions to implement the AKF 100. In one aspect, the elements of the AKF may be implemented as modules of a software application stored on one or more memories and accessible by one or more processors configured to execute constituent instructions of the modules and/or software application. Alternatively, each of the elements of the AKF may be implemented with discrete electrical elements communicatively coupled therebetween. These elements may be digital elements incorporating hardware, software, or both hardware and software.

The state update Kalman filter 102 equations for the estimation of the state vector x(k) for the case of known matrix F are given by $$\hat{x}(k/k) = \hat{x}(k/k-1) + K(k)\tilde{z}(k/k-1) \tag{15a}$$

$$\tilde{z}(k/k-1) = z(k) - H(k)\hat{x}(k/k-1) \tag{15b}$$

$$\hat{x}(k/k-1) = F(k-1)\hat{x}(k-1/k-1) \tag{15c}$$

$$S(k) = H(k)P(k/k-1)H^T(k) + R(k) \tag{15d}$$

$$K(k) = P(k/k-1)H^T(k)S^{-1}(k) \tag{15e}$$

$$P(k/k) = P(k/k-1) - P(k/k-1)H^T(k)S^{-1}(k)H(k)P(k/k-1) \tag{15f}$$

$$P(k+1/k) = F(k)P(k/k)F^T(k) + G(k)Q(k)G^T(k) \tag{15g}$$

In equations (15a-15g) $\hat{x}(k/k)$ denotes the filtered estimate of the state x(k); $\hat{x}(k/k-1)$ denotes the predicted estimate of x(k) based on measurements up to time k-1, i.e., z(0), z(1), ..., z(k-1); $\tilde{z}(k/k-1)$ is the prediction error; and K(k) is the Kalman filter gain. The matrices P(k/k) and P(k/k-1) are the error covariance matrices for the filtered and predicted estimates respectively of x(k). In general, the matrices F(k) and H(k) may be time-varying; however, in application to equations (12)-(14), these are independent of k, and the matrix G(k) in (15g) is equal to the identity matrix. The process covariance matrix Q is zero for the equation (12). However, to increase the robustness of the algorithm, Q may be set to some small non singular matrix. In an exponentially data weighted version of the Kalman filter, which has a robustness against certain model inaccuracies, the equation (15f) is replaced by $$P(k+1/k)=\lambda^{-1}F(k)P(k/k)F^T(k)+G(k)Q(k)G^T(k) \quad (15h)$$

In equation (15h), the parameter $\lambda$ is the exponential data weighting coefficient with $0<\lambda<1$. The value of $\lambda$ may be very close to 1, e.g., 0.99 and $1/(1-\lambda)$ is the approximate length of data memory. Thus with $\lambda=0.99$ the state update roughly depends only on the previous 100 measurements.

From the definitions of the state vector $x(k)$ in (5)-(6), the phase $\theta(k)$ at time k is given by $$\theta(k)=\tan_2^{-1}(x_2(k),x_1(k)) \quad (16)$$

where $\tan_2^{-1}$ denotes the 4 quadrant inverse tangent function, Similarly the phase estimate is given in terms of the filtered estimate of the state $x(k)$ by $$\hat{\theta}(k)=\tan_2^{-1}(\hat{x}_2(k/k),\hat{x}_1(k/k)) \quad (17)$$

The phase estimation error is obtained as $$\tilde{\theta}(k)=\theta(k)-\hat{\theta}(k) \quad (18)$$

The filtered estimate of the amplitude A is also obtained from the filtered estimate of the state $x(k)$ as $$\hat{A}(k)=[\hat{x}_1^2(k/k)+\hat{x}_2^2(k/k)]^{1/2} \quad (19)$$

A smoothed estimate of the amplitude is given by $$\hat{A}_S = \left[ \frac{1}{N_s - N_0} \sum_{k=N_0+1}^{N_s} \hat{A}^2(k) \right]^{1/2} \quad (20)$$

where $N_s$ is the total number of samples and $N_0$ is the number of samples that are discarded in the computation of the smoothed estimate of A.

The matrix F in the Kalman filter update equations (15) requires knowledge of the parameters $\beta_1$ and $\beta_2$ which are unknown and need to be estimated. In the adaptive Kalman filter (AKF) 100 of the embodiment of this disclosure, these parameters are estimated from $\hat{x}(k/k)$.

The equations (8) and (11) may be rewritten in the following equivalent form $$x_1(k+1) = [x_1(k) - x_2(k)] \begin{bmatrix} \beta_1 \\ \beta_2 \end{bmatrix} \quad (21)$$

$$x_2(k+1) = [x_2(k) \; x_1(k)] \begin{bmatrix} \beta_1 \\ \beta_2 \end{bmatrix} \quad (22)$$

Replacing the state $x(k)$ by its filtered estimate $\hat{x}(k/k)$, the equations (21) and (22) may be expressed in the following matrix vector form $$z_p(k) \equiv \begin{bmatrix} \hat{x}_1(k/k) \\ \hat{x}_2(k/k) \end{bmatrix} = H_p(k)\beta(k) + n_p(k); \quad (23)$$

$$H_p(k) = \begin{bmatrix} \hat{x}_1(k-1/k-1) & -\hat{x}_2(k-1/k-1) \\ \hat{x}_2(k-1/k-1) & \hat{x}_1(k-1/k-1) \end{bmatrix} \quad (24)$$

In equations (23) and (24), the suffix on the variables z, H, n, etc., signifies that these variables relate to the estimation of the parameter $\beta$. The noise vector $n_p$ accounts for the error in the estimate of the state $x(k)$ and has its covariance matrix equal to $R_p(k)$ that is determined from the Kalman filter update equations (15). In case of fixed frequency, the parameter vector $\beta$ is not a function of k. However, to include a more general case, it may be assumed to vary according to the following dynamics equation $$\beta(k+1)=F_p\beta(k)+G_p(k)\xi_p(k) \quad (25)$$

where $F_p$ and $G_p$ are some appropriate matrices and $\xi_p(k)$ denotes the process noise, which may be zero mean and white, or otherwise spread across a relatively wide spectrum, with covariance matrix $Q_p$. The Kalman filter update equations for the estimation of the parameter $\beta(k)$ at the parameter update Kalman filter 106 from equations (23) and (25) is given by $$\hat{\beta}(k/k)=\hat{\beta}(k/k-1)+K_p(k)\tilde{z}_p(k/k-1) \quad (26a)$$

$$\tilde{z}_p(k/k-1)=z_p(k)-H_p(k)\hat{\beta}(k/k-1) \quad (26b)$$

$$\hat{\beta}(k/k-1)=F_p(k-1)\hat{\beta}(k-1/k-1) \quad (26c)$$

$$S_p(k)=H_p(k)P_p(k/k-1)H_p^T(k)+R_p(k) \quad (26d)$$

$$K_p(k)=P_p(k/k-1)H_p^T(k)S_p^{-1}(k) \quad (26e)$$

$$P_p(k/k)=P_p(k/k-1)-P_p(k/k-1)H_p^T(k)S_p^{-1}(k)H(k) \\ P_p(k/k-1) \quad (26f)$$

$$P_p(k+1/k)=F_p(k)P_p(k/k)F_p^T(k)+G_p(k)Q_p(k)G_p^T(k) \quad (26g)$$

In an exponentially data weighted version of the parameter update Kalman filter 106, the equation (26g) is replaced by $$P_p(k+1/k)=\lambda_p^{-1}F_p(k)P_p(k/k)F_p^T(k)+G_p(k)Q_p(k)G_p^T(k) \quad (26h)$$

In the Kalman filter equation (15) the matrix $F(k-1)$ is replaced by its estimate $\hat{F}(k-1/k-1)$ given by $$\hat{F}(k-1/k-1) = \begin{bmatrix} \hat{\beta}_1(k-1/k-1) & -\hat{\beta}_2(k-1/k-1) \\ \hat{\beta}_2(k-1/k-1) & \hat{\beta}_1(k-1/k-1) \end{bmatrix} \quad (26i)$$

The two sets of equations (15) and (26) are updated in an interlaced manner thus, the sequence of estimates are $\hat{\beta}(k-1/k-1) \rightarrow \hat{F}(k-1/k-1) \rightarrow \hat{x}(k/k) \rightarrow \hat{\beta}(k/k)$ for $k=1, 2, \ldots$ with some initial estimate for $\hat{\beta}(0/0)$ based on some possibly zero initial estimate for the digital frequency $\omega_0$.

In (26h), $\lambda_p$ is the exponential data weighting coefficient with $0<\lambda_p<1$. The covariance matrix $R_p$ in (26d) may be evaluated as follows. The equations (21) and (22) may be combined to obtain the following equation.

$$x(k) = H_{pc}(k)\beta(k); \; H_{pc}(k) = \begin{bmatrix} x_1(k-1) & -x_2(k-1) \\ x_2(k-1) & x_1(k-1) \end{bmatrix} \quad (27)$$

Subtraction of both sides of equation (23) from the respective sides of equation (27) yields $$x(k)-\hat{x}(k/k)=[H_{pc}(k)-H_p(k)]\beta(k)-n_p(k); \quad (28)$$

From the definitions of the matrices $H_{pc}(k)$ and $H_p(k)$, the equation (28) may be written in the following alternative form $$\tilde{x}(k/k) = \begin{bmatrix} \hat{x}_1(k-1/k-1) & \hat{x}_2(k-1/k-1) \\ \hat{x}_2(k-1/k-1) & \hat{x}_1(k-1/k-1) \end{bmatrix} \begin{bmatrix} \beta_1 \\ \beta_2 \end{bmatrix} - n_p(k); \quad (29)$$

$$\tilde{x}(k/k) = x(k) - \hat{x}(k/k)$$

With the definition of F in (13), one obtains from (29)

$$\tilde{x}(k/k) = F\tilde{x}(k-1/k-1) - n_p(k) \quad (30)$$

Thus $$n_p(k) = F\tilde{x}(k-1/k-1) - \tilde{x}(k/k) \quad (31)$$

Now subtraction of (15a) from (12) yields $$\tilde{x}((k/k) = F\tilde{x}(k-1/k-1) - K(k)\tilde{z}(k/k-1) \quad (32)$$

From (31) and (32) one obtains the covariance of $n_p(k)$ as $$R_p(k) = E[n_p(k)n_p^T(k)] = K(k)E[\tilde{z}(k/k-1)\tilde{z}^T(k/k-1)]K^T(k) \quad (33)$$

Substitution for z(k) from (14) in (15b) results in $$\tilde{z}(k/k-1) = H(k)\tilde{x}(k/k-1) + n(k) \quad (34)$$

As $\tilde{x}(k/k-1)$ and n(k) are uncorrelated due to the independence of noise sequence n(k), the covariance of the prediction error $\tilde{z}(k/k-1)$ is given by $$E[\tilde{z}(k/k-1)\tilde{z}^T(k/k-1)] = H(k)P(k/k-1)H^T(k) + R(k) = S(k) \quad (35)$$

Substitution of (35) in (33) yields the desired covariance matrix as $$R_P(k) = K(k)S(k)K^T(k) = K(k)[H(k)P(k/k-1)H^T(k) + R(k)]K^T(k) \quad (36)$$

For the case of $F_p = I$, corresponding to the case of time invariant parameter $\beta$ and $G_p = 0$, the Kalman filter equations (26) can be simplified to arrive at the weighted least squares algorithm. With the substitution of $F_p = I$ and $G_p = 0$ and replacing k by (k−1) in (26h) yields $$P_p(k/k-1) = \lambda_p^{-1} P_p(k-1/k-1) \quad (37)$$

Substitution of (37) in (26f) yields $$P_p(k/k) = \lambda_p^{-1} P_p(k-1/k-1) - \lambda_p^{-2} P_p(k-1/k-1) H_p^T(k) \times \{\lambda_p^{-1} H_p(k) P_p(k-1/k-1) H_p^T(k) + R_p\}^{-1} H_p(k) P_p(k-1/k-1) \quad (38)$$

The equation (38) can be organized in the following compact form $$P_p(k) = \lambda_p^{-1} [P_p(k-1) - P_p(k-1) H_p^T(k) \times \{H_p(k) P_p(k-1) H_p^T(k) + \lambda_p R_p\}^{-1} H_p(k) P_p(k-1)] \quad (39)$$

where in equation (39) Pp(k) is a more compact notation for $P_p(k/k)$. The Kalman gain $K_p$ for the case of constant $\beta$ may be expressed as $$K_p(k) = P_p(k-1) H_p^T(k) [H_p(k) P_p(k-1) H_p^T(k) + \lambda_p R_p]^{-1} \quad (40)$$

Multiplication of (39) by $H_p^T(k)$ results in $$P_p(k) H_p^T(k) = \lambda_p^{-1} \begin{bmatrix} P_p(k-1) H_p^T(k) - \\ P_p(k-1) H_p^T(k) \{H_p(k) P_p(k-1) H_p^T(k) + \lambda_p R_p\}^{-1} \times \\ H_p(k) P_p(k-1) H_p^T(k) \end{bmatrix} \quad (41)$$

A simplification of (41) yields $$P_p(k) H_p^T(k) = \lambda_p^{-1} P_p(k-1) H_p^T(k) \{H_p(k) P_p(k-1) H_p^T(k) + \lambda_p R_p\}^{-1} \times [H_p(k) P_p(k-1) H_p^T(k) + \lambda_p R_p - H_p(k) P_p(k-1) H_p^T(k)] \quad (42)$$

From (40) and (42) one obtains $$K_p(k) = P_p(k) H_p^T(k) R_p^{-1} \quad (43)$$

The weighted least squares algorithm is thus given by $$P_p(k) = \lambda_p^{-1} [P_p(k-1) - P_p(k-1) H_p^T(k) \times \{H_p(k) P_p(k-1) H_p^T(k) + \lambda_p R_p\}^{-1} H_p(k) P_p(k-1)] \quad (44a)$$

$$K_p(k) = P_p(k) H_p^T(k) R_p^{-1} \quad (45b)$$

$$\hat{\beta}(k) = \hat{\beta}(k-1) + K_p(k)[z_p(k) - H_p(k)\hat{\beta}(k-1)] \quad (45c)$$

In (44), $\hat{\beta}(k)$ is the compact notation for $\hat{\beta}(k/k)$ in the case of constant $\beta$. From the definition of the parameters $\beta_1$ and $\beta_2$ in (9), the estimate of the digital frequency $\omega_0$ is given by $$\hat{\omega}_0 = \tan_2^{-1}(\hat{\beta}_2(k/k), \hat{\beta}_1(k/k)) \quad (46)$$

with the estimation error in the estimate of the digital frequency $\omega_0$ given by $$\tilde{\omega}_0(k) = \omega_0 - \hat{\omega}_0(k) \quad (47)$$

The estimate and the estimation error for the analog frequency $f_a$ given by $$\hat{f}_a = \hat{\omega}_0 F_s / (2\pi); \tilde{f}_a = f_a - \hat{f}_a \quad (48)$$

The set of equations (5), (6), (12)-(15), (17), (19) (20), (23)-(26), (33), (46) and (48) constitute the AKF algorithm for the estimation of the frequency, amplitude and phase of a single sinusoidal signal received in the presence of noise and is referred to as AKFS.

Figure 2:
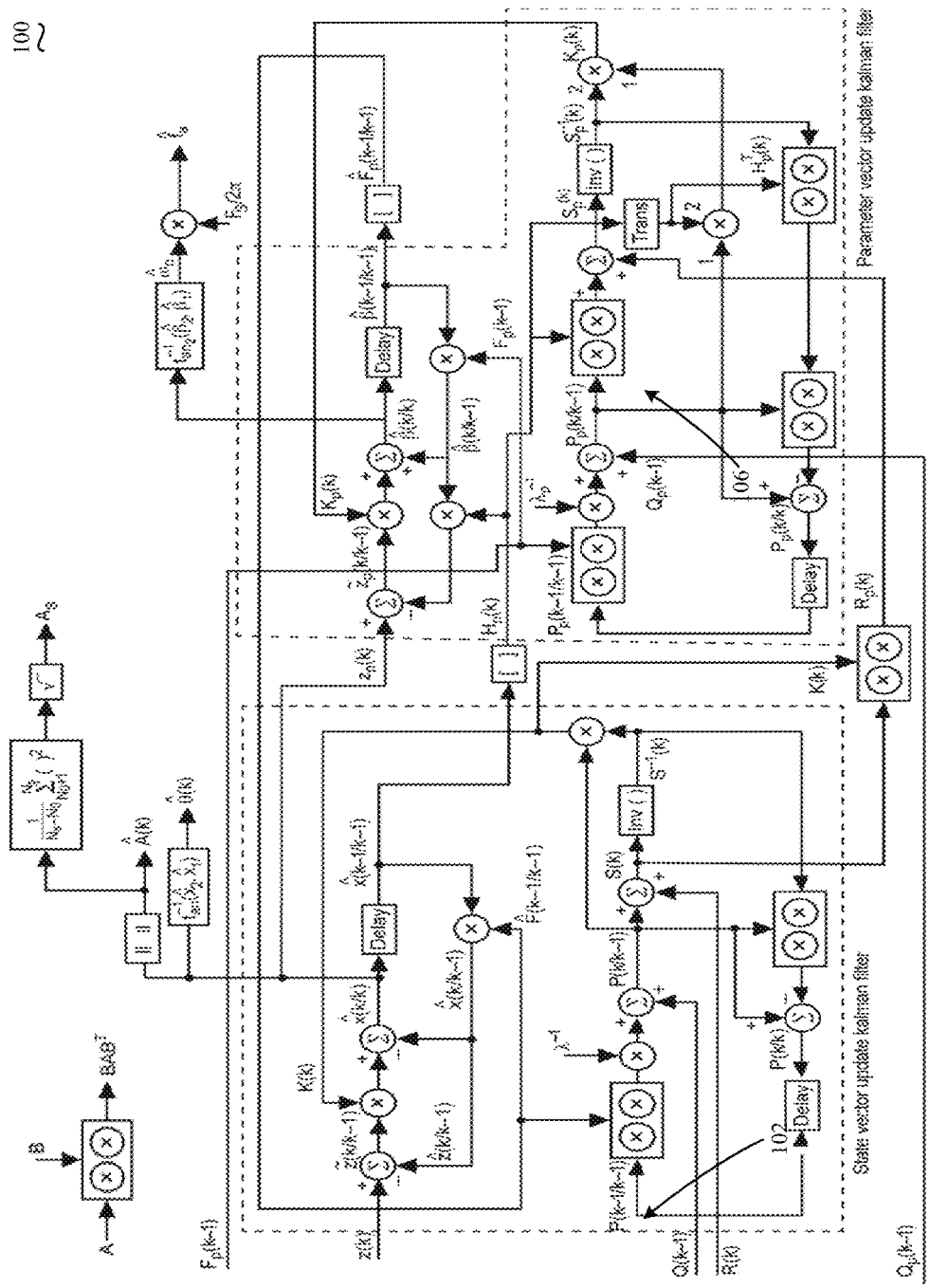
FIG. 2 is a block diagram illustrating an example architecture for providing signal parameter estimation, in accordance with embodiments of the disclosure.

Referring now to FIG. 2, a relatively more detailed block diagram representation of the example AKF 100 is shown. In this representation, the sampled signal z(k) defined in (14) is input to the state vector update Kalman filter 102 that provides the filtered state estimate $\hat{x}(k-1/k-1)$ at its output computed according to equations (15). The filtered state estimate $\hat{x}(k-1/k-1)$ is pre-multiplied by the 2×2 matrix $\hat{F}(k-1/k-1)$ to provide the predicted state estimate $\hat{x}(k/k-1)$ according to (15c) wherein F(k−1) is replaced by its estimate $\hat{F}(k-1/k-1)$. The prediction error $\tilde{z}(k/k-1)$ is evaluated according to (15b) by subtracting $\hat{x}(k/k-1)$ from the measurement z(k) where H(k) in (15b) is substituted by the 2×2 identity matrix $I_2$. Multiplication of $\tilde{z}(k/k-1)$ by the Kalman gain K(k) and adding the product to the predicted state estimate $\hat{x}(k/k-1)$ results in the filtered state estimate $\hat{x}(k/k)$ at time k which when delayed by one sample is equal to $\hat{x}(k-1/k-1)$, thus completing the recursive loop for the update of the filtered state estimate. The initial filter state $\hat{x}(0/0)$ may be selected equal to $[0\ 0]^T$.

Referring still to FIG. 2, the filter error covariance matrix P(k−1/k−1) is pre-multiplied by $\hat{F}(k-1/k-1)$ and post-multiplied by the transpose of $\hat{F}(k-1/k-1)$, and the resulting product is multiplied by $1/\lambda$, where $\lambda$ is the exponential data weighting coefficient. The resultant product $\lambda^{-1}\hat{F}(k-1/k-1)P(k-1/k-1)\hat{F}^T(k-1/k-1)$ is added to the matrix Q(k−1) according to (15h) where G(k)=$I_2$ and Q(k−1) is selected to be a constant diagonal matrix $\epsilon_Q I_2$ for some small positive scalar $\epsilon_Q$. The innovation covariance matrix S(k) is obtained by adding the result to the matrix R(k) that is equal to $\sigma_n^2 I_2$ where $\sigma_n^2$ is the variance of the sampled noise sequences $n_i(k)$ and $n_q(k)$ in (14) and H(k)=$I_2$. Inverting the matrix S(k) and pre and post multiplying the matrix $S^{-1}(k)$ by P(k/k−1) and subtracting the result from P(k/k−1) results in P(k/k) according to (15f). The covariance matrix P(0/0) is selected equal to $\epsilon I_2$ for some small positive scalar $\epsilon$. Pre-multiplying $S^{-1}(k)$ by P(k/k−1) yields the Kalman gain K(k) according to (15e).

The innovation covariance matrix S(k) is pre- and post-multiplied by K(k) and $K^T(k)$ respectively providing the measurement covariance matrix $R_p(k)$ for the parameter vector update Kalman filter according to (36). The elements of the vector $\hat{x}(k-1/k-1)$ provide the measurement matrix $H_p(k)$ given in (28), (29). The matrix $H_p(k)$ is input to the parameter vector update Kalman filter for which the filtered state estimate $\hat{x}(k/k)$ is the measurement vector $z_p(k)$.

The parameter vector update Kalman filter 106 is similar to the state vector update Kalman filter 102 with the filtered state estimate $\hat{x}(k/k)$ replaced by the filtered parameter vector estimate $\hat{\beta}(k/k)$. For the case of constant parameter vector $\beta$, the matrix $F_p(k-1)$ is equal to $I_2$. The elements of the filtered parameter vector estimate $\hat{\beta}(k-1/k-1)$ provide the matrix $\hat{F}(k-1/k-1)$ according to (26i) which is input to the state vector update Kalman filter. The two Kalman filters 102, 106 in FIG. 2 operate in a recursive and interlaced manner providing the estimates $\hat{\beta}(k-1/k-1)$ and $\hat{x}(k/k)$ for k=1, 2, . . . wherein the initial estimate $\hat{\beta}(0/0)$ is set equal to $[\cos(\omega^0) \sin(\omega^0)]^T$ with $\omega^0$ denoting an a-priori estimate for the normalized frequency $\omega_0$ which may be equal to 0.

From the filtered parameter vector estimate $\hat{\beta}(k/k)$, the estimate for the normalized frequency $\omega_0$ is obtained by the $\tan_2^{-1}(\ )$ block that provides the four quadrant inverse tangent of the input according to (46). The estimate for the analog frequency $f_a$ may be obtained by multiplying $\hat{\omega}_0$ by $F_s/2\pi$ where $F_s$ is the sampling frequency. The filtered state estimate $\hat{x}(k/k)$ is input to a second $\tan_2^{-1}(\ )$ block that yields the estimate for the instantaneous phase $\theta(k)$ according to (17). The filtered state estimate $\hat{x}(k/k)$ is input to the norm $\|\ \|$ block that evaluates the Euclidean norm of the input providing the estimate $\hat{A}(k)$ for the amplitude according to (19). From $\hat{A}(k)$, the smoothed estimate $\hat{A}_S$ is obtained by the averaging block that obtains $\hat{A}_S$ according to (20).

Simulation Results

As a non-limiting simulation example, consider the bandwidth B=200 Hz with a sampling rate $F_s$ selected equal to 400 Hz. The amplitude A=1 volt with the bandpass noise one-sided noise spectral density $N_0$ is equal to $2.5 \times 10^{-4}$ W/Hz with the signal power to noise spectral density ratio equal to 33 dB-Hz. This corresponds to the variance of the bandpass noise $\sigma_n^2 = 2N_0 B = 0.1$ W with the signal-to-noise ratio equal to 5 or 7 dB. The one-sided noise spectral density of both the baseband processes $n_i(t)$ and $n_q(t)$ is equal to $2N_0 = 5 \times 10^{-4}$ W/Hz with the baseband SNR for both the in-phase and quadrature components equal to 5 (7 dB). The initial values for the matrices P, Q and $P_p$ are selected as $$P(0/-1) = \begin{bmatrix} 5 & 0 \\ 0 & 5 \end{bmatrix}; P_p(0/-1) = \begin{bmatrix} 4 & 0 \\ 0 & 4 \end{bmatrix}; \quad (49)$$

$$Q = \begin{bmatrix} 0.001 & 0 \\ 0 & 0.001 \end{bmatrix}; Q_p = 0;$$

The exponential data weighting coefficients are selected as $\lambda = \lambda_p = 0.999$. FIGS. 3-10 illustrate example results obtained over the interval of 25 samples. For the smoothed estimate of A, the number of samples $N_0$ is selected equal to 50.

Figure 3:
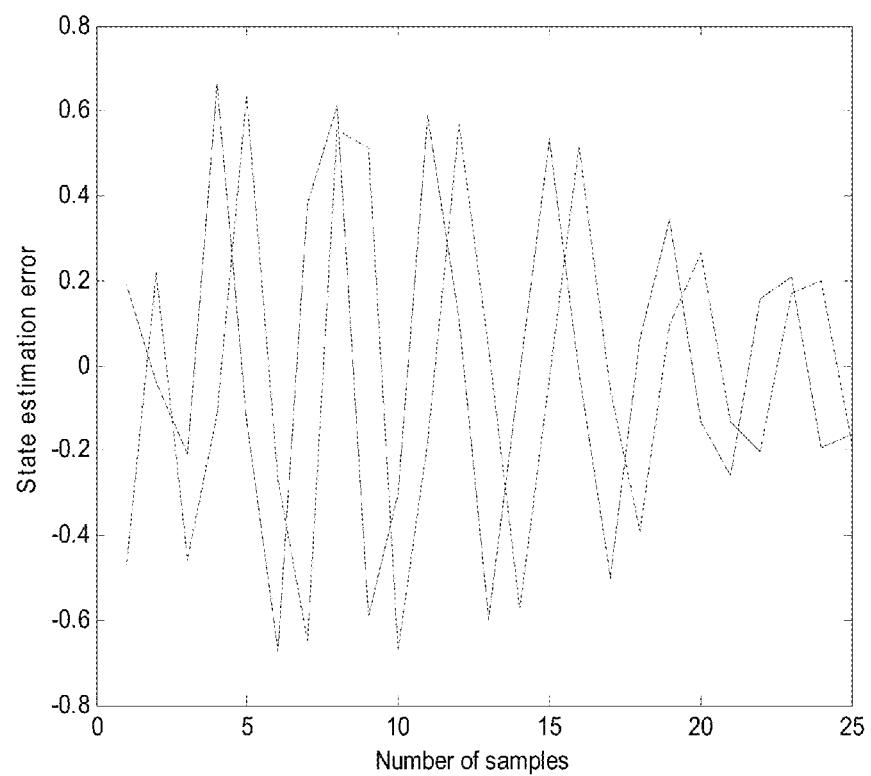
FIG. 3 shows a plot of example simulation results derived from the architectures of FIGS. 1 and 2, in accordance with embodiments of the disclosure.
Figure 4:
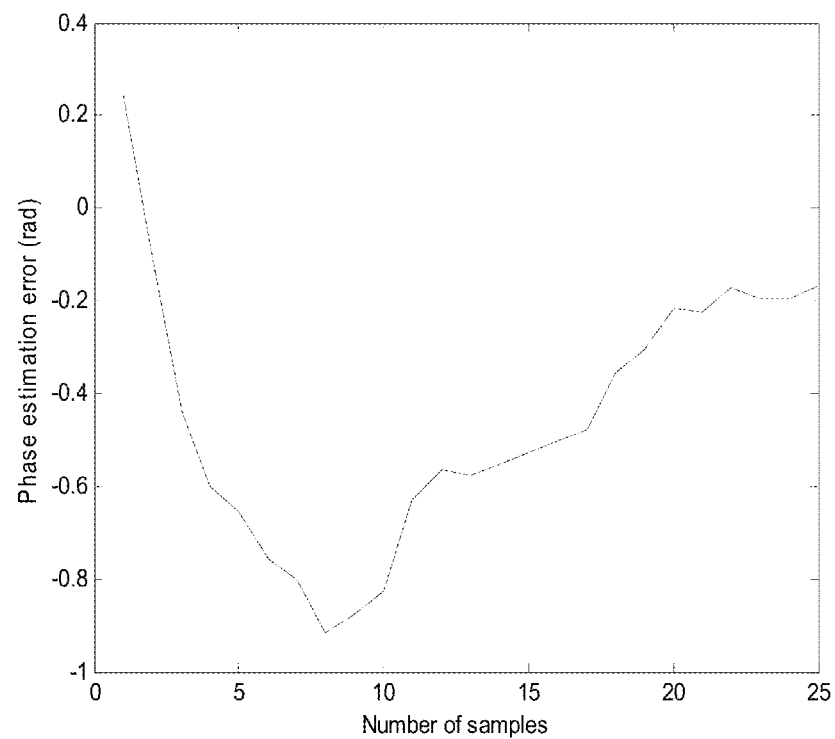
FIG. 4 shows a plot of example simulation results derived from the architectures of FIGS. 1 and 2, in accordance with embodiments of the disclosure.
Figure 5:
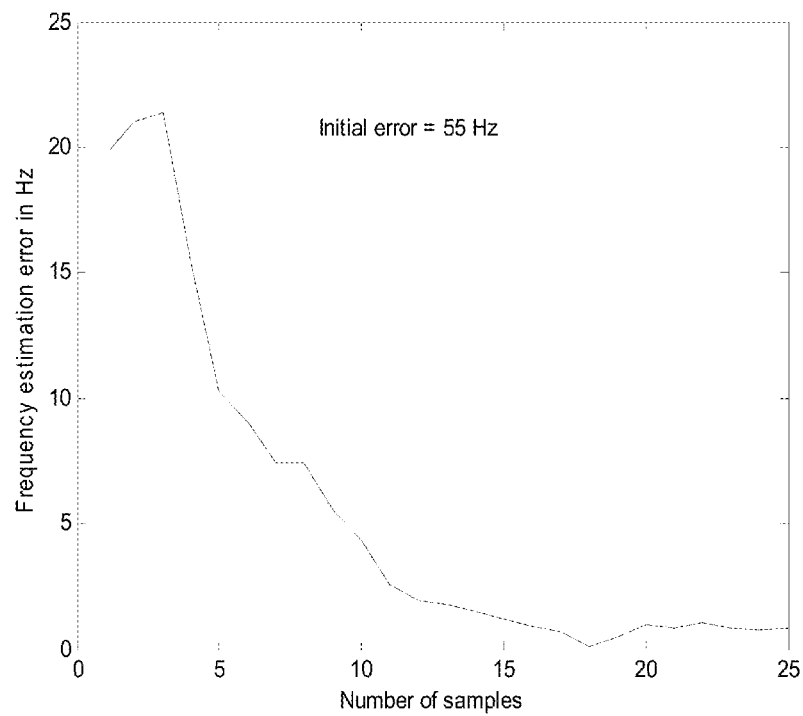
FIG. 5 shows a plot of example simulation results derived from the architectures of FIGS. 1 and 2, in accordance with embodiments of the disclosure.
Figure 6:
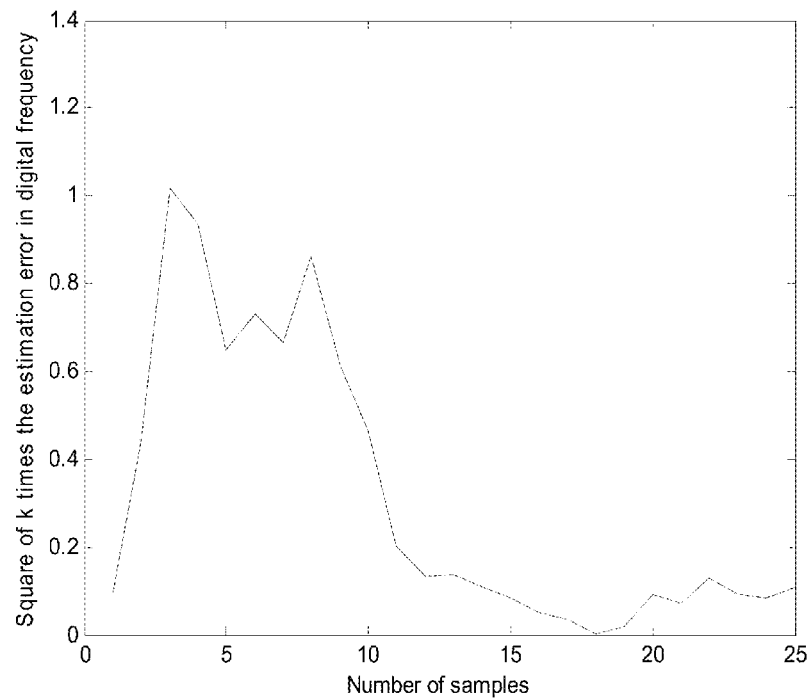
FIG. 6 shows a plot of example simulation results derived from the architectures of FIGS. 1 and 2, in accordance with embodiments of the disclosure.
Figure 7:
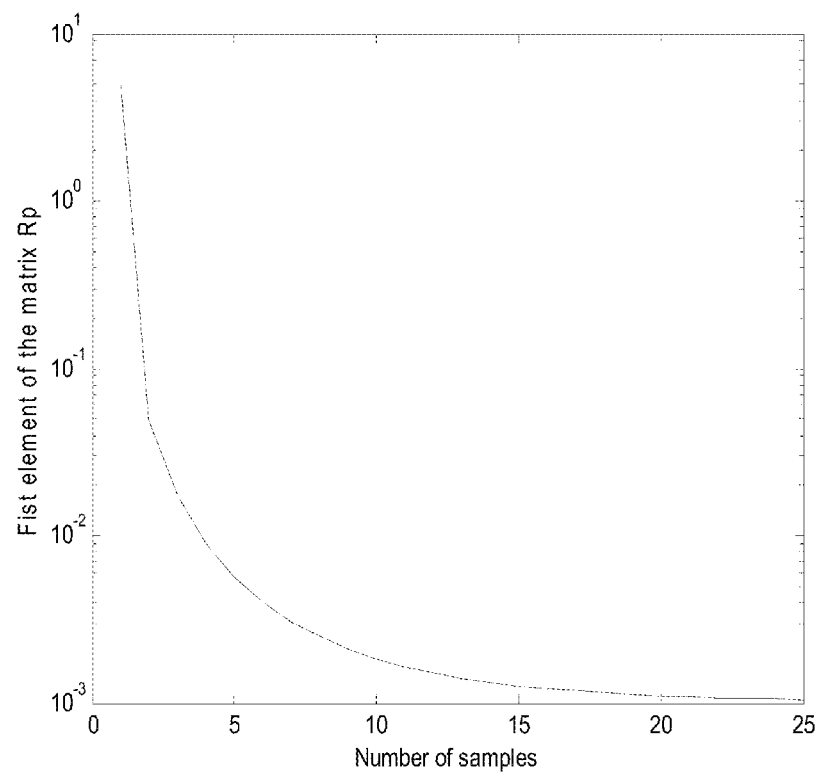
FIG. 7 shows a plot of example simulation results derived from the architectures of FIGS. 1 and 2, in accordance with embodiments of the disclosure.
Figure 8:
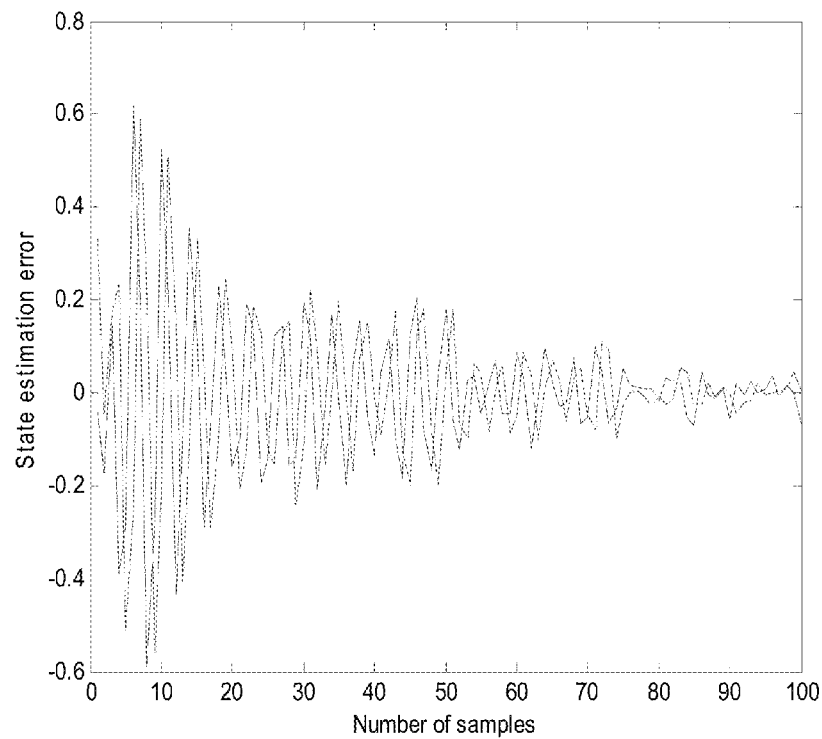
FIG. 8 shows a plot of example simulation results derived from the architectures of FIGS. 1 and 2, in accordance with embodiments of the disclosure.
Figure 9:
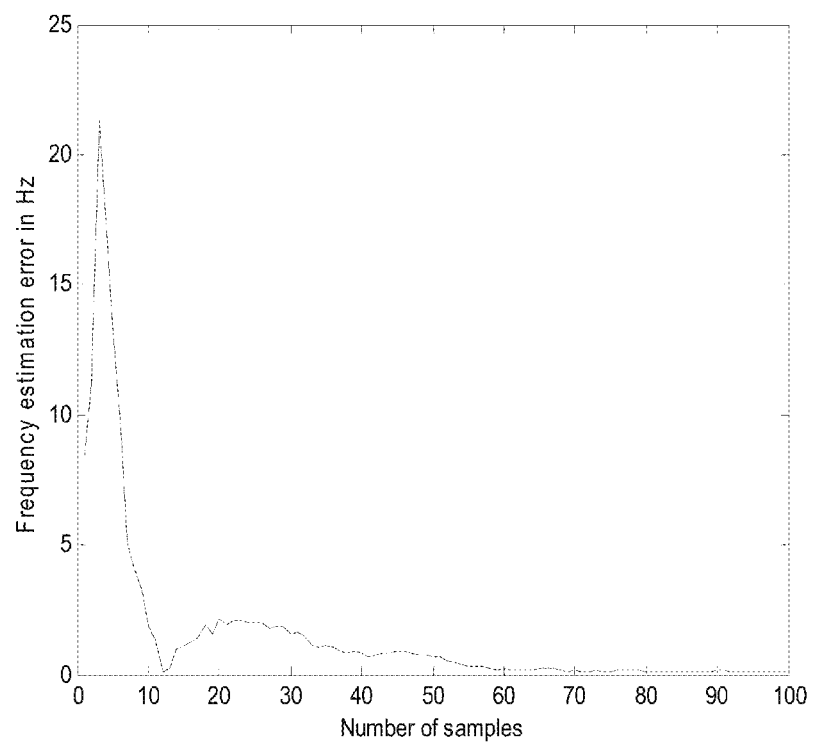
FIG. 9 shows a plot of example simulation results derived from the architectures of FIGS. 1 and 2, in accordance with embodiments of the disclosure.
Figure 10:
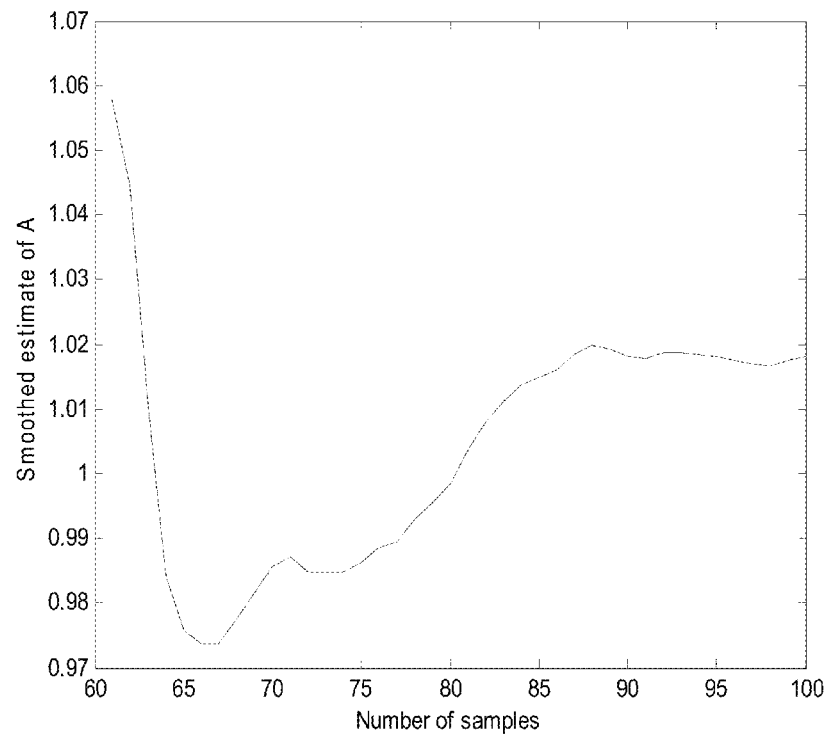
FIG. 10 shows a plot of example simulation results derived from the architectures of FIGS. 1 and 2, in accordance with embodiments of the disclosure.

FIG. 3 shows a plot of the two components of state estimation error $\tilde{x}(k/k)$. FIG. 4 shows a plot of the phase estimation error $\tilde{\theta}(k)$ versus the number of samples k. FIG. 5 shows a plot of the error in the estimation of the analog frequency $f_a$. The error in the estimation of $f_a$ may be relatively small after about 20 samples, wherein the initial estimation error is 55 Hz. FIG. 6 shows a plot of the result $(\tilde{\omega}_0 k)^2$ as a function of k showing its reduction with k. FIG. 7 shows a plot of the result for the trace (Rp)/2 with Rp computed in (33). In the simulations, the matrix Rp has been modified by adding a diagonal matrix equal to $0.001 I_2$ with $I_2$ denoting the 2×2 identity matrix. The modified $R_p$ matrix converges to $0.001 I_2$. FIGS. 8 and 9 show a plot of the results for an interval of 100 samples showing that the errors in both the estimates of the state x(k) and the frequency $f_a$ converge to zero. FIG. 10 shows a plot of the smoothed estimate of the amplitude A from (19)-(20), with $N_0$ in (20) selected equal to 60, showing that the estimate is close to the true value of the amplitude equal to 1.0.

Comparison with Theoretical Bounds

The performance of the adaptive Kalman filter (AKF) 100 may be compared to the theoretical bound on the frequency estimation error variance, which is also known as Cramer-Rao (C-R) bound. The Cramer Rao bound on the variance of frequency estimation error $\tilde{f}_a$ defined in (48) is given by $$\tilde{f}_{rms}^{CR} = \{E[\tilde{f}_a^2]\}^{1/2} \geq \left\{ \frac{3}{2\pi^2} \left( \frac{2\sigma_n^2}{A^2} \right) \frac{F_s^2}{N_s^3} \right\}^{1/2} \quad (49a)$$

The simulation examples compare the performance of the AKF algorithm with the C-R bound. For the comparison, the AKF algorithm, as executed by the AKF 100 is simulated with the frequency $f_0$ selected randomly from the range (−B, B) Hz based on a uniform distribution and with the initial frequency estimate equal to 0. For each such selection, the AKF algorithm is simulated with $n_s$=100 independent noise sequences. The procedure is repeated with $n_f$ different values of the frequency $f_0$ selected on a random basis. For each selection of $f_0$, the RMS frequency estimation error $\tilde{f}_{rms}^i$ as a function of the number of samples processed is computed by the mean squared average over the $n_s$ simulation runs given by $$\tilde{f}_{rms}^i = \left\{ \frac{1}{n_s} \sum_{s=1}^{n_s} [\tilde{f}_{i,s}]^2 \right\}^{1/2}; i = 1, 2, \ldots, n_f \quad (49b)$$

Figure 11:
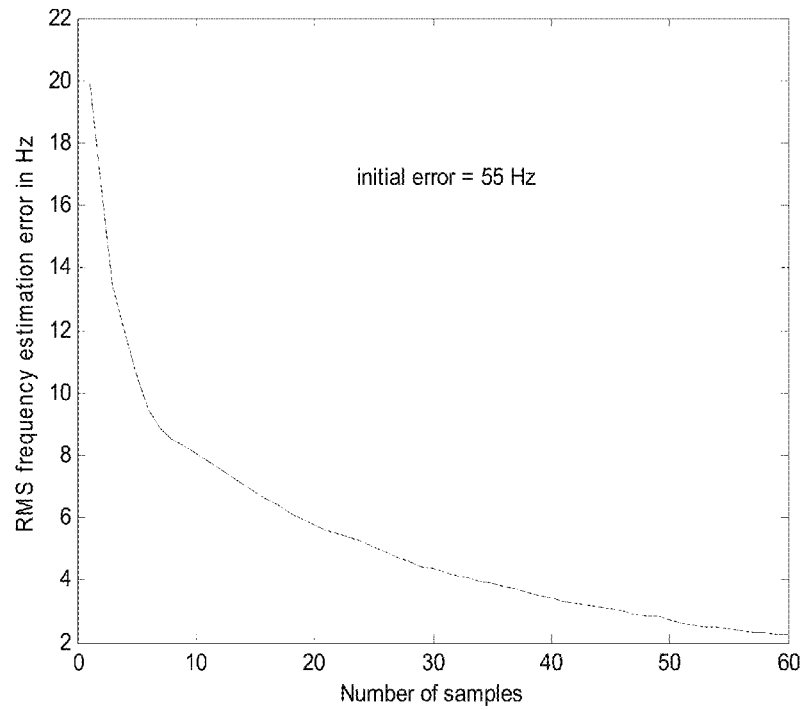
FIG. 11 shows a plot of example simulation results derived from the architectures of FIGS. 1 and 2 with comparisons to theoretical limits, in accordance with embodiments of the disclosure.
Figure 12:
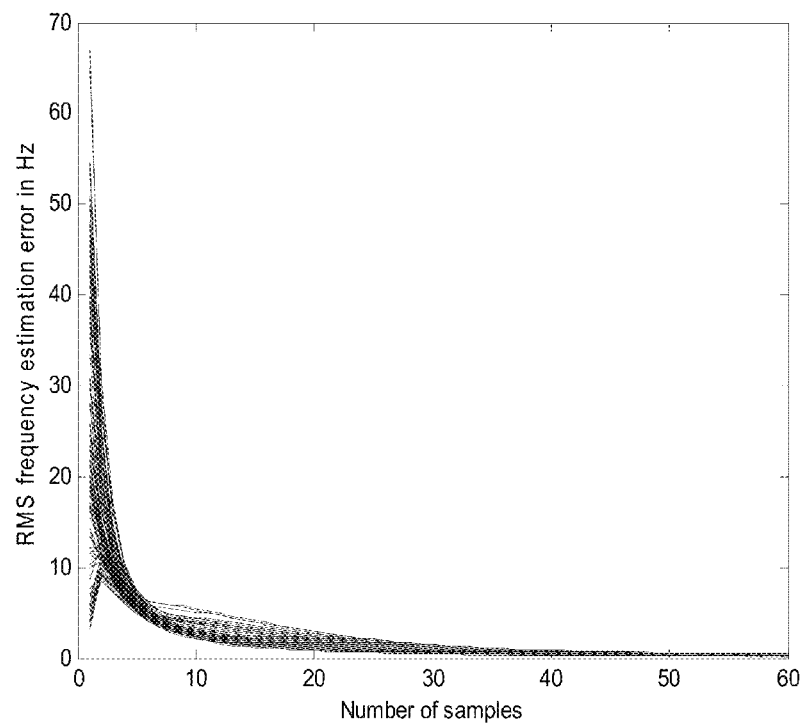
FIG. 12 shows a plot of example simulation results derived from the architectures of FIGS. 1 and 2 with comparisons to theoretical limits, in accordance with embodiments of the disclosure.

FIG. 11 shows the RMS frequency estimation error as computed from (49b) for an initial estimation error of 55 Hz as a function of the number of samples processed. The initial rapid convergence of the RMS frequency estimation error for one of the selections for $f_0$ shows that the RMS error may be reduced to about 8 Hz from the initial error of 55 Hz in about 8 samples. This is followed by a relatively slower convergence rate to an error of about 3 Hz in about 45 samples. FIG. 12 shows the RMS frequency estimation error as a function of the number of samples for the $n_f$=100 different frequency selections $f_0$. In FIG. 12, the signal-to-noise ratio $$\gamma \equiv \frac{A^2}{2\sigma_n^2}$$

may be equal to 5 or 7 dB. The initial parameter error covariance matrix $P_p$ is selected as $$P_p(0/0) = \begin{bmatrix} 1 & 0 \\ 0 & 1 \end{bmatrix} \quad (49c)$$

All the other parameters are selected, as in the non-limiting example, to compare with the C-R bound in (49a), and the RMS estimation error evaluated in (49b) is averaged over all the $n_f$=100 frequency selections as $$\tilde{f}_{rms} = \left\{ \frac{1}{n_f} \sum_{i=1}^{n_f} [\tilde{f}^i_{rms}]^2 \right\}^{1/2} \tag{49d}$$

Figure 13:
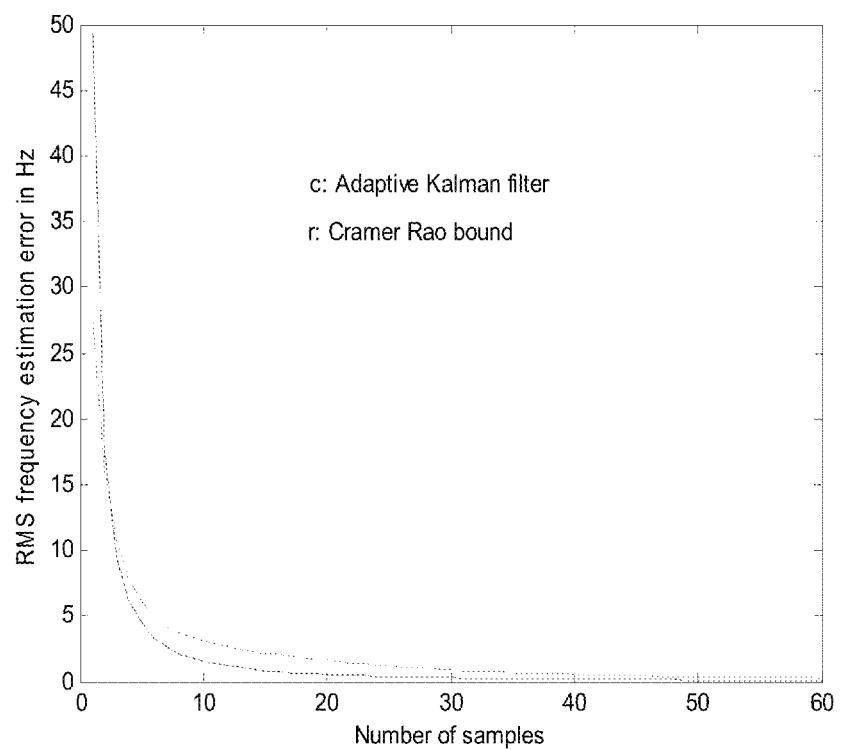
FIG. 13 shows a plot of example simulation results derived from the architectures of FIGS. 1 and 2 with comparisons to theoretical limits, in accordance with embodiments of the disclosure.

FIG. 13 shows a plot of the RMS frequency error obtained from the Cramer Rao bound in (49a) and that obtained from the AKF as evaluated in (49d). The AKF algorithm may provide an RMS error close to the theoretical bound especially for a very low number of samples. For example, after processing 4 samples, the AKF provides the RMS estimation error of 7.8 Hz compared to the C-R bound of 6.2 Hz.

Time-Varying Frequency Estimation

In another non-limiting example, the frequency $f_a$ is a randomly varying function of k according to the following equation $$f_a(k) = f_a(k-1) + \delta_f(k) \tag{50}$$

The perturbation $\delta_f(k)$ is modeled as an independent zero mean Gaussian sequence with variance $\sigma_f^2$. From the definition of the parameters $\beta_1$ and $\beta_2$ in (9), the time-varying versions of these parameters are approximated by $$\beta_1(k) \approx \beta_1(k-1) - 2\pi T_s \delta_f(k) \beta_2(k); \beta_2(k) \approx \beta_2(k-1) + 2\pi T_s \delta_f(k) \beta_1(k) \tag{51}$$

As $$E[\beta_1^2(k)] = E[\beta_2^2(k)] = 0.5 \tag{52}$$

and $\delta_f(k)$ is independent of $\beta_1(k-1)$ and $\beta_2(k-1)$, one obtains $$E[\beta_1(k) - \beta_1(k-1)]^2 = E[\beta_2(k) - \beta_2(k-1)]^2 = 0.5(2\pi T_s)^2 \sigma_f^2 \equiv q_a \tag{53}$$

Thus the process covariance matrix $Q_p$ in (26) is selected equal to $$Q_p = \begin{bmatrix} q_a + \varepsilon & 0 \\ 0 & q_a + \varepsilon \end{bmatrix}; \varepsilon = 1.0 \times 10^{-4} \tag{54}$$

Figure 14:
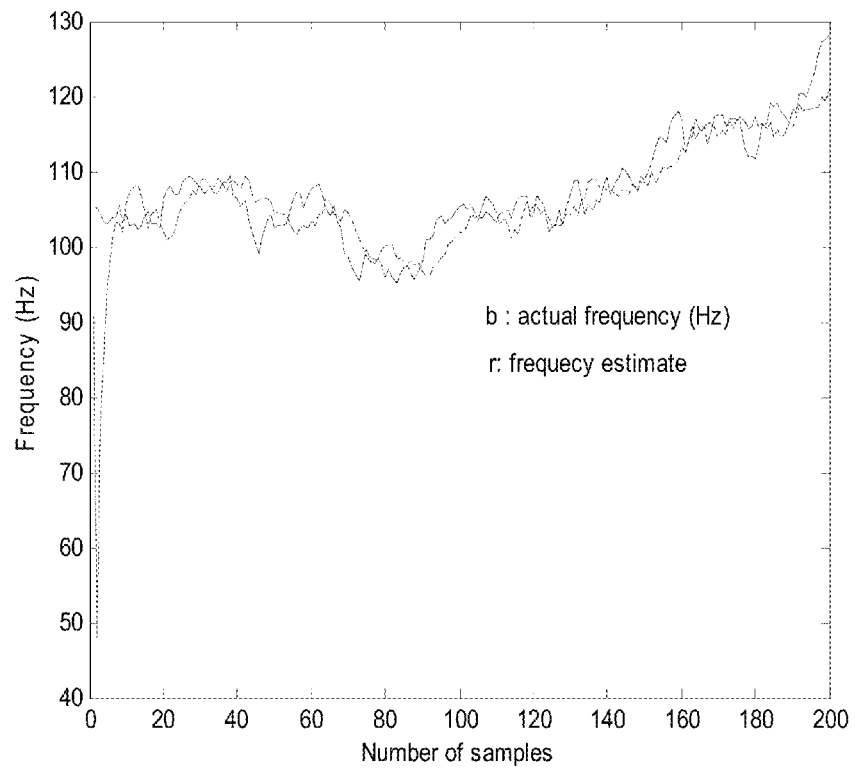
FIG. 14 shows a plot of example simulation results derived from the architectures of FIGS. 1 and 2 with comparisons to theoretical limits, in accordance with embodiments of the disclosure.
Figure 15:
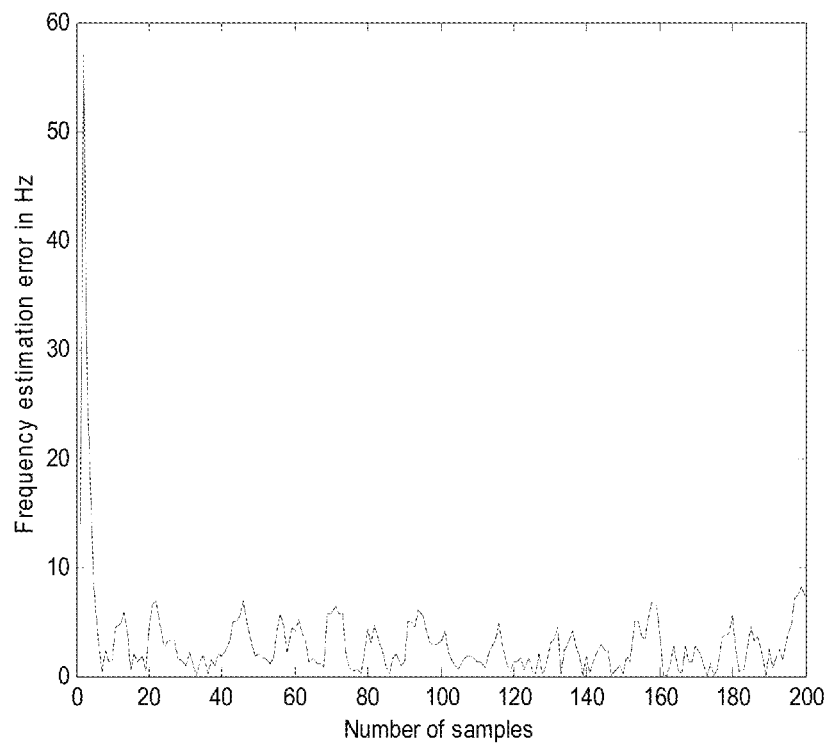
FIG. 15 shows a plot of example simulation results derived from the architectures of FIGS. 1 and 2 applied to a signal with a time-varying frequency, in accordance with embodiments of the disclosure.
Figure 16:
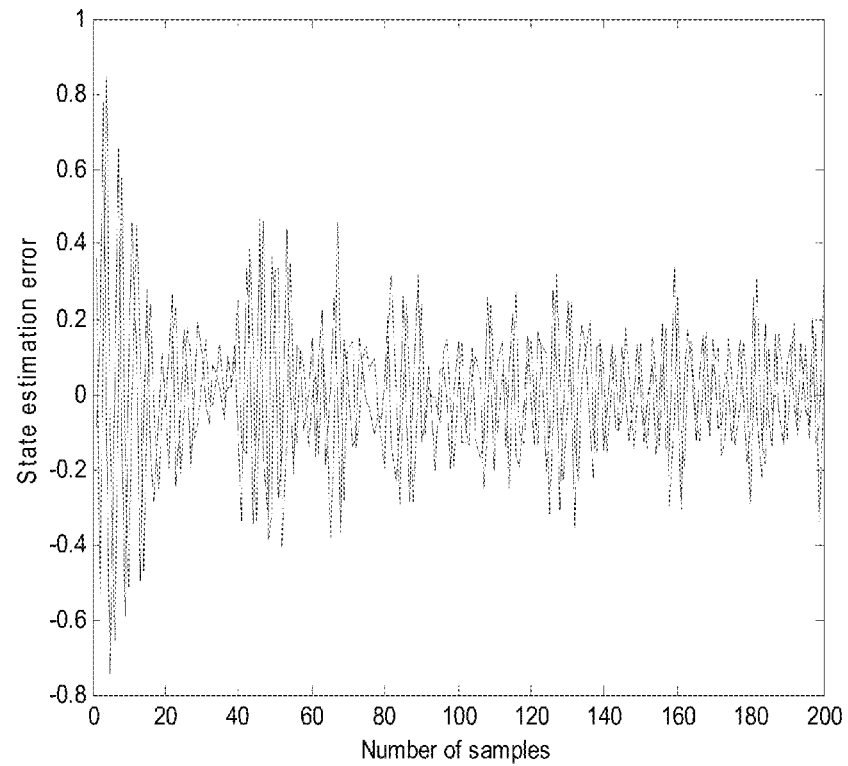
FIG. 16 shows a plot of example simulation results derived from the architectures of FIGS. 1 and 2 applied to a signal with a time-varying frequency, in accordance with embodiments of the disclosure.
Figure 17:
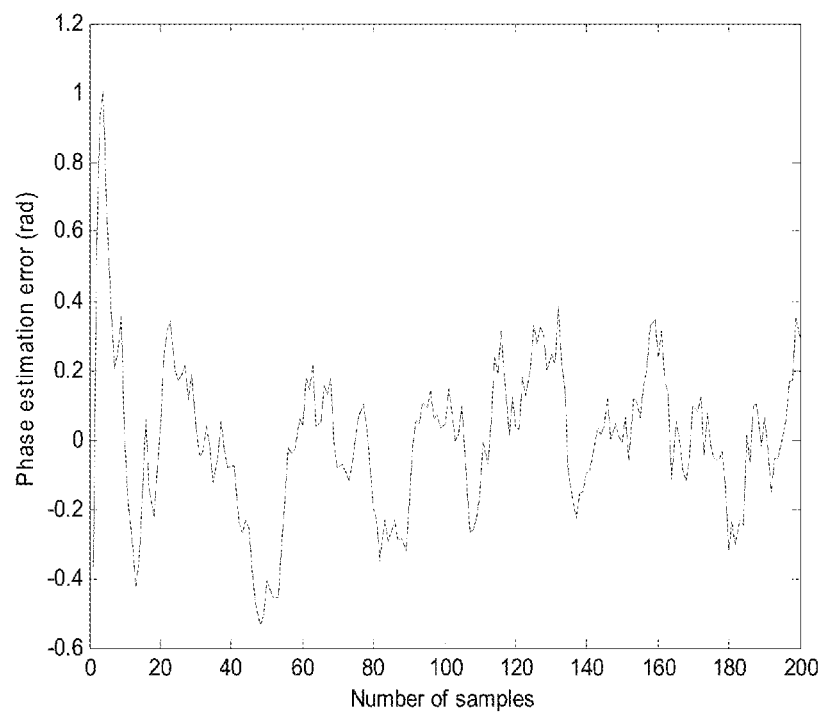
FIG. 17 shows a plot of example simulation results derived from the architectures of FIGS. 1 and 2 applied to a signal with a time-varying frequency, in accordance with embodiments of the disclosure.

In the simulation example, $\sigma_f^2 = 2$ and Q is modified to 0.01 $I_2$ to account for added uncertainty in the estimate for F(k−1) required in the Kalman filter equation (15). FIGS. 14-16 show the results for this example wherein all of the parameters are the same as for the case of FIGS. 3-11. As may be observed from FIG. 14, the estimated frequency remains close to the true frequency after an initial 10 samples. FIGS. 15 and 16 plot the frequency estimation error and the two components of the state estimation error $\tilde{x}(k/k)$ defined in (29) respectively. FIG. 17 plots the phase estimation error $\tilde{\theta}(k)$ defined in (18) as a function of k. After about 100 samples, the peak-to-peak phase estimation error is about 0.4 rad, corresponding to the RMS phase estimation error of about 0.07 rad. The RMS value of the random change in frequency at any time k is equal to $\sigma_f = \sqrt{2}$Hz, and this component is independent of the measurements up to time k and therefore cannot be estimated at time k. Thus the ideal estimation algorithm is expected to result in the RMS frequency estimation error of $\sigma_f = \sqrt{2}$Hz. From FIG. 15, the peak frequency estimation error after the initial 10 samples is about 6 Hz corresponding to an RMS error of about 2 Hz that is close to the ideal case of $\sqrt{2}$ Hz with the difference of about 0.6 Hz attributed to the estimation algorithm.

Estimation of Frequency Derivative

In another embodiment of the AKF estimator, both the frequency and the frequency derivative may be estimated when there is a significant non-zero frequency derivative present during the observation interval, and the derivative itself may be a constant or a slowly varying function of time during the interval of observation.

In the case when the frequency is time-varying with its derivative $\alpha_a$, the in-phase and quadrature baseband signals $z_i(t)$ and $z_q(t)$ are given by $$z_i(t) = A\cos(\theta(t)) + n_i(t) \tag{55}$$

$$z_q(t) = A\sin(\theta(t)) + n_q(t) \tag{56}$$

$$\theta(t) = \omega_a t + \alpha_a \frac{t^2}{2} + \varphi \tag{57}$$

From (57), the difference between the phase at time $kT_s$ and $(k-1)T_s$ is obtained as $$\theta(k) - \theta(k-1) = \omega_a T_s + \alpha_a \frac{t_s^2}{2}(2k-1) \tag{58}$$

With the time-varying normalized frequency $\omega_0(k)$ defined as $$\omega_0(k) = \omega_a T_s - \alpha_a \frac{t_s^2}{2} + k\alpha_a T_s^2; k = 1, 2, \ldots \tag{59}$$

one obtains $$\theta(k) - \theta(k-1) = \omega_0(k) \tag{60}$$

$$\omega_0(k) = \omega_0(k-1) + \alpha_0; \alpha_0 \equiv \alpha_a T_s^2 \tag{61}$$

From (57), the instantaneous frequency $\omega_i(t)$ is given by $$\omega_i(t) = \frac{d\theta(t)}{dt} = \omega_a + \alpha_a t \tag{62}$$

From (59) and (62), the instantaneous frequency $\omega_i(t)$ at $t = kT_s$ is related to the normalized frequency $\omega_0(k)$ by $$\omega_i(kT_s) = [\omega_0(k) + \alpha_0/2]F_s \tag{63}$$

where $F_s$ is the sampling frequency. In (61), $\alpha_0$ may also be a slowly time-varying function of k. The parameters $\beta_1$ and $\beta_2$ in (9) are time-varying for this case and are given by $$\beta_1(k) = \cos(\omega_0(k)); \beta_2 = \sin(\omega_0(k)); k = 1, 2, \ldots \tag{64}$$

With the state variables $x_1(k)$ and $x_2(k)$ defined as $$x_1(k) = A\cos(\theta(k)) \tag{65a}$$

$$x_2(k) = A\sin(\theta(k)) \tag{65b}$$

the state space equations may be written as $$x(k+1) = F(k)x(k); x(k) = [x_1(k) x_2(k)]^T \tag{66a}$$

$$F(k) = \begin{bmatrix} \beta_1(k) & -\beta_2(k) \\ \beta_2(k) & \beta_1(k) \end{bmatrix} \tag{66b}$$

The measurement equation is same as (14) rewritten here as (67).

$$z(k) = \begin{bmatrix} z_i(k) \\ z_q(k) \end{bmatrix} = Hx(k) + n(k); n(k) = \begin{bmatrix} n_i(k) \\ n_q(k) \end{bmatrix} \quad (67)$$

In (67), H is equal to the 2×2 identity matrix. The state vector x(k) is estimated by the Kalman filter equations (15) with F(k−1) replaced by its estimate $\hat{F}(k-1/k-1)$ obtained by replacing $\beta_1$k−1 and $\beta_2$(k−1) in (66b) by their estimates $\hat{\beta}_1$(k−1/k−1) and $\hat{\beta}_2$ (k−1/k−1) respectively. The parameter vector estimate $\hat{\beta}(k/k-1)=[\hat{\beta}_1(k/k-1)\,\hat{\beta}_2(k/k-1)]^T$ is obtained from the parameter update equations (26) with $z_p(k)$, $H_p(k)$, and $R_p(k)$ defined by equations (23), (24) and (36) respectively and with the matrix $Q_p$ set equal to the 0 matrix, $G_p$ equal to the (2×2) identity matrix and the matrix $F_p(k-1)$ replaced by $$\hat{F}_p(k-1) = \begin{bmatrix} \cos(\hat{\alpha}_0(k-1)) & -\sin(\hat{\alpha}_0(k-1)) \\ \sin(\hat{\alpha}_0(k-1)) & \cos(\hat{\alpha}_0(k-1)) \end{bmatrix} \quad (68)$$

In (68), $\hat{\alpha}_0(k-1)$ denotes the estimate of $\alpha_0$ based on the measurement z(i) with i=1, 2, ..., k−2. In order to obtain the estimate of $\hat{\alpha}_0(k)$ for any k, the normalized frequency $\alpha_0(k)$ at time k is estimated by $$\hat{\omega}_0(k) = \tan_2^{-1}(\hat{\beta}_2(k/k), \hat{\beta}_1(k/k)); k=1,2\ldots \quad (69)$$

In (69), $\tan_2^{-1}(\,)$ denotes the four quadrant inverse tangent functions and $\hat{\omega}_0(0/0)$ may be set equal to an initial estimate $\omega^0$ of $\omega(0)$ which may be equal to 0. In the parameter vector update equation (26), $\hat{\beta}(0/0)$ is correspondingly set equal to $[\cos(\omega^0) \sin(\omega^0)]^T$. From (69), the first-order differences are obtained as $$\hat{\omega}_d(k) = \hat{\omega}_0(k) - \hat{\omega}_0(k-1); k=1,2,\ldots \quad (70)$$

The estimates $\hat{\omega}_d(k)$ in (70) constitute the noisy estimate of the parameter $\alpha_0$ wherein $\alpha_0$ may also be a slowly varying function of k. The smoothed estimate of $\alpha_0(k)$ is obtained by filtering the estimates $\hat{\omega}_d(k)$ by an appropriate filter. For example, use of a first-order filter yields the following smoothed estimate of $\alpha_0(k)$.

$$\hat{\alpha}_0(k) = \lambda_\alpha \hat{\alpha}_0(k-1) + (1-\lambda_\alpha)\hat{\omega}_d(k); k=1,2,\ldots \quad (71)$$

In (71), $\hat{\alpha}_0(0)$ may be set equal to an initial estimate of $\alpha_0$ or may be set equal to 0. In (71), $\lambda_\alpha$ is a positive constant with $0<\lambda_\alpha<1$ and may determine the filter time constant which is set in accordance with the expected rate of variation of $\alpha_0$. The parameter $\lambda_\alpha$ may itself be made a function of k; for example, initially $\lambda_\alpha$ may be set equal to 0.995 to provide a relatively small weighting to the initial estimates $\hat{\omega}_d(k)$ with a relatively large estimation error and may be set to 0.99 after some initial period to provide a fast tracking of $\alpha_0(k)$. The procedure can be extended to the case where a dynamic model for $\alpha_0(k)$ is specified in terms of its derivatives by using a Kalman filter update equation similar to (26) and providing the estimate for $\alpha_0(k)$ and that of the derivatives of $\alpha_0(k)$ based on the specified dynamic model and treating $\hat{\omega}_d(k)$ as the noisy measurement of $\alpha_0(k)$.

Figure 18:
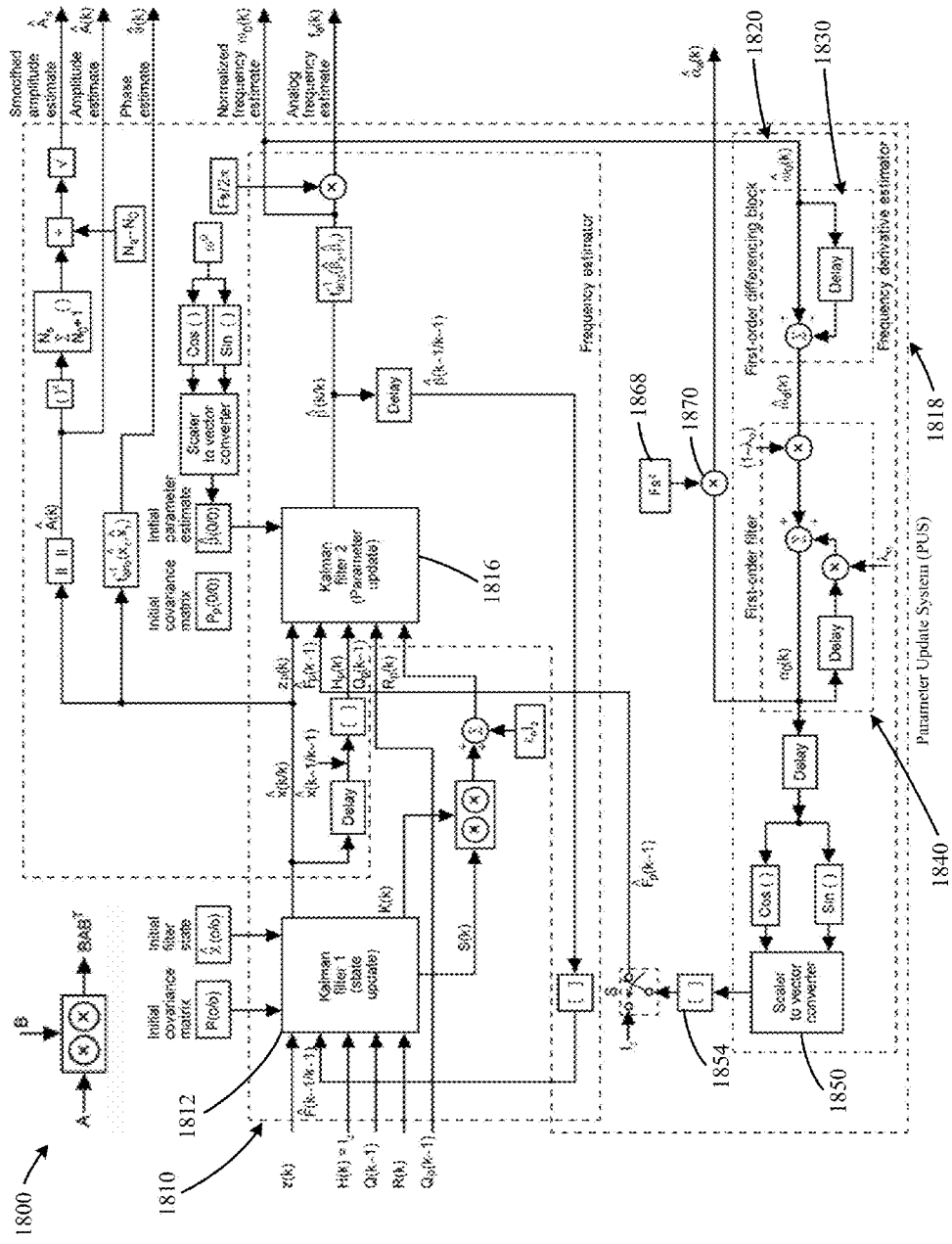
FIG. 18 is a block diagram illustrating an example architecture for providing signal parameter estimation, including frequency derivative estimates and time-varying frequency estimates, in accordance with embodiments of the disclosure.

Referring now to FIG. 18, an example architecture 1800 in accordance with embodiments of the disclosure for the case of a relatively significant non-zero frequency derivative estimation along with the time-varying frequency estimation is illustrated. The signal z(k) may be provided to a frequency estimator block 1810 that may be similar to the AKF 100 of FIGS. 1 and 2. The frequency estimator block 1810 may include a state update Kalman filter 1812 and a parameter update Kalman filter 1816. The frequency estimator block 1810 may provide at its outputs a filtered state estimate $\hat{x}(k/k)$ and a filtered parameter vector estimate $\hat{\beta}(k/k)$ from which a frequency estimate $\hat{f}_a(k)$ may be obtained as in the AKF 100 of FIGS. 1 and 2. Instead of being equal to the identity matrix as may be the case for AKF 100 of FIGS. 1 and 2, may be time-varying and may be generated by a frequency derivative estimator 1820.

The normalized frequency estimate $\hat{\omega}_0(k)$ may be provided to a first-order differencing block 1830 which may generate a difference frequency $\hat{\omega}_d(k)$ according to (70). The difference frequency $\hat{\omega}_d(k)$ may be provided to a first-order filter 1840 that generates at its output an estimate of the frequency derivative $\hat{\alpha}_0(k)$ according to (71). The delayed version of $\hat{\alpha}_0(k)$ may be input to the cascade of the cos ( ) and sin ( ) blocks and the scalar to vector converter 1850, followed by a matrix constructor block 1854 that generates $\hat{F}_p(k-1)$ from the vector $[\cos(\hat{\alpha}_0(k-1))\sin(\hat{\alpha}_0(k-1))]^T$ according to (68). The 2×2 matrix $\hat{F}_p(k-1)$ may be input to the parameter update Kalman filter 1816 for the generation of parameter vector estimate $\hat{\beta}(k/k)$.

Figure 19:
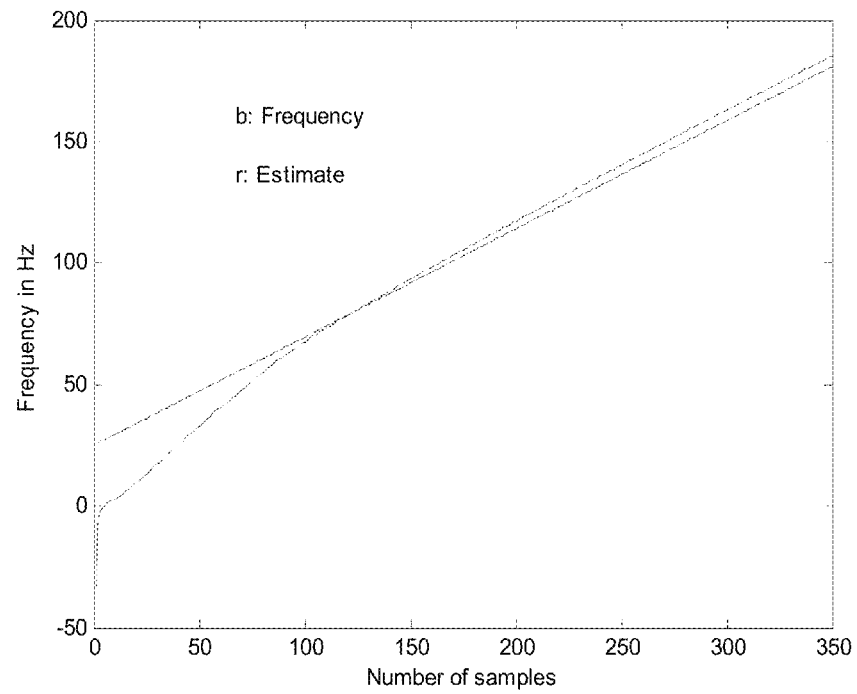
FIG. 19 shows a plot of example simulation results derived from the architecture of FIG. 18, in accordance with embodiments of the disclosure.
Figure 20:
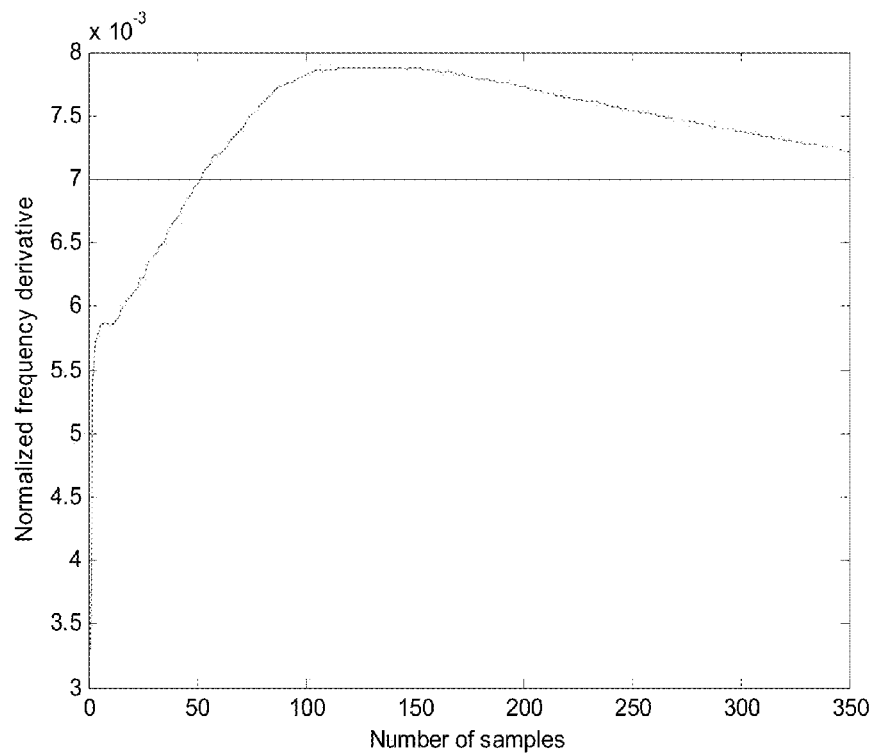
FIG. 20 shows a plot of example simulation results derived from the architecture of FIG. 18, in accordance with embodiments of the disclosure.

A non-limiting simulation example is shown for the estimation of the time-varying frequency with the frequency at time k=0 equal to 25 Hz and the parameter $\alpha_0$ equal to 0.007 corresponding to the parameter $\alpha_a$ equal to $0.007 \times 400^2 = 1120$ rad/sec$^2$. This corresponds to a rate of change in frequency of about 178 Hz/sec. The initial estimates of the frequency and the parameter $\alpha_0$ at time k=0 are equal to −25 Hz and 0 respectively. The SNR for this example is 5 (7 dB) with the initial values for various matrices in the AKF, same as in (49). FIG. 19 shows a plot of the frequency as a function of time along with its estimate obtained from the AKF. After about 100 samples, the frequency is tracked very closely by its estimate. FIG. 20 plots the convergence of the parameter $\alpha_0$ showing a rapid initial convergence of the estimate to the true parameter value. In (71) the filter parameter $\lambda_\alpha$ is initially selected equal to 0.995 and may be reduced to 0.99 after 150 samples.

In some embodiments of the disclosure, the first and higher order derivatives may be obtained by a Kalman filter 3 that may replace the frequency estimator block 1820 of FIG. 18. For example, for the case of first and second derivative estimation, the state vector $x_h(k)$ for the Kalman filter 3 may be given by $$x_h(k) = [\omega_0(k)\,\alpha_0(k)\,\beta_0(k)]^T \quad (71a)$$

wherein (71a) $\omega_0(k)$ and $\alpha_0(k)$ are the normalized frequency and the normalized first derivative of frequency respectively and $\beta_0 = \beta_a T_s^3$ with $\beta_a$ denotes the second derivative of the frequency $\omega(t)$. The time-variation of $\beta_0$ may be given by $$\beta_0(k+1) = \beta_0(k) + n_\beta(k) \quad (71b)$$

In (71b), $n_\beta(k)$ is a zero mean independent sequence with variance $\sigma_\beta^2$. The state transition equation for $x_h(k)$ is given by $$x_h(k+1) = F_h x_h(k) + G_h \xi_h \quad (71c)$$

where in (71c) $G_h$ is the identity matrix and the covariance matrix $Q_h$ of the noise vector $\xi_h$ is given by $$Q_h = \begin{bmatrix} 1/20 & 1/8 & 1/6 \\ 1/8 & 1/3 & 1/2 \\ 1/6 & 1/2 & 1 \end{bmatrix} \sigma_\beta^2 \quad (71d)$$

The state transition matrix $F_h$ in (71b) is given by $$F_h = \begin{bmatrix} 1 & 1 & 1/2 \\ 0 & 1 & 1 \\ 0 & 0 & 1 \end{bmatrix} \quad (71e)$$

The measurement equation for the Kalman filter 3 is given by $$z_h(k) = H z_h(k) + n_h(k); H = [1 \ 0 \ 0] \quad (71f)$$

with $z_h(k)$ in (71f) made equal to the normalized frequency estimate obtained from the Kalman filter 2 state estimate $\hat{\beta}(k/k)$ as in FIG. 18. Thus $n_h(k) = \tilde{\omega}_0(k)$ and the covariance of $n_h(k)$ may be estimated from (51)-(53) and is given by $$R_h(k) = E[\tilde{\omega}_0^2(k)] \approx \text{Trace}[P_p(k/k)] \quad (71g)$$

On the basis of the state space model described by (71a-71g), the Kalman filter 3 may provide the estimate $\hat{x}_h(k/k)$, the second component of which is the estimate of $\alpha_0(k)$ that may be inputted to the block 1854 of FIG. 18 instead of that from block 1818 of FIG. 18. Derivatives of frequency of order higher than 2 can similarly be obtained by appropriate extension of the dimension of the state vector $x_h(k)$.

Estimation of Multiple Frequencies

In further embodiments of the disclosure, parameter estimation on multiple sinusoidal signals received in the presence of noise may be performed. In this case, the received intermediate frequency (bandpass) signal $z_{IF}(t)$ is given by $$z_{IF}(t) = \sum_{m=1}^{N} A_m \cos(2\pi(f_c + f_{am})t + \varphi_m) + n(t) \quad (72)$$

In (72), $f_{IF}$ is the known intermediate frequency and the unknown frequencies $f_{am}$ have their values in the range of $-B$ to $B$ Hz for some B. The amplitudes $A_m$ and phase $\phi_m$ associated with frequencies $f_{am}$ are also unknown. The bandpass white noise $n(t)$ has a one-sided noise power spectral density of $N_0$ W/Hz. The corresponding baseband model is given by $$z_i(t) = \sum_{m=1}^{N} A_m \cos(\omega_{am} t + \varphi_m) + n_i(t) \quad (73a)$$

$$z_q(t) = \sum_{m=1}^{N} A_m \sin(\omega_{am} t + \varphi_m) + n_q(t) \quad (73b)$$

In (73a, 73b), $z_i(t)$ and $z_q(t)$ are the in-phase and quadrature signals and $\omega_{arm} = 2\pi f_{am}$ for m=1, 2, ..., N. The baseband processes $n_i(t)$ and $n_q(t)$ are independent white noise processes with the two-sided power spectral density $N_0$ W/Hz. It is required to estimate the parameters $A_m$, $\omega_{am}$ and $\phi_m$ for m=1, 2, ..., N. The signals $z_i(t)$ and $z_q(t)$ are sampled at a rate $F_s$ that is at least two times the maximum possible frequency B. The corresponding discrete time version of the measurements is given by $$z_i(k) = \sum_{m=1}^{N} A_m \cos(k\omega_m + \varphi_m) + n_i(k) \quad (74a)$$

$$z_q(k) = \sum_{m=1}^{N} A_m \sin(k\omega_m + \varphi_m) + n_q(k) \quad (74b)$$

In equation (74), k denotes the discrete time index and $\omega_m = \omega_{am} T_s$, m=1, 2, ..., N are the digital frequencies in rad with $T_s = 1/F_s$. The sampled noise sequences $n_i(k)$ and $n_q(k)$ are independent random sequences with zero mean and variance $\sigma_n^2 = N_0/T_s$. In the case of multiple frequencies, the state vector x(k) is a 2N dimensional vector $$x(k) = [x_1(k) x_2(k) \ldots x_{2N}(k)]^T \quad (75)$$

With the components $x_m(k)$ given by $$x_{2m-1}(k) = A_m \cos(k\omega_m + \phi_m)$$

$$x_{2m}(k) = A_m \sin(k\omega_m + \phi_m); m=1, 2, \ldots, N \quad (76)$$

In the more general case where the $m^{th}$ signal has a frequency derivative $\alpha_{am}$, the state components in (76) are replaced by $$x_{2m-1}(k) = A_m \cos(\theta_m(k)) \quad (77a)$$

$$x_{2m}(k) = A_m \sin(\theta_m(k)) \quad (77b)$$

where $\theta_m(k)$ is the sampled version of $\theta_m(t)$ given by $$\theta_m(t) = \omega_{am}(t) + \alpha_m \frac{t^2}{2} + \varphi_m \quad (78)$$

and as for the case of a single sinusoidal signal $$\theta_m(k) - \theta_m(k-1) = \omega_m(k) \quad (79a)$$

$$\omega_m(k) = \omega_{am} T_s - \alpha_{am} \frac{T_s^2}{2} + k\alpha_{am} T_s^2; k = 1, 2, \ldots \quad (79b)$$

$$\omega_m(k) = \omega_m(k-1) + \alpha_m; \alpha_m \equiv \alpha_{am} T_s^2 \quad (79c)$$

The measurement equations (74a, 74b) may be written in the following matrix vector form $$z(k) = \begin{bmatrix} z_i(k) \\ z_q(k) \end{bmatrix} = Hx(k) + n(k); \quad (80)$$

$$n(k) = \begin{bmatrix} n_i(k) \\ n_q(k) \end{bmatrix}$$

In (80), the measurement matrix H is a 2×2N matrix given in the following partitioned form $$H[I_2 I_2 \ldots I_2] \quad (81)$$

where $I_2$ is the (2×2) identity matrix. The filtered and predicted state estimates $\hat{x}(k/k)$ and $\hat{x}(k/k-1)$ are obtained from the Kalman filter equation (15) wherein the corresponding covariance matrices P(k/k) and P(k/k−1) are square matrices of dimension 2N. The process covariance matrix Q may be set to zero as for the case of single frequency estimation. The matrix F(k−1) in (15) is replaced by the estimate $\hat{F}(k-1/k-1)$ obtained by the parameter vector update equations similar to (26). The matrix $\hat{F}(k-1/k-1)$ is a 2N×2N matrix given in the following partitioned form $$\hat{F}(k-1/k-1) = \begin{bmatrix} \hat{F}_1(k-1/k-1) & O & O & \ldots & O \\ O & \hat{F}_2(k-1/k-1) & O & \ldots & O \\ \vdots & \vdots & \vdots & \ldots & \vdots \\ O & O & O & \ldots & \hat{F}_N(k-1/k-1) \end{bmatrix} \quad (82)$$

In (82), $\hat{F}_m(k-1/k-1)$ for m=1, 2, ..., N is a 2×2 matrix given by $$\hat{F}_m(k-1/k-1) = \begin{bmatrix} \hat{\beta}_{m1}(k-1/k-1) & -\hat{\beta}_{m2}(k-1/k-1) \\ \hat{\beta}_{m2}(k-1/k-1) & \hat{\beta}_{m1}(k-1/k-1) \end{bmatrix} \quad (83)$$

The parameter vector estimate $\hat{\beta}_m(k-1/k-1) = [\hat{\beta}_{m1}(k-1/k-1) \hat{\beta}_{m2}(k-1/k-1)]^T$ is obtained recursively from the parameter update equation (26) with $\hat{\beta}(k/k)$, $\hat{\beta}(k/k-1)$, $z_p(k)$, $H_p(k)$ and $R_p(k)$ in (26) replaced by $\hat{\beta}_m(k/k)$, $\hat{\beta}_m(k/k-1)$, $z_{pm}(k)$, $H_{pm}(k)$ and $R_{pm}(k)$ respectively, where $$z_{pm}(k) = \begin{bmatrix} \hat{x}_{2m-1}(k/k) \\ \hat{x}_{2m}(k/k) \end{bmatrix} = H_{pm}(k)\beta_m(k) + n_{pm}(k); \quad (84)$$

$$H_{pm}(k) = \begin{bmatrix} \hat{x}_{2m-1}(k-1/k-1) & -\hat{x}_{2m}(k-1/k-1) \\ \hat{x}_{2m}(k-1/k-1) & \hat{x}_{2m-1}(k-1/k-1) \end{bmatrix} \quad (85)$$

The matrix $Q_p$ is set equal to the zero matrix with $G_p$ equal to the (2×2) identity matrix. The matrix $R_p(k)$ in (33) is a 2N×2N matrix for this case of multiple signals, with $R_{pm}$ given by the following (2×2) submatrix of $R_p(k)$.

$$R_{pm} = \begin{bmatrix} R_p(2m-1, 2m-1) & R_p(2m-1, 2m) \\ R_p(2m, 2m-1) & R_p(2m, 2m) \end{bmatrix}; \quad (86)$$

$$m = 1, 2, \ldots, N$$

The matrix $F_p(k-1)$ in (26) is replaced by $F_{pm}(k-1)$ given by $$F_{pm}(k-1) = \begin{bmatrix} \cos(\hat{\alpha}_m(k-1)) & -\sin(\hat{\alpha}_m(k-1)) \\ \sin(\hat{\alpha}_m(k-1)) & \cos(\hat{\alpha}_m(k-1)) \end{bmatrix}; \quad (87)$$

$$m = 1, 2, \ldots, N$$

In (87), $\hat{\alpha}_m(k-1)$ denotes the estimate of $\alpha_m$ based on the measurements z(i) for i=1, 2, ..., k−2 and is estimated as for the case of the single frequency estimation. Thus the normalized frequency $\omega_m(k)$ at time k is estimated by $$\hat{\omega}_m(k) = \tan_2^{-1}(\hat{\beta}_{m2}(k/k), \hat{\beta}_{m1}(k/k)); k=1,2\ldots \quad (88)$$

The normalized frequency estimate $\hat{\omega}_m(0/0)$ at time 0 may be set to an initial estimate $\omega^m$ of $\omega_m(0)$ which may be equal to 0 and $\hat{\beta}_m(0/0)$ in the parameter vector update equation set equal to $[\cos(\omega^m) \sin(\omega^m)]^T$. From (88), the first order differences are obtained as $$\hat{\omega}_{md}(k) = \hat{\omega}_m(k) - \hat{\omega}_m(k-1); k=1,2,\ldots \quad (89)$$

The estimate $\hat{\omega}_{md}(k)$ in (89) constitutes the noisy estimate of the parameter $\alpha_m$ which may also be a slowly varying function of k. The smoothed estimate of $\omega_m$ may be obtained by filtering the estimate $\hat{\omega}_{md}(k)$ by an appropriate filter. For example, use of a first-order filter yields $$\hat{\alpha}(k) = \lambda_m \hat{\alpha}_m(k-1) + (1-\lambda_m)\hat{\omega}_{md}(k); k=1, 2, \ldots \quad (90)$$

In (90), $\hat{\alpha}_m(0)$ may be set equal to an initial estimate of $\alpha_m$ or may be set equal to 0. In (90), $\lambda_m$ is a positive constant with $0 < \lambda_m < 1$ and determines the filter time constant which is set in accordance with the expected rate of variation of $\alpha_m$. The parameter, $\lambda_m$ may itself be a function of k; for example, initially $\lambda_m$ may be set equal to 0.999 to provide relatively small weighting to the initial estimates $\hat{\omega}_{md}(k)$ with a relatively large estimation error and may be set to 0.99 after some initial period to provide a fast tracking of $\alpha_0(k)$. The procedure may be extended to the case where a dynamic model for $\alpha_m(k)$ is specified in terms of its derivatives by using a Kalman filter update equation similar to (26) for providing the estimate for $\alpha_m(k)$ and that of the derivatives of $\alpha_0(k)$ based on the specified dynamic model and treating $\hat{\omega}_{md}(k)$ as the noisy measurement of $\alpha_0(k)$.

From the definition of the components of the state vector in (77), the phase estimate at time k is obtained as $$\hat{\theta}_m(k) = \tan_2^{-1}(\hat{x}_{2m}(k/k), \hat{x}_{2m-1}(k/k)); m=1,2,\ldots,N \quad (91)$$

The filtered estimate of the amplitude $A_m$ is given by $$\hat{A}_m(k) = [\hat{x}_{2m-1}^2(k/k) + \hat{x}_{2m}^2(k/k)]^{1/2} \quad (92)$$

A smoothed estimate of the amplitude $A_m$ may be obtained from (93).

$$\hat{A}_{mS} = \left[ \frac{1}{N_s - N_0} \sum_{k=N_0+1}^{N_s} \hat{A}_m^2(k) \right]^{1/2} \quad (93)$$

In (93), $N_s$ is the total number of samples and $N_0$ is the number of samples that are discarded in the computation of the smoothed estimate of $A_m$.

Figure 21:
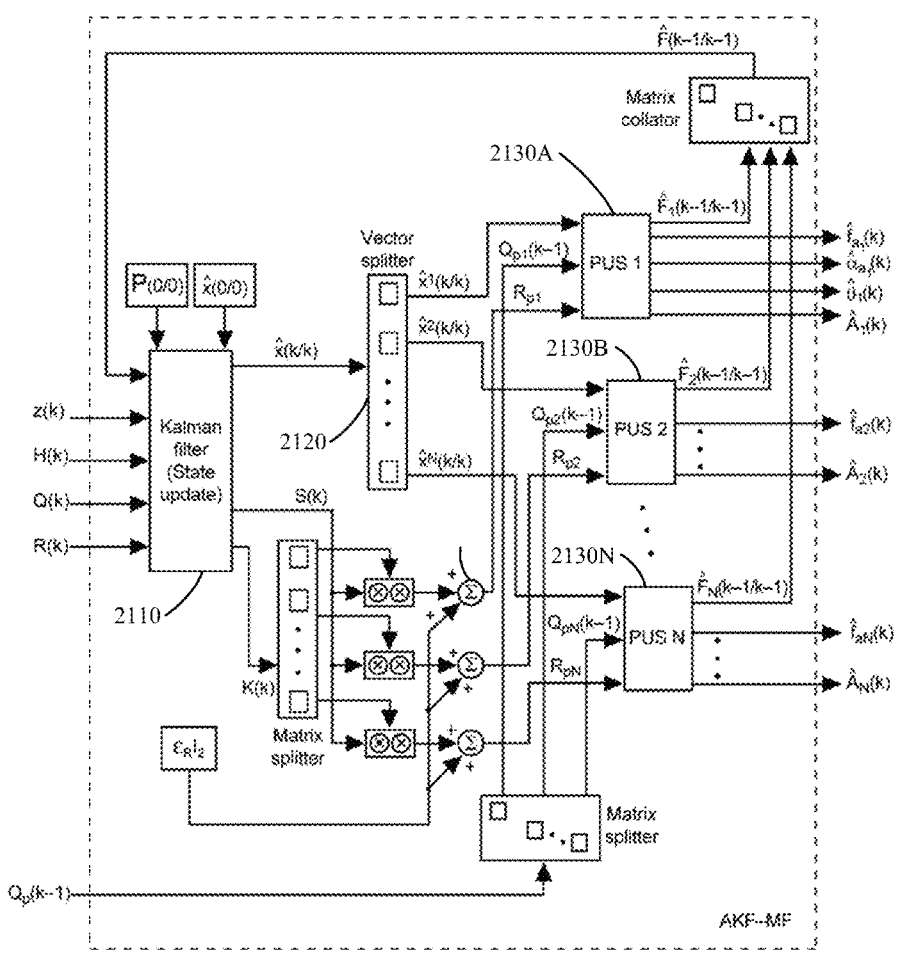
FIG. 21 is a block diagram illustrating an example architecture for providing signal parameter estimation for multi-frequency signals, in accordance with embodiments of the disclosure.

FIG. 21 illustrates another embodiment of the disclosure for the estimation of multiple frequencies present in an input signal z(k) with significant frequency derivatives using adaptive Kalman filter multi-frequency (AKF-MF) 2100. The signal z(k) may be input to a state update Kalman filter 2110 where the dimension of the state vector may be equal to 2N when N is the number of frequencies. The measurement matrix H at the input to the state update Kalman filter 2110 may be of dimension 2×2N and is given by (81). The measurement noise covariance matrix R(k) at the input to the state update Kalman filter 2110 may be given by $\sigma_n^2 I_2$, and Q(k−1) may be equal to a constant diagonal matrix $\epsilon_Q I_{2N}$ for a small positive scalar $\epsilon_Q$. The filtered state estimate $\hat{x}(k/k)$ may be provided to a vector splitter 2120 that may partition the input vector $\hat{x}(k/k)$ into N vectors each of dimension 2 and denoted by $\hat{x}^1(k/k), \hat{x}^2(k/k), \ldots \hat{x}^N(k/k)$ with $$\hat{x}^m(k/k) = [\hat{x}_{2m-1}(k/k)\hat{x}_{2m}(k/k)]^T \quad (93a)$$

A Kalman gain matrix K(k) of dimension 2N×2 may be input to the matrix splitter to partition K(k) into N submatrices $K^1(k), K^2(k), \ldots, K^N(k)$ each of dimension 2×2 with $$K^m(k) = \begin{bmatrix} K(2m-1, 1) & K(2m-1, 2) \\ K(2m, 1) & K(2m, 2) \end{bmatrix} \quad (93b)$$

$$m = 1, 2, \ldots, N$$

In (93b), the argument k in the elements of the matrix has been dropped for the notational simplification. The innovation covariance matrix S(k) may be pre- and post-multiplied by $K^m(k)$ and its transpose $K^{mT}(k)$, and the resulting product may be added to a constant matrix $\epsilon_R I_2$, for some small positive scalar $\epsilon_R$, providing a measurement covariance matrix $R_{pm}$ for an $m^{th}$ PUS (parameter update subsystem) block 2130(A)-(N) (collectively referred to herein as 2130) for m=1, 2, ..., N. The component state vector $\hat{x}^m(k/k)$ may be provided to the $m^{th}$ PUS block 2130 to generate the estimates for the frequency $\hat{f}_{a,m}(k)$, frequency derivative $\hat{\alpha}_{a,m}(k)$, phase $\hat{\theta}_m(k)$ and amplitude $\hat{A}_m(k)$ and the smoothed amplitude estimate $\hat{A}_{m,S}$, for m=1, 2, ..., N. The operation of the PUS block 2130 has been explained with reference to block 1818 of FIG. 18 and, in the interest of brevity, will not be repeated here.

When the number of frequencies N in (72) is relatively large, the dimension of the covariance matrices P(k/k) and P(k/k−1) in the Kalman filter equation (15), equal to 2N×2N, is also correspondingly large. In this case, the matrix dimension can be reduced by filtering the complex valued signal $z_c(k)=z_i(k)+j\, z_q(k)$; $j=\sqrt{-1}$ by a set of M complex bandpass filters with their bandwidths equal to 2B/M and their center frequencies selected so that the M filters have mutually disjoint pass bands. For example, with M=4, each of the 4 filters has a bandwidth equal to B/2 with their respective center frequencies equal to −3B/4, −B/4, B/4, and 3B/4 respectively. In alternative embodiments, there may be some non-zero overlap among the adjacent frequency bands of the M complex filters' output signals to avoid attenuating any frequency that may fall in a transition band of the filter.

The outputs of the M filters may be down converted to complex baseband so that each of the M down converted signals has its center frequency equal to 0 and has frequencies in the range of −B/4 to B/4. The sampling rates of the down converted signals are decimated by a factor M to the rate $F_s/M$. All of the operations of bandpass filtering, down conversion to complex baseband, and decimation can be performed by a bank of polyphase filters.

The individual outputs of the polyphase filters are then processed by the adaptive Kalman filters to acquire and track the frequencies present in the respective outputs of the polyphase filters. The frequency estimates thus obtained are adjusted by the center frequencies of the corresponding bandpass filters to arrive at the frequency, frequency derivative, and the amplitude estimates of the N signals present in the signal $z_c(k)$.

In an alternative embodiment, instead of using a polyphase filter, the filtering of the signal $z_c(i)$ may be performed by the FFT operation as follows. Let $$z^m(k) = \frac{1}{M}\sum_{i=(k-1)M}^{kM-1} z_c(i) e^{-j2\pi f_m i T_s}; \tag{94}$$

$$f_m = -B + m\Delta f;$$

$$\Delta f = \frac{F_s}{M};$$

$$m = 0, 1, \ldots, M-1$$

The operation in (94) constitutes frequency shifting of the signal $z_c(i)$ by frequency $f_m$ followed by a decimation by the factor M assumed to be even. The signal $z^m(k)$ can also be obtained in terms of the discrete Fourier transform or the Fast Fourier transform (FFT) $\bar{z}_f^k$ (of the $k^{th}$ segment of $z_c(i)$ of length M given by $\bar{z}^k = [z_c((k-1)M) z_c((k-1)M+1) \ldots z_c(kM-1)]$ after being modified by multiplication of the $i^{th}$ element of $\bar{z}^k$ (by $(-1)^i$, i.e., with $$\bar{z}_f^k(m) = \sum_{i=0}^{M-1} (-1)^i \bar{z}^k(i) \exp(-j2\pi i m/M); \tag{95}$$

$$m = 0, 1, \ldots, M-1$$

$$z_c^m(k) = \frac{1}{M} \bar{z}_f^k(m) \tag{96}$$

For a component $z_0(k)$ at frequency $f_0=(f_{m_0}+\delta f)$ contained in the signal $z_c(k)$ for some $m_0$, $0 \le m_0 \le M-1$, with $-\Delta f \le \delta f \le \Delta f$, the $k^{th}$ segment of that component complex valued signal is given by $$\bar{z}_0^k(i) = A e^{j\phi} \exp[j2\pi(f_{m_0}+\delta f)iT_s]; i=0,1,\ldots M-1 \tag{97}$$

where $\bar{z}_0^k(i)$ denotes the $i^{th}$ element of the segment $\bar{z}_0^k$ and $\phi$ denotes the phase at the start of the $k^{th}$ segment. From (94), the corresponding output for the signal $\bar{z}_0^k$ is given by $$z_0^m(k) = A e^{j\varphi} \sum_{i=0}^{M-1} \exp[j2\pi(f_{m_0}-f_m+\delta f)iT_s] \tag{98}$$

From (98)

$$z_0^m(k) = \frac{A}{M} e^{j\varphi} \exp\left\{j\pi\left[\frac{\delta f}{\Delta f}\frac{(M-1)}{M}\right]\right\} \frac{\sin(\pi \delta f/\Delta f)}{(\pi \delta f/(M\Delta f))}; m = m_0 \tag{99}$$

The expression for $z_0^m(k)$ may also be approximated by $$z_0^m(k) \cong \begin{cases} A e^{j\varphi} \exp\left\{j\pi\left[\frac{\delta f}{\Delta f}\frac{(M-1)}{M}\right]\right\} \frac{\sin(\pi \delta f/\Delta f)}{(\pi \delta f/\Delta f)}; m = m_0 \\ 0; m \ne m_0 \end{cases} \tag{100}$$

As the adjacent frequencies $f_m$ are spaced by $\Delta f$, for any frequency in the interval $f_{m_0}$ and $f_{m_0+1}$ with $f_0=f_{m_0}+\delta f$; $0 \le \delta f \le \Delta f$, one obtains $$A_1 \equiv z_0^{m_0}(k) = A a_1 e^{j\varphi} e^{j\psi_1}; \tag{101a}$$

$$a_1 = \frac{\sin(\pi \delta f/\Delta f)}{(\pi \delta f/\Delta f)}; \psi_1 = (\pi \delta f/\Delta f)\left(\frac{M-1}{M}\right)$$

$$A_2 \equiv z_0^{m_0+1}(k) = A a_2 e^{j\varphi} e^{j\psi_2}; \tag{101b}$$

$$a_2 = \frac{\sin(\pi(1-\delta f/\Delta f))}{(\pi(1-\delta f/\Delta f))}; \psi_2 = (\pi(1-\delta f/\Delta f))\left(\frac{M-1}{M}\right)$$

The adaptive Kalman filter for multiple frequencies (AKF-MF) 2100 may be applied to signals $z^m(k)$, m=0, 1, ..., M−1. For any frequency $f_0$ with $f_0=f_{m_0}+\delta f$; $0 \le \delta f \le \Delta f$, the AKF-MF 2100 applied to both $z^{m_0}(k)$ and $z^{m_0+1}(k)$ result in frequency estimates $f_{r1}$ and $f_{r2}$ close to $\delta f$ and $-(\Delta f - \delta f)$ respectively with the estimate of $\delta f$ given by $\hat{\delta f} = (f_{r1}+f_{r2}+\Delta f)/2$. From $f_{r1}$ and $f_{r2}$, the estimate of $f_0$ is given by $f_{m_0}+(f_{r1}+f_{r2}+\Delta f)/2$. The frequency estimates from any two AKF-MFs 2100 are combined in this manner if the estimates differ by less than the resolution frequency $f_{res}$ which may be selected to be a fraction of $\Delta f$. The corresponding estimates of the amplitudes $\hat{A}_1$ and $\hat{A}_2$ provided by the two AKFM are expected to be close to the magnitudes of $A_1$ and $A_2$ respectively given by (101).

Thus with the estimate of $\hat{\delta f}$ known, the coefficients $a_1$ and $a_2$ and the phase $\psi_1$ and $\psi_2$ may be evaluated from (101a, 101b) after replacing $\hat{\delta f}$ by its estimate and the estimate of the amplitude A may be obtained by the maximal ratio combining of $\hat{A}_1$ and $\hat{A}_2$ as $$\hat{A}=|a_1\hat{A}_1 e^{-j\psi_1}+a_2\hat{A}_2 e^{-j\psi_2}|/(a_1^2+a_2^2) \qquad (102a)$$

For the case of a2=0, the equation (102a) normalizes the amplitude $A_1$ by $a_1$ providing the correct estimate for the amplitude A. When the estimate $\hat{\delta f}$ has significant error, an incoherent combining of the amplitudes $\hat{A}_1$ and $\hat{A}_2$ may be used to yield the following amplitude estimate.

$$\hat{A}=[a_1|\hat{A}_1|+a_2|\hat{A}_2|]/(a_1^2+a_2^2) \qquad (102b)$$

The estimate for the phase is given by $$\hat{\phi}=[\arg(A_1)-\psi_1+\arg(A_2)-\psi_2]/2 \qquad (103)$$

Figure 22:
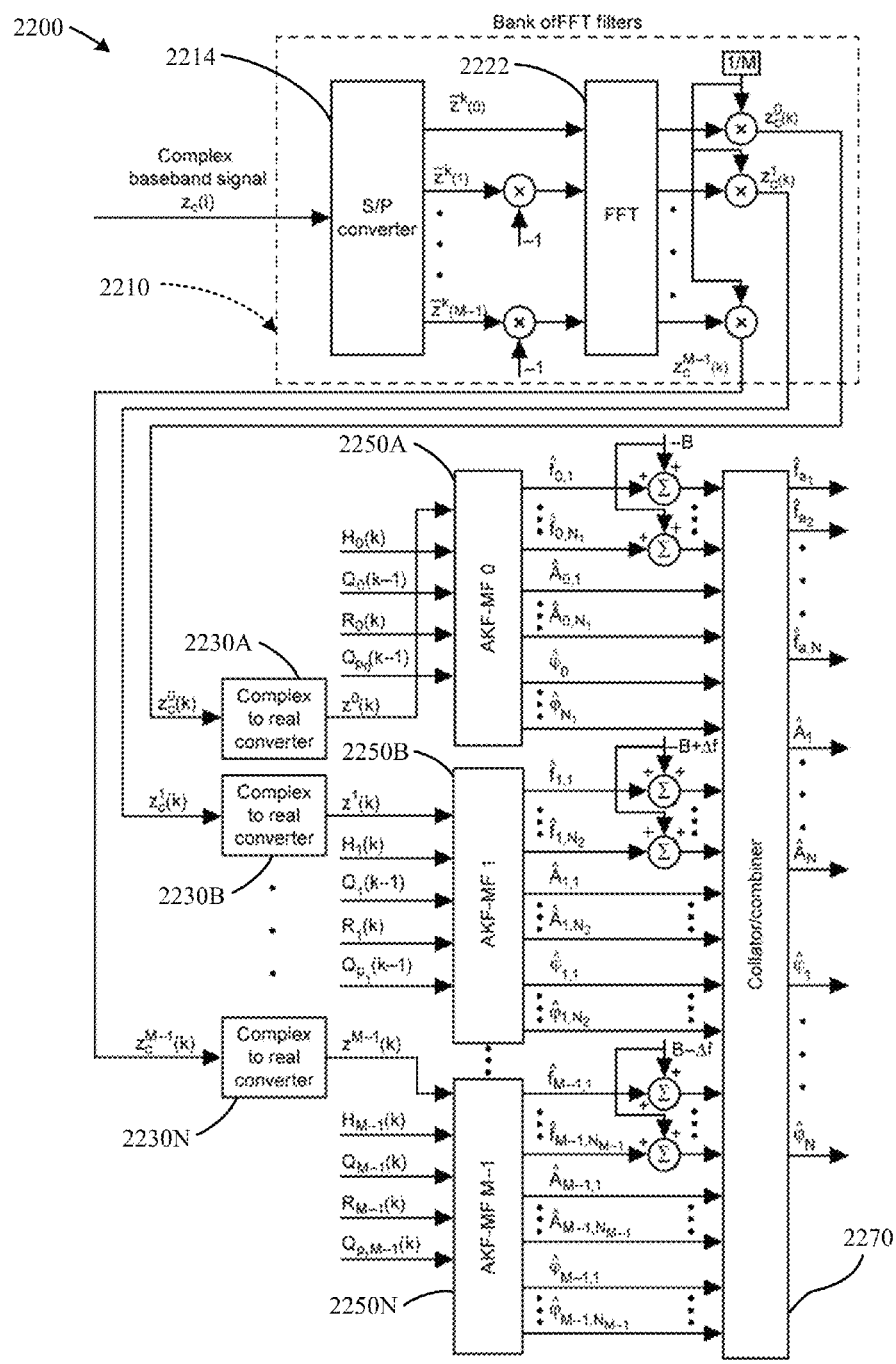
FIG. 22 is a block diagram illustrating an example architecture including a bank of filters for providing signal parameter estimation for multi-frequency signals, in accordance with embodiments of the disclosure.

FIG. 22 illustrates a further example embodiment of the disclosure wherein the input signal, including multiple frequencies, may be split into a number M of signals that have approximately disjoint spectrum with some possible overlap using the architecture 2200 of FIG. 22. The complex valued signal $z_c(i)$, where i denotes input time index, may be provided to a bank of FFT filters 2210. In particular, $z_c(i)$ may be input to a serial to parallel converter 2214 that may split the input signal $z_c(i)$ into M parallel streams denoted by $\bar{z}^k(0), \ldots \bar{z}^k(M-1)$. The signals with odd index in their arguments may be inverted. For any time index k, the signals after being multiplied by ±1 may be input to an FFT block 2222 that may provide the FFT of the input vector $\bar{z}_f^k(m)$, m=0, 1, . . . , M−1 as the output of the FFT block 2222 according to (95). The FFT outputs after normalization by M may include filtered signals $z_c^m(k)$, m=0, 1, . . . , M−1; k=0, 1, . . . defined in (94). The signal $z_c^m(k)$ may be input to a complex to real converter 2230(A)-(N) (collectively referred to herein as 2230) that outputs a dimension 2 vector $z^m(k)$ with its elements equal to the real and imaginary parts, respectively, of the signal $z_c^m(k)$.

The two dimensional vector $z^m(k)$ is input to the AKF-MF block that is also inputted with the matrices $H_m(k)$, $Q_m(k-1)$, and $R_m(k)$. The matrix $H_m(k)$ is given by (81) and is of dimension $2 \times 2N_m$, $Q_m(k-1) = \epsilon_Q I_{2N_m}$ for some small positive scalar $\epsilon_Q$ and $R_m(k) = \sigma^2 I_2$ with $\sigma^2 = \sigma_n^2/M$ and with $N_m$ denoting the number of frequencies in the signal $z_c^m(k)$ and may be replaced by some appropriate upper bound. Partitioning the input signal $z_c(i)$ in this manner reduces both the dimension of the state vector and various other matrices and at the same time reduces the noise variance by the factor M.

Referring still to FIG. 22, the AKF-MF block 2250(A)-(N) (collectively referred to herein as 2250) may provide, as its output, the frequency estimates $\hat{f}_{m,i}(k)$, frequency derivative $\hat{\alpha}_{m,i}(k)$ (not shown), phase $\hat{\phi}_{m,i}(k)$ and the amplitude $\hat{A}_{m,i}(k)$, for i=1, 2, . . . , $N_m$ for m=0, 1, . . . , M−1. The operation of the AKF-MF block 2250 has been explained with reference to FIG. 21, and in the interest of brevity, will not be repeated here. The estimates of frequencies after being modified by the frequencies ($-B+m\Delta f$), frequency derivatives, amplitudes, and phase may be input to a collator/combiner block 2270. In the collator/combiner block 2270, any two frequency estimates in any two adjacent AKF-MF blocks 2250 that are within the resolution frequency of each other are combined into one estimate obtained by either a simple arithmetic average of the two frequencies or by a weighted average with the weights determined by the corresponding amplitudes with similar averaging of the frequency derivatives. The corresponding amplitudes and phase may be combined according to (102)-(103). For the case of constant frequencies, the proximity may be determined on the basis of only the final estimates at time $N_s$ where as for the time-varying frequencies, the two frequency estimates should be close to each other over an interval of time to be combined into one. The collator/combiner block, after possibly combining frequency estimates, may provide the N frequencies, frequency derivatives, amplitudes and phase as the output. In an alternative embodiment, the operation of splitting the input complex signal $z_c(k)$ into M parallel streams denoted by $\bar{z}_c^0(k), \bar{z}^1(k), \ldots \bar{z}^{M-1}(k)$ with approximately mutually disjoint spectra may be performed by a bank of polyphase filters instead of the bank of FFT filters 2210 as shown in FIG. 22.

Simulation Results

Figure 23:
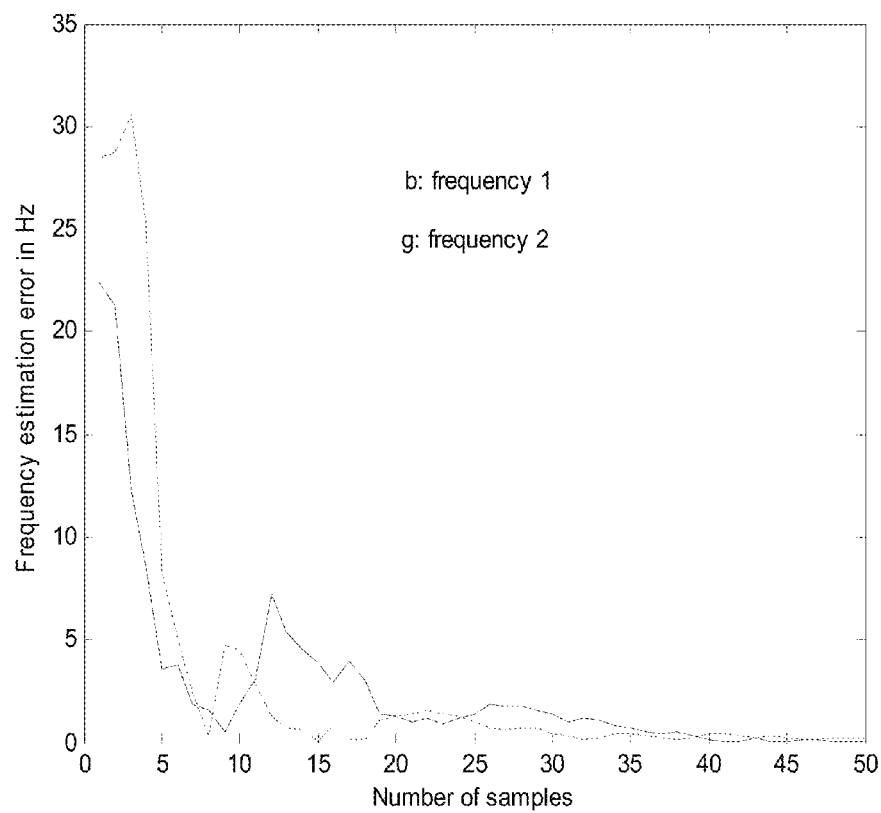
FIG. 23 shows a plot of example simulation results derived from the architectures of FIGS. 21 and 22, in accordance with embodiments of the disclosure.
Figure 24:
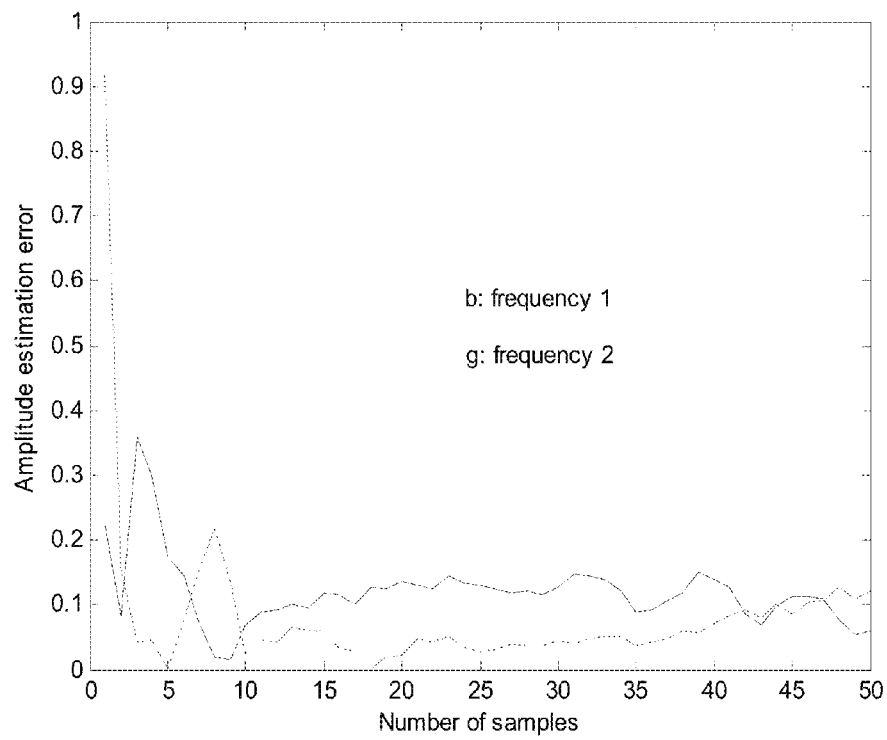
FIG. 24 shows a plot of example simulation results derived from the architectures of FIGS. 21 and 22, in accordance with embodiments of the disclosure.
Figure 25:
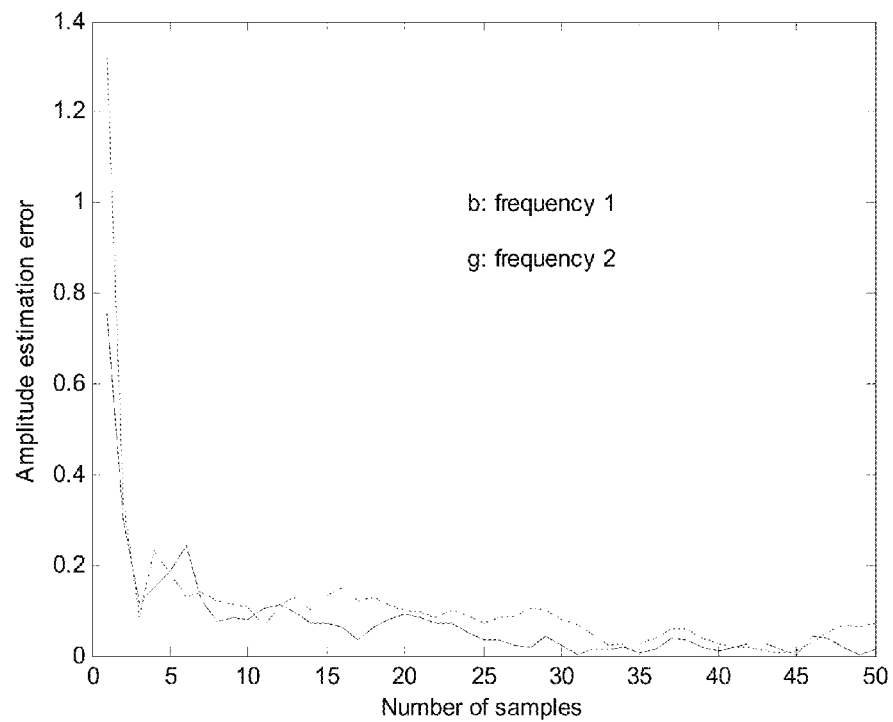
FIG. 25 shows a plot of example simulation results derived from the architectures of FIGS. 21 and 22, in accordance with embodiments of the disclosure.

FIG. 23 shows a plot of the frequency estimation error for the case of N=2 frequencies at 76 Hz and 135 Hz with their respective amplitudes $A_1$ and $A_2$ both equal to 0.5. The noise variance $\sigma_n^2 = 0.1$ corresponds to the total signal power to noise power ratio of 2.5 (3.5 dB). The matrix P(0/0) is equal to $5I_4$ with $I_4$ denoting the 4×4 identity matrix and $P_p(0/0) = 0.1 I_2$, $Q=1.0 \times 10^{-4} I_4$. The initial estimates for the two frequencies are 55 Hz and 161 Hz, respectively. The estimation error in the estimates of both the frequencies may become very small with about 40 samples. FIG. 24 shows a plot of the error in the amplitude estimates $\hat{A}_1$ and $\hat{A}_2$ obtained from (92). FIG. 25 shows a plot of the amplitude estimation errors for the case when both the amplitudes $A_1$ and $A_2$ are equal to 1 corresponding to the total signal power to noise power ratio of 10 (10 dB). In this case, the amplitude estimation errors are also small. The frequency estimation errors for this case are relatively small. The errors in the smoothed estimates of amplitudes $\hat{A}_{1S}$ and $\hat{A}_{2S}$ obtained from (93) may be even smaller than those in FIGS. 24 and 25.

Adaptive Kalman Filter-Correlation Detector
(AKF-CD)

When the signal-to-noise ratio is relatively small and the initial frequency uncertainty is relatively large, there may be some small probability that the AKF estimation algorithm may not converge to the true frequency with relatively small estimation error. To avoid such a possibility, a correlation detector is used to validate the frequency estimates provided by the AKF.

In the AKF-CD architecture, the estimation interval of $N_s$ samples is segmented into $m_s$ segments of $n_s$ samples each wherein in the special case $n_s$ may be equal to $N_s$. In this architecture, the AKF algorithm with various matrices described in equations (74) to (103) may be run for $n_s$ samples to estimate $\hat{\omega}_m(k)$ and $\hat{\alpha}_m(k)$ for k=1, 2, . . . , $n_s$; m=1, 2, . . . , N where N is the number of frequencies. From (79), the phase estimate $\hat{\theta}_m(k)$ is obtained as $$\hat{\theta}_m(k)=\hat{\theta}_m(k-1)+\hat{\omega}_m(k); k=1,2,\ldots,n_s \qquad (104)$$

In (104), $\hat{\theta}_m(0)$ may be set to 0. The complex valued signal $z_c(k)=z_i(k)+jz_q(k); j=\sqrt{-1}$ is correlated with the signal $s_m(k)$ in a semi-coherent manner, where $$s_m(k)=\exp(-j2\pi\hat{\theta}_m(k)); k=1,2,\ldots,n_s \qquad (105)$$

For the semi-coherent correlation, the interval $n_s$ is divided into $m_c$ segments of length $n_c$, and the coherent correlation is computed for each of the $m_c$ intervals as $$r_c^m(l) = \sum_{k=(l-1)n_c+1}^{l\,n_c} z_c(k)s_m(k); l = 1, 2, \ldots, m_c \quad (106)$$

In (106), the interval $n_c$ is determined such that some bound on the expected frequency estimation error in Hz obtained after processing the $n_s$ samples is much smaller than the $F_s/n_c$ Hz wherein the bound on the expected frequency estimation error in Hz, for example, may be some multiple of the C-R bound. From (106), the correlation over the interval of $n_s$ samples is obtained as $$r_m^i = \left\{ \sum_{l=l_0+1}^{m_c} |r_m^c(l)|^2 \right\}^{1/2} \quad (107)$$

In (107), $l_0$ that may be 0 denotes the number of initial $n_c$ length segments that are discarded in the computation of the incoherent correlation $r_m^i$. The number of samples $l_0 n_c$ accounts for the initial transient period where the estimation error is relatively high. For the case of $\alpha_m=0$, where the frequency $\omega(k)$ is constant, the coherent correlation in (106) reduces to $$r_m^c(l) = \sum_{k=(l-1)n_c+1}^{l\,n_c} z_c(k)\exp(-jk\,\hat{\omega}_m); l = 1, 2, \ldots, m_c \quad (108)$$

In (108), $\hat{\omega}_m$ denotes the estimate of the normalized frequency in radians based on the processing of $n_s$ samples. In this case, $l_0$ in (107) may be set to 0. In the ideal case of small frequency error and relatively small noise variance, the correlation in (107) is nearly equal to $r_m$ given by $$r_m = \{A_m^2 + 2\sigma_n^2/n_c\}^{1/2} \cong A_m \quad (109)$$

In the correlation detector, $r_m^i$ computed from (107) is compared to a correlation threshold $\gamma_m^{th}$ which may be equal to some fraction of an estimate of $A_m$. If $r_m^i$ is greater than or equal to the threshold, the estimate is deemed to converge to some small error. If all the N frequency estimates do not satisfy the threshold conditions, the AKF algorithm described in equations (74) to (103) is repeated for the same initial $n_s$ samples but with different random frequency initializations, wherein the initializations for those frequencies which satisfy the threshold conditions are set equal to their estimates obtained in the first run. The frequencies for which the threshold condition is not satisfied are initialized randomly over some appropriate interval; for example, over the interval (−B/4, B/4). In the absence of estimates of the individual $A_m$, the threshold may be applied to the total power estimated as $$P_T = \sum_{m=1}^{N} (r_n^i)^2 \quad (110)$$

The power estimated in (110) is compared with some fraction of its prior estimate $P_{th}$ which may, for example, be obtained as $$P_{th} \cong \frac{1}{n_s} \sum_{i=1}^{n_s} |z_c|^2 - 2\sigma_n^2 \quad (111)$$

If $P_T > \delta P_{th}$ for some selected value of $\delta$ with $0 < \delta \le 1$, then the first part of the estimation procedure may be complete. Otherwise, the AKF algorithm in equations (74) to (103) may be repeated for the same initial $n_s$ samples but with different random frequency initializations until either the threshold condition is satisfied or the number of trials exceed some specified threshold $N_r$. A higher value of $\delta$ may in general require a higher number of trials.

Once the threshold condition is satisfied, each of the N frequencies is tracked by further processing of the measurements. In this phase of the algorithm, the second set of $n_s$ complex measurements is shifted in frequency by the estimate $\hat{\omega}_m(n_s)$ for the $m^{th}$ normalized frequency $\omega_m(n_s)$ obtained at the end of the first phase according to equation (112).

$$z_{c,m}(k) = z_c(k)\exp(-jk\hat{\omega}_m(n_s)); k=n_s+1, \ldots, 2n_s \quad (112)$$

The AKF algorithm processes the $n_s$ samples of the measurements $z_{cm}(k)$ to obtain the estimates of the frequency $(\omega_m(k) - \hat{\omega}_m(n_s)), k=n_s+1, \ldots, 2n_s$. In processing the second set of $n_s$ measurements, the parameter error covariance matrix $P_p(k/k-1)$ may be increased by an appropriate value so as to increase the convergence rate. The estimates of the frequencies $(\omega_m(k) - \hat{\omega}_m(n_s))$ thus obtained are adjusted by $\hat{\omega}_m(n_s)$ to account for the frequency shift providing the estimates for the frequency $\hat{\omega}_m(k), k=n_s+1, \ldots, 2n_s$. This procedure of shifting the frequency of the complex signal by the frequency estimate obtained at the end of the previous segment and applying the AKF to process the current segment and modifying the resulting estimates by the amount of frequency shift is repeated for the remaining $m_s-2$ segments. A further improvement in the estimates may be obtained by reprocessing all of the $m_s$ segments $N_r-1$ times in a manner similar to the processing of the $m_s-1$ segments in the first run where $N_r$ denotes the total number of runs with $N_r \ge 1$. For the case of time-varying frequency, the amount of frequency shift at the start of the second and consecutive runs needs to be appropriately adjusted.

In case of multiple frequencies, the signal $z_c(k)$ may be segmented after the initial phase into M signals by the use of a polyphase filter or using FFT as in (94)-(96) such that the number of frequencies in any one segment is small and the dimension of the state vector $x(k)$ in the AKF-MF is relatively small for processing any one segment.

Figure 26:
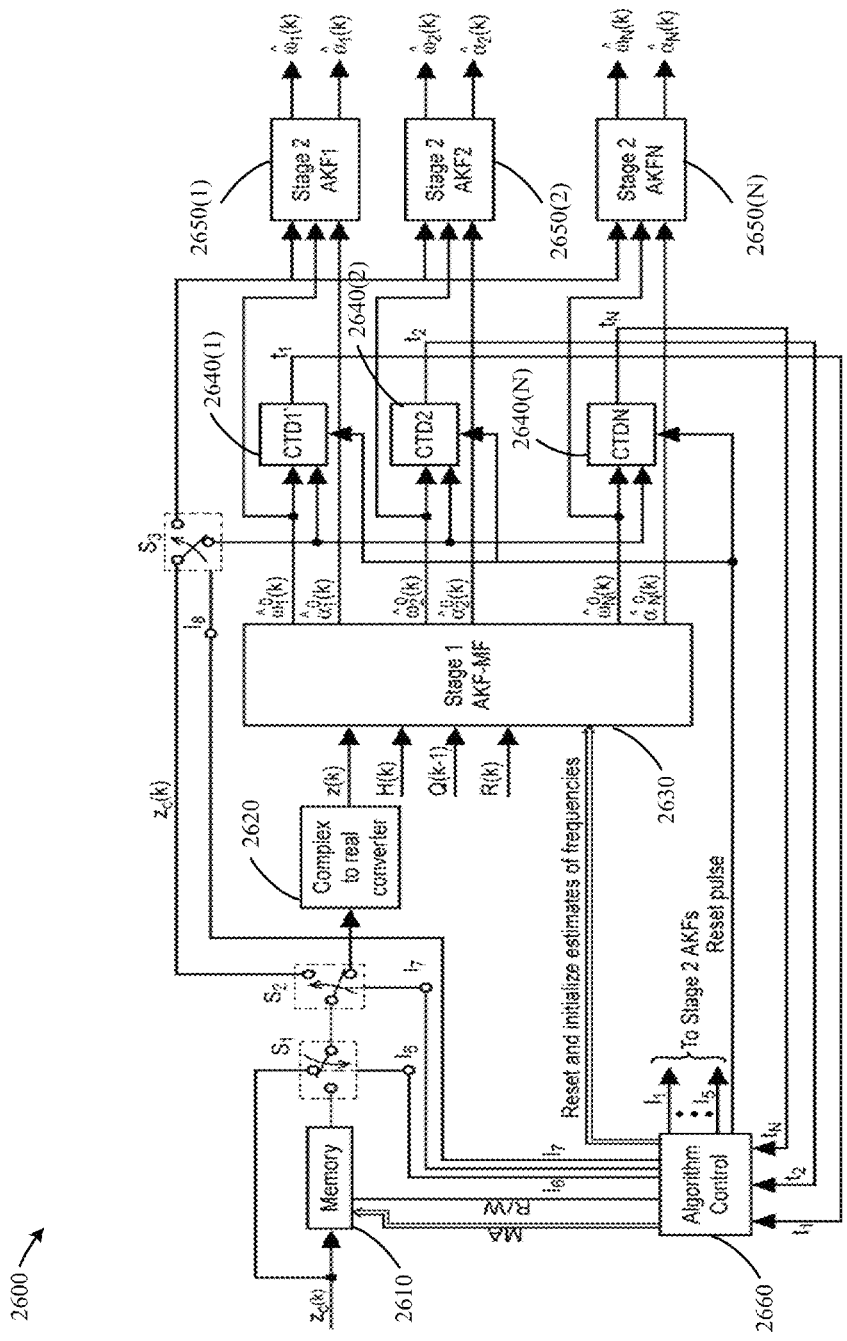
FIG. 26 is a block diagram illustrating an example architecture for providing signal parameter estimation using correlation detection, in accordance with embodiments of the disclosure.

FIG. 26 is a block diagram illustrating another embodiment of the disclosure architecture 2600, where a correlation detection is performed to assess if the estimated frequency is close to the true frequency as described in (104)-(111). If the correlation threshold condition is not satisfied, the input signal may be processed again starting with a new initial estimate for the frequency. The input signal may be stored in a memory 2610 so that if required the measurements can be reprocessed. When the number of available samples is not highly restricted, the storage of the input samples is not necessary, because the iterations can be performed with real time input samples. The architecture 2600 may include a switch $S_1$, depending upon the state of the control signal $I_6$, that permits processing of either the real time input data or that from the memory. Switch $S_2$, depending upon the state of the control signal $I_7$, may route the complex signal $z_c(k)$ to either a first stage AKF-MF 2630 via a complex to real converter 2620 or to second stage processing. Switch $S_3$, depending upon the state of the control signal $I_8$, may route the complex signal $z_c(k)$ to either a bank of correlation detectors CTD1, ..., CTDN 2640(1)-(N) (collectively referred to herein as 2640) or to the bank of stage 2 adaptive Kalman filters AKF1, ..., AKFN 2650(1)-(N) (collectively referred to herein as 2650).

The architecture 2600 may further include an algorithm control block 2660 that may be configured to generate various control signals including the R/W (read/write) command to the memory 2610 and an MA (memory address) when needed. The number of available input signal samples $N_s$ may be divided into $m_s$ segment each of length $n_s$. During the first interval of $n_sT_s$ seconds, the complex input $z_c(k)$ is connected to the complex to real converter that outputs a dimension 2 vector $z(k)$ with its elements equal to the real and imaginary parts respectively of the signal $z_c(k)$. The signal $z(k)$ is input to the first stage AKF-MF 2630 that processes the n samples of the signal $z(k)$ to provide the estimates of various frequencies $\hat{\omega}_m(k)$ and frequency derivatives $\hat{\alpha}_m(k)$ for $m=1, 2, \ldots, N$. The operation of the AKF-MF block 2630 has been previously described with reference to FIG. 21.

Still referring to FIG. 26, the estimate of the $m^{th}$ frequency $\hat{\omega}_m(k)$ and its derivative $\hat{\alpha}_m(k)$ may be provided to the correlation threshold detector CTDm block 2640 for $m=1, 2, \ldots, N$. The CTDm block 2640 may compute the correlation $r_m^i$ between the input signal and the complex exponential signal at frequency $\hat{\omega}_m(k)$ according to (104)-(108) and may compare the correlation with a predetermined threshold and further generate a signal $t_m$ that is indicative of the comparison at the output. The signal $t_m$ may be equal to 1 if the threshold condition is satisfied; otherwise it may be equal to 0. The signals $t_1, t_2, \ldots, t_N$ may, therefore, be provided to the algorithm control block 2660. If any of the $t_m$ values are equal to 0, the procedure is repeated with the stored $n_s$ samples read from the memory 2610 and with the initial frequency estimates provided to the first stage AKF-MF 2630 selected in a random and independent manner from a selected distribution. For example, the initial frequency estimates may be selected from (−B/2 B/2) with a uniform distribution. For the frequencies for which the threshold condition is satisfied, the initial frequency estimates may be made equal to the corresponding estimates obtained from the preceding run. This process of reading the $n_s$ samples from the memory, processing them by the first stage AKF-MF 2630, evaluating correlations and comparing the correlation values with the thresholds in blocks CTD1, ..., CTDN 2640 may be repeated until all $t_m$ values are equal to 1 or the number of such trials exceeds some specified value $N_t$ which may, for example, be equal to 4. In an alternative embodiment, instead of applying thresholds to individual correlation values, the threshold may be applied to the sum of the squares of the individual correlation values evaluated in (110), and the threshold may be some fraction of the total power $P_T$ which may be either known or estimated from the measurements as in (111). At the completion of the first process of the algorithm as described herein, the measurements may be processed by second stage AKFs 2650.

Figure 27:
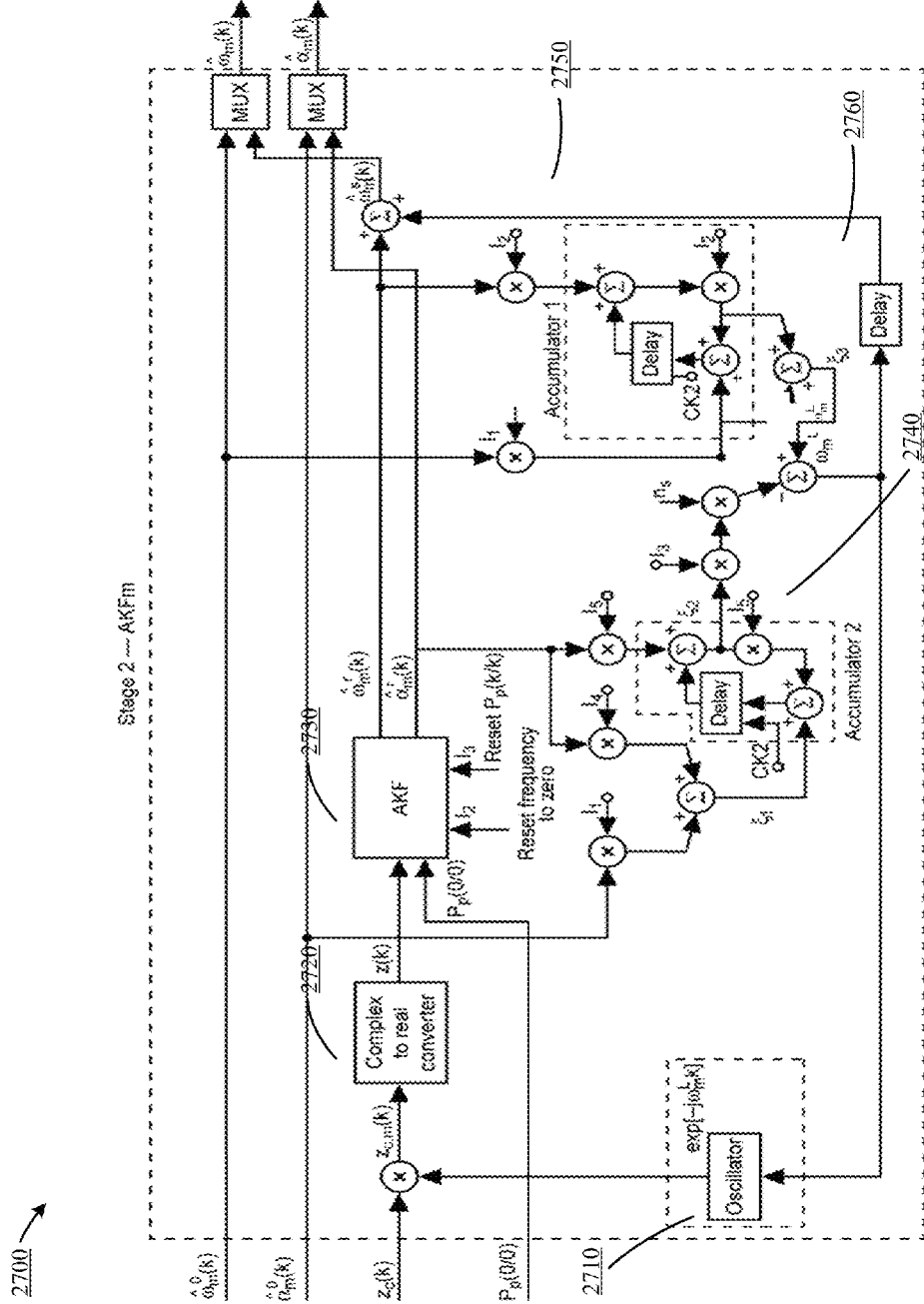
FIG. 27 is a block diagram illustrating an example second stage adaptive Kalman filter as included in the example architecture of FIG. 26, in accordance with embodiments of the disclosure.

The samples of the input complex signal $z_c(k)$ are inputted to a bank of stage 2 AKF1 to AKFN 2650 through the activation of switches $S_1$, $S_2$, and $S_3$ starting with the second segment of $n_s$ samples in the first run of the second stage. Referring now to FIG. 27, a block diagram of an example AKFm 2700 is illustrated and discussed. They AKFm 2700 may be used as the second stage AKFs 2650 of FIG. 26. The input complex signal $z_c(k)$ may be multiplied by the output exp $[j\omega_m^L k]$ of an oscillator with frequency $\omega_m^L$. The product of the complex input and the oscillator output, $z_{cm}(k)$ may be connected to a complex to real converter 2720 that may output a dimension 2 vector $z(k)$ with its elements equal to the real and imaginary parts respectively of the signal $z_{cm}(k)$. The signal $z(k)$ is input to an AKF 2730 that processes the $n_s$ samples of the signal $z(k)$ to provide estimates of various frequencies $\hat{\omega}_m^r(k)$ and frequency derivatives $\hat{\alpha}_m^r(k)$ for $m=1, 2, \ldots, N$ where $\hat{\omega}_m^r(k)$ is the estimate of the difference between the frequency $\omega_m(k)$ and the oscillator frequency $\omega_m^L$ that may be adjusted at the end of $n_sT_s$ second intervals. During the first run, $i_r=1$, of the second stage, the oscillator frequency may be set equal to the estimate of the frequency $\omega_m(k)$ for $k=n_s, 2n_s, \ldots, (m_s-1)n_s$ where $m_s$ is the number of segments. In the second and subsequent runs of step 2, $i_r>1$, and for the case when $\omega_m(k)$ is constant over the period of $N_s$ samples, the oscillator frequency at the beginning of the first segment is set equal to the estimate of $\omega_m$ obtained at the end of the previous run. The signals $I_1$ to $I_5$, starting with initial values of zero, may change at the end of $n_sT_s$ second intervals by the clock signal CK2 (not shown) that may be incorporated in the algorithm control block 2660 of FIG. 26. In one non-limiting example, $I_1=1$ if $k=n_s$ and $i_r=1$, and $\omega_m^L$ is set equal to the estimate of frequency $\hat{\omega}_m^0(k)$ obtained from the stage 1 AKF-MF at the end of processing by the stage 1 AKF-MF as the output of the offset due to nonzero $\alpha_m$ is zero. As a result, the outputs of the delay blocks in accumulators 1 and 2 of FIG. 27 are equal to 0, and thus $\omega_m^L=\hat{\omega}_m^0$. The signal $I_2$ is equal to 1 if either $k=i_sn_s$, $i_s>1$ or $i_r>1$ otherwise $I_2=0$.

When $I_2=1$, the frequency estimate $\hat{\omega}_m^r(k)$ may be added on to the previous value of $\omega_m^L$ providing an updated value for $\omega_m^L$. Thus $\omega_m^L$ may be set to $\hat{\omega}_m^0(k)$ in the first run at $k=n_s$ and from there on it may be modified by $\hat{\omega}_m^r(k)$ at intervals of $n_sT_s$ seconds. The sum of $\hat{\omega}_m^r(k)$ and $\omega_m^L$ at the end of a previous $n_s$ length segment provides the frequency estimates during any run and any segment. These estimates are time multiplexed with the estimates $\hat{\omega}_m^0(k)$ from stage 1 in MUX1 controlled by the algorithm control block details, which are not shown. Thus if $n_r=1$, then the first segment final estimates are obtained from $\hat{\omega}_m^0(k)$ with the final estimates for the subsequent segments provided by the second stage. On the other hand, if $n_r>1$, then all of the final estimates come from stage 2.

$I_4$ may be equal to 1 if $k=n_s$ and $i_r>1$. Thus the signal $\xi_1$ may be equal to $\hat{\alpha}_m^0(k)$ if $k=n_s$ and $i_r=1$; equal to $\hat{\alpha}_m^r(k)$ if $k=n_s$ and $i_r>1$; and equal to 0 otherwise. An accumulator 2 2740 output may be set equal to $\xi_1$ at $k=n_s$ for any value of $i_r$. The signal $I_5$ is equal to 1 if $k=i_ns_s$, $i_s>1$. If $I_5=1$, the value $\hat{\alpha}_m^r(k)$ is added to the accumulated output. The signal $I_3$ is equal to 1 if $k=N_s$ and is 0 otherwise. At the end of $N_s$ samples, an accumulator 2740 output $\xi_2$ is the sum of the derivatives during the $m_s$ segments wherein it is assumed that during each segment the derivative is nearly constant. The accumulator 2750 output $\xi_2$ times $n_s$ is subtracted from $\xi_3$ to provide the oscillator frequency such that the oscillator frequency is nearly equal to the input signal frequency at the beginning of $n_s$ sample segments. The initial frequency estimate for the AKF 2730 is reset to 0 at the end of each $n_s$ sample segment in each run, and the covariance matrix $P(0/0)$ is reset to some specified value at the start of each run.

Figure 28:
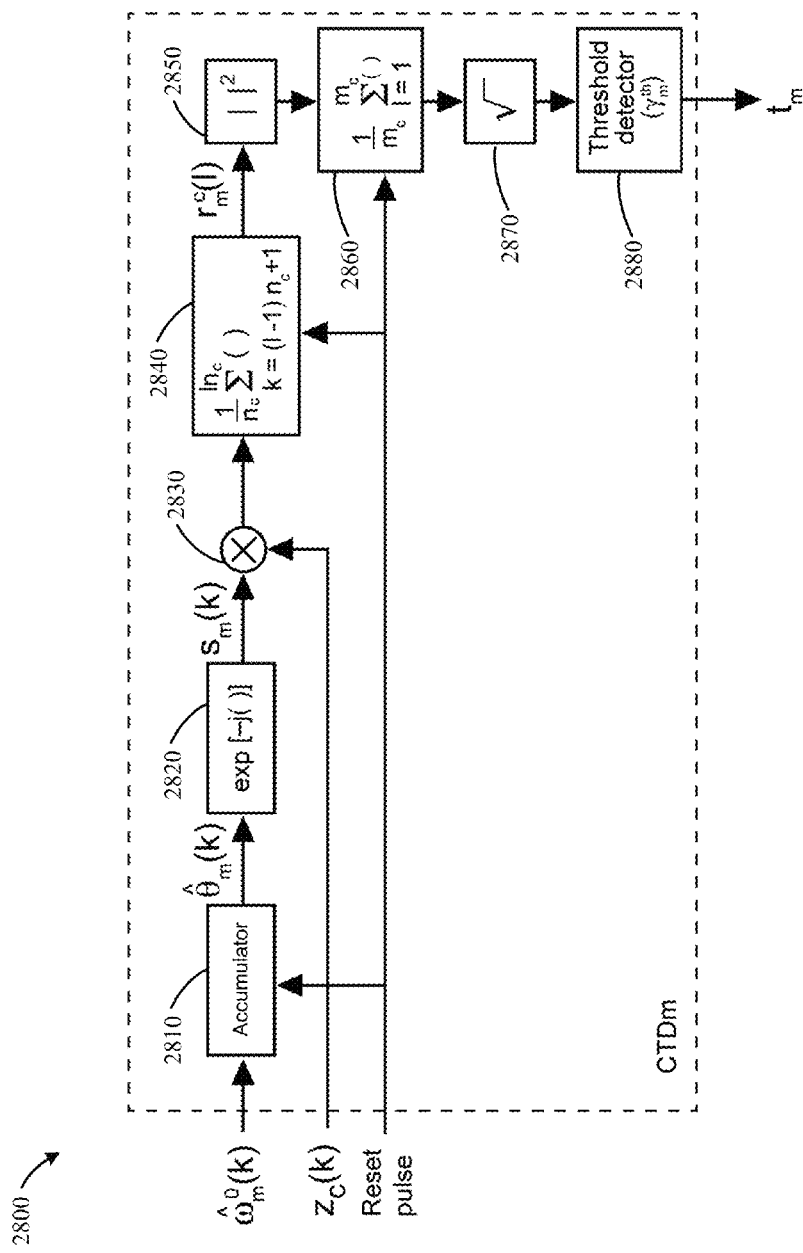
FIG. 28 is a block diagram illustrating an example correlation threshold detector as included in the example architecture of FIG. 26, in accordance with embodiments of the disclosure.

FIG. 28 illustrates an example block diagram of the correlation threshold detector CTD m 2800. The CTD m 2800 may be used as the CTD m 2640 of FIG. 26. The time-varying frequency estimates $\hat{\omega}_m^0(k)$ obtained during the last trial of the first stage may be input to an accumulator 2810. The output of the accumulator $\hat{\theta}_m(k)$ representing the phase estimate may be input to an exp( ) block 2820 that may generate the complex exponential signal $s_m(k)=\exp[-j\hat{\theta}_m(k)]$ at the output. The signal $s(k)$ may be multiplied by the input complex signal $z_c(k)$ in a multiplier 2830. The output of the multiplier 2830 may be averaged over an interval of $n_c$ samples where $n_c$ is a subinteger multiple of $n_s$ with $n_s = m_c n_c$ and with $m_c$ equal to an integer that may be equal to 1. The output of an averaging block 2840 may be equal to the coherent correlation $r_m^c(l)$ over the $l^{th}$ interval of $n_c$ samples according to (106). The coherent correlation may be provided to a cascade of an absolute value squared block 2850, an averaging block 2860, and a square root computation block 2870, providing the semi-coherent correlation $r_m^i$ over the interval of $n_s$ samples according to (107). The semi-coherent correlation $r_m^i$ may be input to a threshold detector block 2880 that may compare the input against a threshold value $\gamma_m^{th}$. If the input to the threshold detector block 2880 exceeds the threshold $r_m^{th}$, then the output $t_m$ of the threshold detector block 2880 may be equal to 1. Otherwise, the output $t_m$ of the threshold detector block 2880 may be equal to 0. The output $t_m$ may be provided to the algorithm control block 2660 of FIG. 26, which may determine the actions to be performed by the AFK-CD architecture 2600 based on the value of $t_m$.

Simulation Results

FIGS. 29-33 show example plots of simulation results for the performance of the AKF-CD algorithm for the case of a single frequency with the signal-to-noise ratio of 10 dB. The total number of samples for this non-limiting example is 10. Both $n_s$ and $n_c$ are equal to 1. In the first phase, the value of $N_t$ denoting the number of maximum trials is 6. The frequency is selected randomly with a uniform probability density function (pdf) in the interval (−200, 200) Hz with the sampling rate $F_s$ equal to 400 Hz.

The amplitude A is equal to 1 volt. The correlation threshold $\gamma_m^{th}$ in the first phase of the algorithm is 0.5. In the first trial of the first phase of the algorithm, the initial frequency estimate is selected to be 0 Hz; in the subsequent trials, the initial estimate is made randomly with a uniform pdf in the range (−40, 40 Hz). The initial covariance matrices are selected as $P(0/0)=2\ I_2$ and $P_p(0/0)=2\ I_2$ with $I_2$ equal to the 2×2 identity matrix. At the end of the first phase of the algorithm, the $P_p(0/0)$ is reset to $P_p(0/0)=0.05\ I_2$ to speed up the convergence rate of the AKF. After that, it is updated according to AKF update equation (26).

Figure 29:
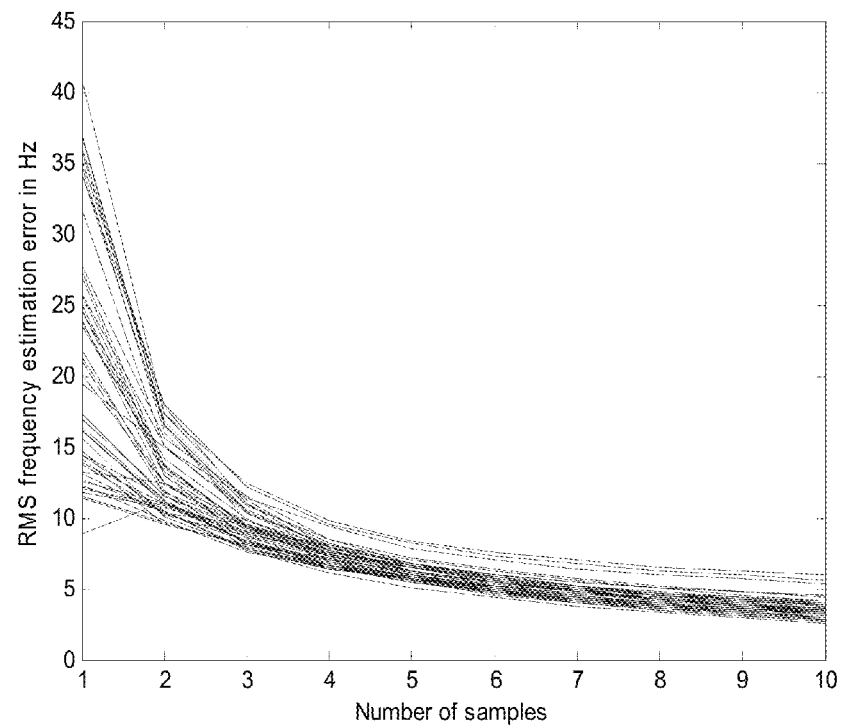
FIG. 29 shows a plot of example simulation results derived from the architecture of FIG. 26, in accordance with embodiments of the disclosure.
Figure 30:
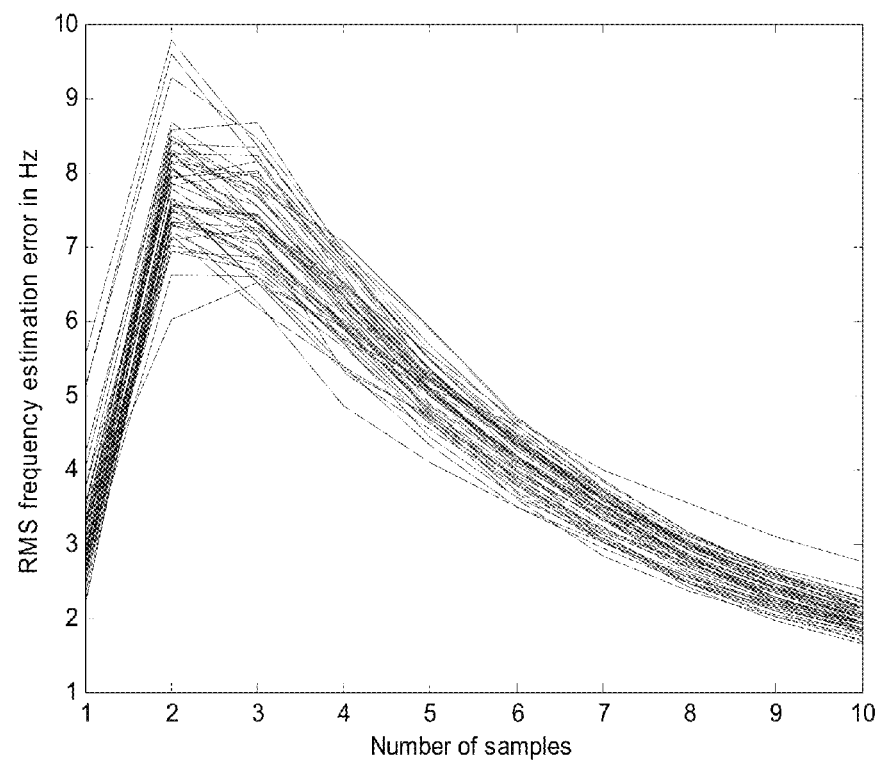
FIG. 30 shows a plot of example simulation results derived from the architecture of FIG. 26, in accordance with embodiments of the disclosure.
Figure 31:
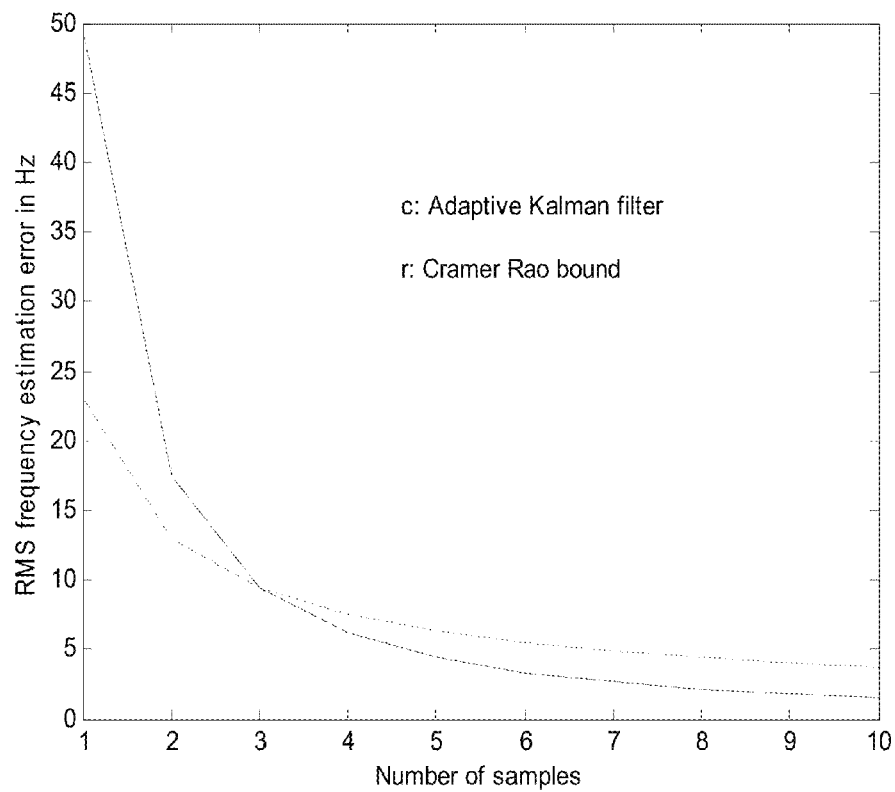
FIG. 31 shows a plot of example simulation results derived from the architecture of FIG. 26, in accordance with embodiments of the disclosure.
Figure 32:
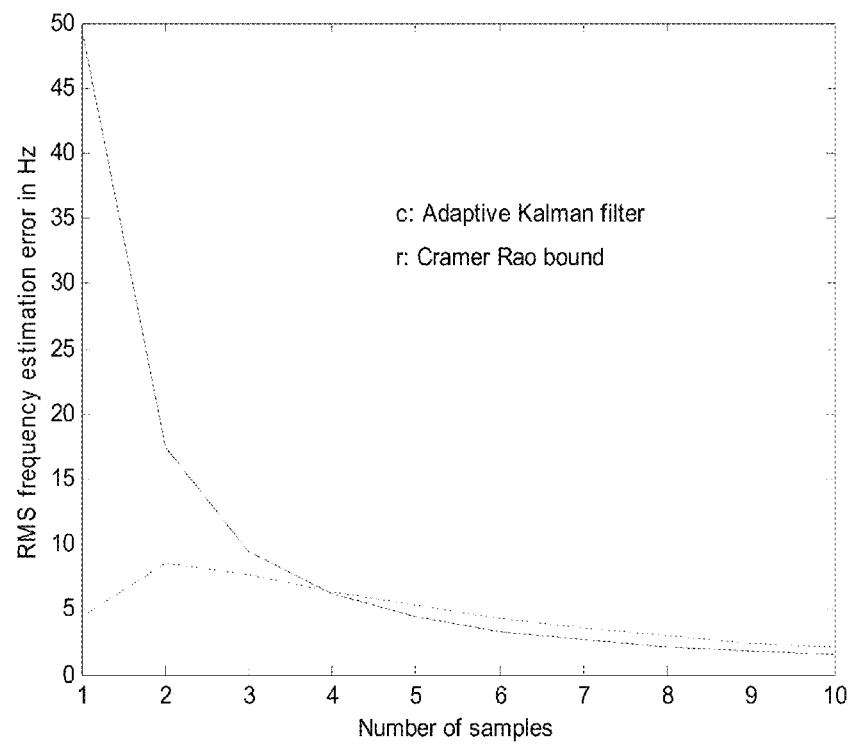
FIG. 32 shows a plot of example simulation results derived from the architecture of FIG. 26, in accordance with embodiments of the disclosure.
Figure 33:
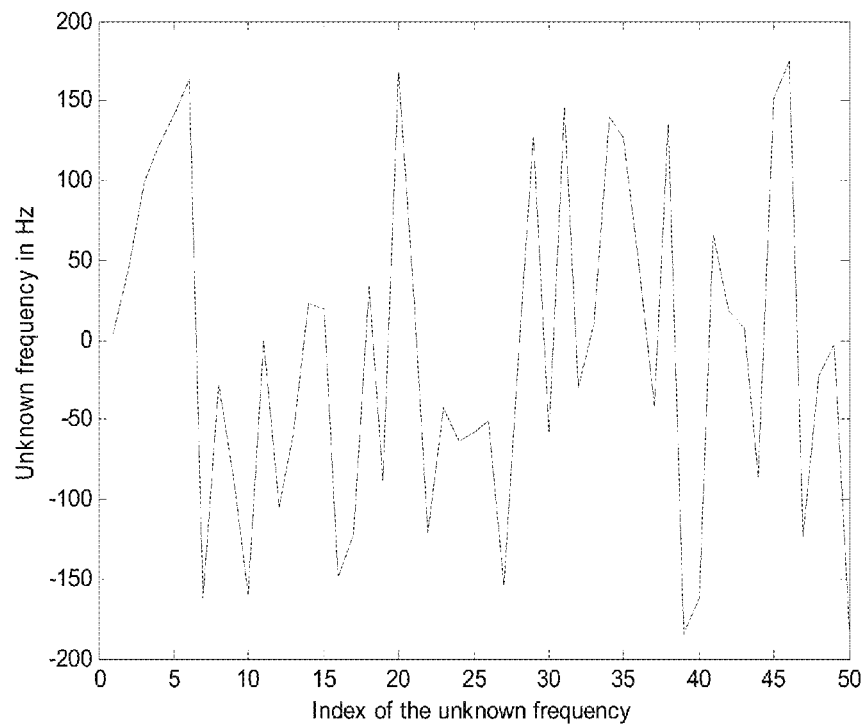
FIG. 33 shows a plot of example simulation results derived from the architecture of FIG. 26, in accordance with embodiments of the disclosure.
Figure 34:
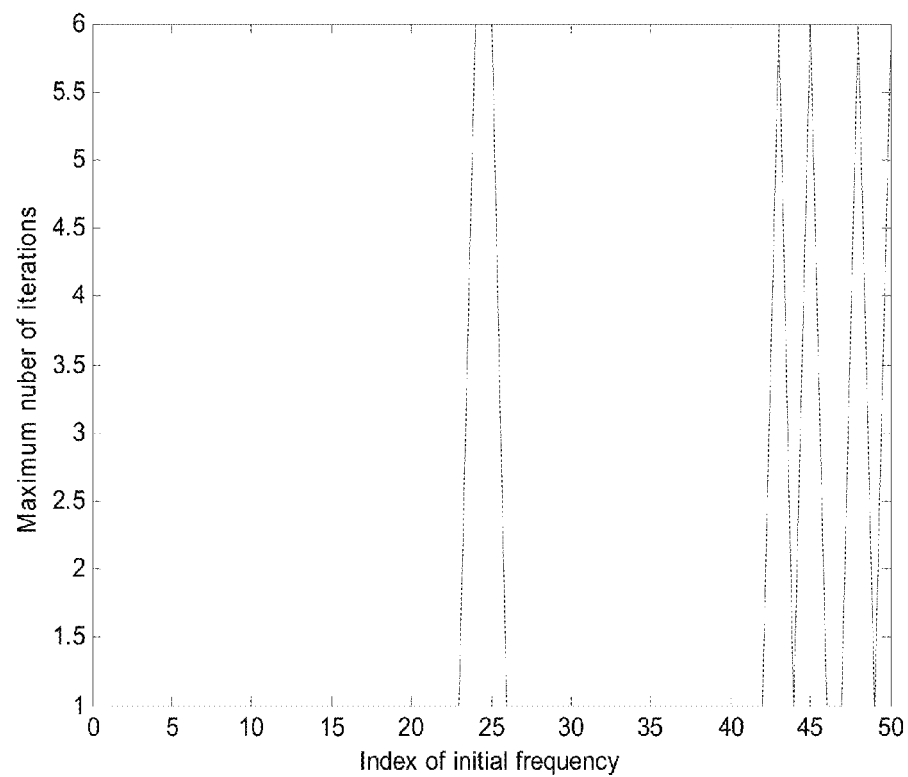
FIG. 34 shows a plot of example simulation results derived from the architecture of FIG. 26, in accordance with embodiments of the disclosure.

The simulations were performed with 50 random frequency selections from the range of (−200, 200) Hz according to the uniform probability density function (pdf). For each such frequency selection, the algorithm was simulated with 100 independent noise sequences. FIG. 29 shows the RMS frequency error in Hz obtained during the last trial of the first phase of the algorithm for each of the 50 frequency selections. FIG. 30 plots the result when the AKF algorithm is repeated a second time after frequency shift according to (112). As may be inferred from these figures, for each frequency selection, the AKF-CD algorithm converges to a relatively small frequency estimation error. FIGS. 31 and 32 plot the RMS error obtained by averaging the errors obtained in the 50 frequency selections. The results are also compared with the C-R bound given by (49a) for the same signal-to-noise ratio and the maximum frequency B=200 Hz. As may be seen from FIG. 33, the difference between the AKF-CD algorithm and the C-R bound is small. It may be emphasized that the initial frequency estimates in FIGS. 31 and 32 are based on the complete data of 10 samples and, thus, it is the final error at the end of 10 samples that is more meaningful in terms of the comparison with the C-R bound. FIG. 33 shows the 50 frequencies that were selected in the simulations. FIG. 34 shows the number of maximum trials in the first phase of the algorithm for each of the 50 selected frequencies showing that only 6 out of the 50 frequency selections required retrials for some noise sequences.

Figure 35:
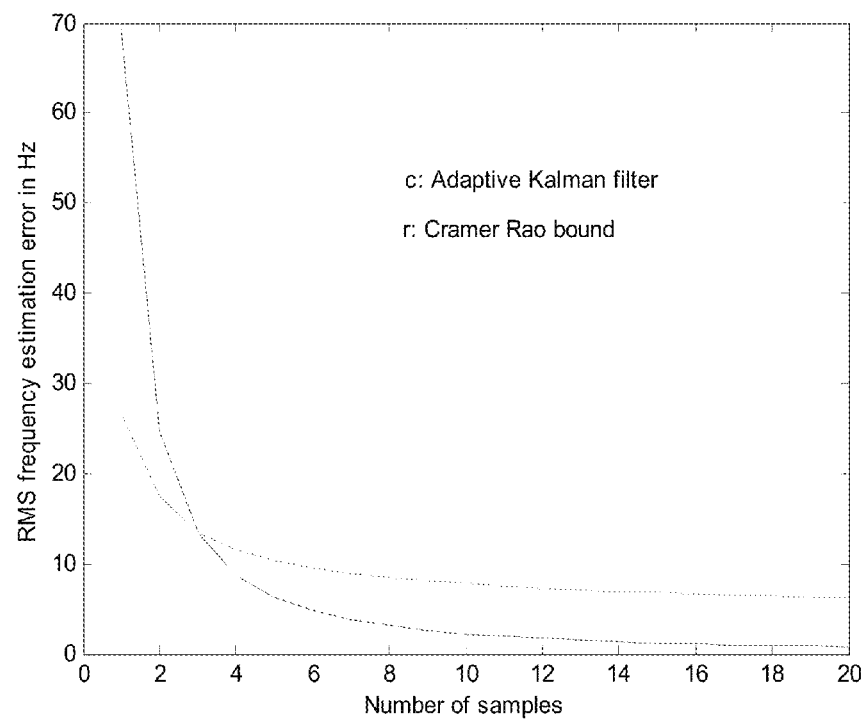
FIG. 35 shows a plot of example simulation results derived from the architecture of FIG. 26, in accordance with embodiments of the disclosure.
Figure 36:
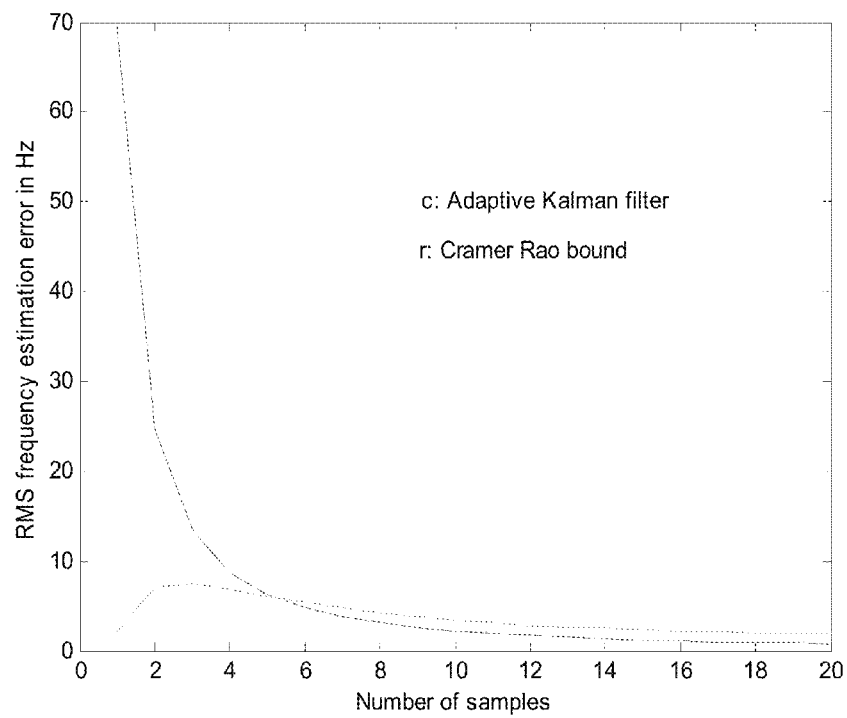
FIG. 36 shows a plot of example simulation results derived from the architecture of FIG. 26, in accordance with embodiments of the disclosure.

FIGS. 35 and 36 plot the RMS frequency error averaged over all 50 initial frequency selections for the case of SNR=7 dB and the frequencies selected from the range of (−100, 100) Hz with $N_s=20$ samples. All of the algorithm parameters are the same as those for the 10 dB SNR case with $n_s=n_c=10$ and $\gamma_m^{th}=0.4$.

Figure 37:
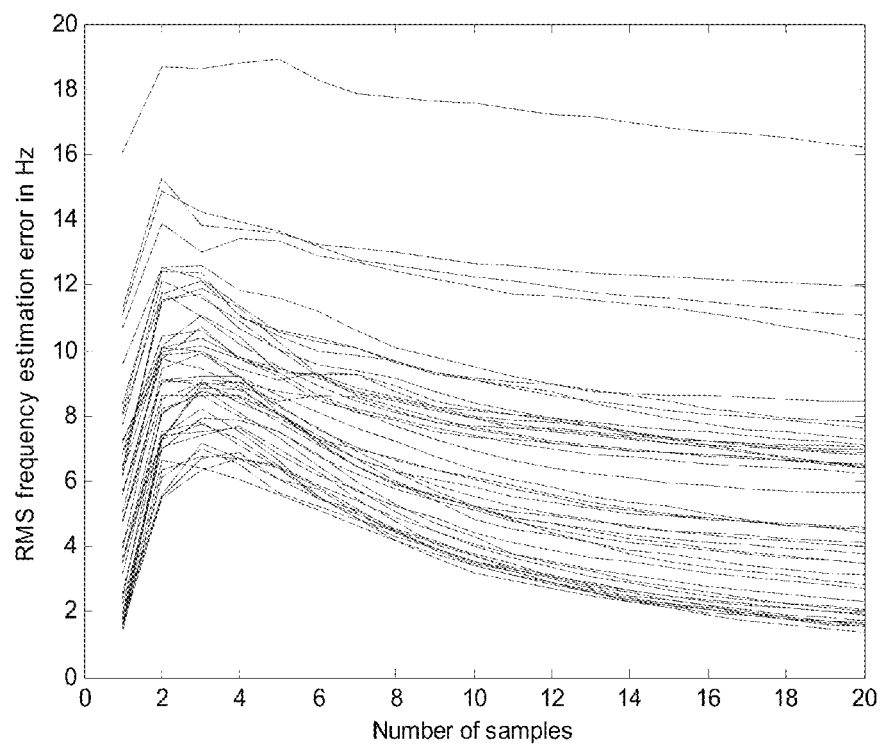
FIG. 37 shows a plot of example simulation results derived from the architecture of FIG. 26, in accordance with embodiments of the disclosure.
Figure 38:
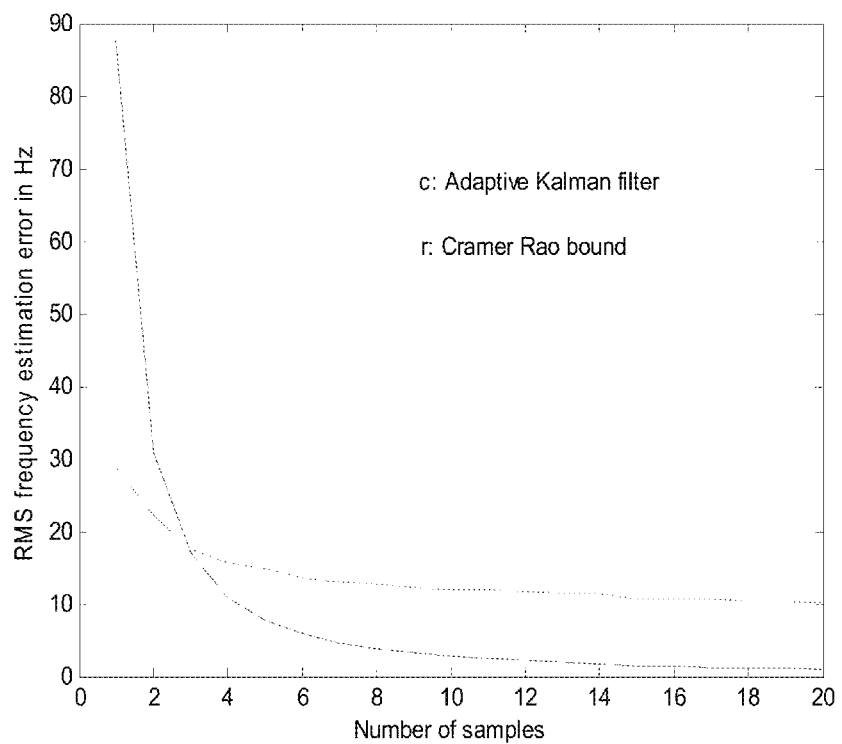
FIG. 38 shows a plot of example simulation results derived from the architecture of FIG. 26, in accordance with embodiments of the disclosure.

FIG. 37 shows the RMS frequency error in Hz obtained during the second run of the algorithm for each of the 50 frequency selections for the case of SNR=5 dB and the frequencies selected from the range of (−100, 100) Hz with $N_s=20$ samples. All of the algorithm parameters are the same as those for the 7 dB SNR case for the first run. The RMS error for most of the 50 cases lies between 2 Hz and 8 Hz. FIG. 38 plots the RMS frequency error averaged over all 50 initial frequency selections for the case of SNR=5 dB. The result for the second run (not shown) is similar. In this case, although the error in absolute terms is relatively small, there is a considerable difference between the estimation error obtained by the AKF-CD algorithm and the C-R bound. Further embodiments of the disclosure teach the AKF-FFT-CD algorithm which provides estimation errors close to the C-R bound for an SNR even smaller than 0 dB.

Frequency Estimation for Very Low Signal-to-Noise Ratio Conditions

For relatively very low signal-to-noise ratio conditions, the Kalman filter based frequency estimation algorithm may not converge to the correct frequency. Instead it may converge to a frequency with an estimation error in the range of $-F_s/2$ to $F_s/2$ with some non-zero probability, i.e., the algorithm may diverge. Thus the algorithm converges to the correct frequency for some noise sequence and the initial estimate, while for some other noise sequence and/or initial frequency estimates, it may converge to an estimate with a relatively large error with some non-zero probability. Moreover, the smaller the signal-to-noise ratio, the relatively higher is the probability of divergence. For this case, another embodiment of the disclosure is presented that provides good convergence even under very low signal-to-noise ratio conditions.

FFT-AKF-CD Algorithm

In this embodiment of the disclosure, the range of frequency uncertainty $F_s=2B$ is divided into M intervals of length $\Delta f = F_s/M$. The integer M is selected such that the ratio $M\gamma = MA^2/(2\sigma_n^2)$, with $\gamma = A^2/(2\sigma_n^2)$ denoting the SNR, is higher than some specified threshold value $\gamma_{th}$ and $(N_s/M)$ is an integer. For example, with $\gamma=0.25$ and $\gamma_{th}=5$, M=20, let $z_c(k)$ denote the complex valued signal as $$z_c(k) = z_i(k) + jz_q(k); j = \sqrt{-1} \quad (113)$$

The signal $z_c(k)$ is correlated with complex exponential functions of frequency $f_m = -B + m\Delta f$; m=0, 1, ..., M−1 over an interval of $M = F_s/\Delta f$ samples providing the correlation values $$r_m(0) = \frac{1}{M}\sum_{i=1}^{M} z_c(i)\exp(-j2\pi f_m i T_s); \quad (114)$$

$$f_m = -B + m\Delta f; m = 0, 1, \ldots, M-1$$

The expression in (114) can also be evaluated in terms of the discrete Fourier transform (DFT) or the fast Fourier transform (FFT) by substituting the expression for $f_m$ in the expression for $r_m(0)$. Thus $$r_m(0) = \frac{1}{M}\sum_{i=1}^{M} z_c(i)\exp(j2\pi BiT_s)\exp(-j2\pi im\Delta fT_s) \qquad (115)$$

$$= \frac{1}{M}\sum_{i=1}^{M} z_c(i)(-1)^i \exp(-j2\pi m/M)\exp[-j2\pi(i-1)m/M]; m = 0, 1, \ldots, M-1$$

From (115), the correlation value $r_m(0)$ may be expressed as $$r_m(0) = \frac{1}{M}\exp(-j2\pi m/M)z_{0f}(m) \qquad (116)$$

where $z_{0f}(f)$ is the discrete Fourier transform of $z_m(i)$ given by $$z_{0f}(m) = \sum_{i=0}^{M-1} z_m(i)\exp(-j2\pi im/M); \qquad (117)$$

$$z_m(i) = (-1)^{i+1}z(i+1); m = 0, 1, \ldots, M-1$$

In (117), the sequence $z_m(i)$ is obtained by multiplying the alternative elements of the sequence $z_c(i)$ by $-1$. The DFT of $z_m(i)$ in (117) can also be evaluated by the M-point fast Fourier transform of $z_m(i)$.

With $N_1 = N_s/M$, the correlation values are evaluated over the subsequent $(N_I-1)$ intervals by replacing the subsequence $[z(1)\ z(2), \ldots, z(M)]$ by the subsequence of $z(k)$ for the respective interval. The estimate of the average power present during the interval of N samples of $z_c(k)$ is obtained by averaging the absolute value squared $|r_m|^2$ over the $N_I$ intervals for $m=0, 1, \ldots, M-1$, i.e., $$P_m = \frac{1}{N_I}\sum_{i=0}^{N_I-1} |r_m(i)|^2 \qquad (118)$$

Substitution of $z_c(i)$ from (3), (4), and (113) in (115) yields $$r_m(0) = s_m(0) + n_m(0) \qquad (119)$$

where $$s_m(0) = \frac{1}{M}\sum_{i=1}^{M} Ae^{j\varphi}\exp(j2\pi f_{dm}iT_s); \qquad (120)$$

$$f_{dm} = f_0 - f_m; m = 0, 1, \ldots, M-1$$

Evaluation of the sum in (120) results in $$s_m(0) = \frac{Ae^{j\varphi}}{M}\exp[j(M+1)\pi f_{dm}T_s]\left[\frac{\sin[M\pi f_{dm}T_s]}{\sin(\pi f_{dm}T_s)}\right]; \qquad (121)$$

$$m = 0, 1, \ldots, M-1$$

For $-\Delta f \leq f_{dm} < \Delta f$, $\Delta f = 1/(MT_s)$ and $M \gg 1$, the absolute value of the expression in (121) may be approximated by $$|s_m(0)| \cong A\left|\frac{\sin(\pi f_{dm}/\Delta f)}{(\pi f_{dm}/\Delta f)}\right|; \qquad (122)$$

$$-\Delta f \leq f_{dm} < \Delta f; m = 0, 1, \ldots, M-1$$

For the case when $$f_{dm} = 2n\Delta f + f_{\delta m}; -\Delta f \leq f_{\delta m} < \Delta f; n \text{ an integer with} \qquad (123)$$
$$0 < |n| < M/4$$

The absolute value of $s_m(0)$ in (122) may be approximated as $$|s_m(0)| \cong A\left|\frac{\sin(\pi f_{\delta m}/\Delta f)}{M \sin(2\pi n/M)}\right| \qquad (124)$$

$$\cong \frac{\kappa A}{2\pi n}\left|\sin(\pi f_{\delta m}/\Delta f)\right|; -\Delta f \leq f_{\delta m} < \Delta f; 0 < |n| < \frac{M}{4}; m = 0, 1, \ldots, M-1$$

where $\kappa$ is a constant in the range of 1 and 2. The noise term $n_m(0)$ in (119) is given by $$n_m(0) = \frac{1}{M}\sum_{i=1}^{M} n(i)\exp(-j2\pi f_m iT_s); \qquad (125)$$

$$n(i) = n_i(i) + jn_q(i); j = \sqrt{-1}; m = 0, 1, \ldots, M-1$$

From (125) one obtains $$|n_m(0)|^2 = \qquad (126)$$

$$n_m(o)n_m^*(0) = \frac{1}{M^2}\sum_{i=1}^{M}|n(i)|^2 + \frac{2}{M^2}\sum_{i=1}^{M}\sum_{\substack{k=1,\\k>i}}^{M} Re\{n(i)n^*(k)\};$$

$$n(i) = n_i(i) + jn_q(i); j = \sqrt{-1}; m = 0, 1, \ldots, M-1$$

In (126), Re( ) denotes the operation of taking the real part of the argument. As the sequence $n(i)$ is zero mean and independent, it follows from (126) that $$E\{|n_m(0)|^2\} = \frac{2\sigma_n^2}{M^2}; m = 0, 1, \ldots, M-1 \qquad (127)$$

wherein equation (127) E denotes the expected value operator. From (125) it follows that $n_m(0)$ and $n_l(0)$ are uncorrelated and thus due to their Gaussian distribution are independent random variables as $$E[n_m(0)n_k^*(0)] = \frac{1}{M^2}\sum_{i=1}^{M} E[|n(i)|^2]\exp[j2\pi(f_k-f_m)iT_s]; \qquad (128)$$
$$m, k = 0, 1, \ldots, M-1$$

For $k \neq m$, the summation in (128) may be evaluated as $$E[n_m(0)n_k^*(0)] = \frac{2\sigma_n^2}{M^2}\sum_{i=1}^{M} \exp[j2\pi f_d iT_s]; f_d = f_k - f_m = (k-m)\Delta f \qquad (129)$$
$$= \frac{2\sigma_n^2}{M^2}\exp[j(M+1)\pi f_d T_s]\frac{\sin(\pi M f_d T_s)}{\sin(\pi f_d T_s)}$$
$$= \frac{2\sigma_n^2}{M^2}\exp[j(M+1)\pi f_d T_s]\frac{\sin[\pi(k-m)]}{\sin[\pi(k-m)/M]}$$

The last term in (129) is zero as $|k-m| \leq M-1$ resulting in $$E[n_m(0)n_k^*(0)] = 0; k \neq m \qquad (130)$$

Taking the absolute value squared on both sides of (119) yields $$|r_m(0)|^2 = |s_m(0)|^2 + |n_m(0)|^2 + 2Re\{s_m^* n_m\}; m=0,1,\ldots,M-1 \qquad (131)$$

From (125) to (130), the expression in (131) may be expressed as $$|r_m(0)|^2 = |s_m(0)|^2 + \frac{2\sigma_n^2}{M} + \xi_m(0); m=0,1,\ldots,M-1 \qquad (132)$$

In (132) $\xi_m(0)$ for $m=0, 1, \ldots, M-1$ are zero mean independent random variables, and $s_m(0)$ is given by (122). The average power at frequency $f_m$ is estimated by $$P_m = \frac{1}{N_I}\sum_{i=0}^{N_I-1} |r_m(i)|^2 = |s_m(0)|^2 + \frac{2\sigma_n^2}{M} + \xi_{a,m}; \qquad (133)$$

$$\xi_{a,m} = \frac{1}{N_I}\sum_{i=0}^{N_I-1} \xi_m(i); m=0,1,\ldots,M-1$$

In (133), $\xi_{a,m}$ for $m=0, 1, \ldots, M-1$ are zero mean independent random variables with their variance decreasing inversely with increasing $N_I$. The unknown frequency $f_0$ may be estimated by maximization of $P_m$ over m. However, for the case of low SNR $\gamma$, and limited number of samples N and thus small $N_I$, $\xi_{a,m}$ has significant variance resulting in a significant probability of selecting an incorrect value of m and thus causing a relatively large frequency estimation error $f_0 - f_m$. Moreover, even when the value of m is correctly selected, there is an estimation error in the range of $-\Delta f/2$ and $-\Delta f/2$. From (133) the value of $|s_m(0)|^2$ may be only $A^2 \text{sinc}^2(0.5) = 0.4 A^2$ when $f_0$ is in the middle of any two of the frequencies $f_m$ resulting in about a 4 dB loss in signal power compared to the case when the frequency $f_0$ is equal to one of the frequencies $f_m$ where $f_m$ is given by (114). Therefore, the probability of selecting an incorrect frequency $f_m$ is much higher in the case when the unknown frequency falls in between the two frequencies $f_m$ compared to the latter case.

In order to minimize the probability of selecting an incorrect frequency $f_m$, a number $N_f$ of frequencies $\{f_0^s, f_1^s, \ldots, f_{N_f-1}^s\}$ are selected from the set of frequencies $\{f_0, f_1, \ldots, f_{M-1}\}$ defined in (114) with the highest average power $P_m$ defined in equation (133). The adaptive Kalman filter algorithm described in equations (12)-(36) is repeated $N_f$ times with the stored in-phase and quadrature observations $z_i(k)$ and $z_q(k)$ defined in equations (3) and (4) with the initial frequency estimates equal to the $f_m^s$, $m=0, 1, \ldots, N_f-1$ and with reduced initial prediction error covariance matrix $P_p(0/0)$ reduced by a factor of the order $M^2$. The initial covariance matrix is selected equal to $\epsilon I_2$ with $I_2$ denoting the 2×2 identity matrix. Thus $\epsilon$ is the variance of the error in the estimates $\cos[2\pi(f0+\delta f)Ts]$ and $\sin[2\pi(f0+\delta f)Ts]$ for the parameters $\beta_1$ and $\beta_2$ respectively, where $f_0$ denotes the true frequency and $\delta f$ denotes the error in the frequency estimate with its variance equal to $\sigma_f^2$. With the approximation $$\cos[2\pi(f_0+\delta f)Ts] - \cos(2\pi f_0 Ts) \approx -2\pi T_s \delta f \sin(2\pi f_0 Ts) \qquad (134)$$

the estimate for $\epsilon$ is given by $$\varepsilon = \frac{4\pi^2}{F_s^2}\sigma_f^2 E[\sin^2(2\pi f_0 T_s)] = \frac{2\pi^2}{F_s^2}\sigma_f^2 \qquad (135)$$

The second equality in (76) follows from the fact that the frequency $f_0$ itself may have any value in the interval $(-F_s/2, F_s/2)$ and thus the argument of the sin function may lie in the interval $(-\pi, \pi)$ resulting in the average for $\sin^2(\ )$ equal to 0.5. If the frequency error $\delta f$ can have any value in the interval $(-\Delta f/2, \Delta f/2)$, then $\sigma_f^2$ may be approximated by $\frac{1}{3}(\Delta f/2)^2 = (\Delta f)^2/12$. Substitution for $\sigma_f^2$ in (135) results in the estimate for $\epsilon$ equal to $\pi^2/(6M^2)$ or approximately $1/m^2$. For M=20, this estimate is equal to 0.0025. This is much smaller compared to the value for $P_p(0/0)=4 I_2$ used in the EKF without the FFT step. The estimate of the $\epsilon$ derived in (135) applies to that particular initial frequency estimate $f_m^s$ that is close to the true frequency $f_0$ with the error smaller than $\Delta f/2$ in its magnitude. The estimate for $P_p(0/0)$ is based on the initial knowledge and needs to be only approximate for the AKF to converge. Denoting by $f_m^K$, $m=0, 1, \ldots, N_f-1$ the final frequency estimates obtained by the AKF corresponding to the $N_f$ initial frequency estimates $f_m^s$, $m=0, 1, 2, \ldots, N_f-1$, an estimate of the power $P_m^K$ is obtained similar to that for the $P_m$ in equation (133). Thus, $$P_m^K = \frac{1}{N_I}\sum_{i=0}^{N_I-1} |r_m^K(i)|^2; m = 0, 1, \ldots, M-1 \qquad (136a)$$

$$r_m^K(i) = \frac{1}{M}\sum_{k=1}^{M} z_c[k+(i-1)M]\exp(-j2\pi k f_m^K T_s); \qquad (136b)$$

$$j = \sqrt{-1}; m = 0, 1, \ldots, N_f-1; i = 0, 1, \ldots, N_I-1$$

In the absence of any initial estimate of the received signal power level $A^2$, the frequency $f_m^K$ corresponding to the highest value of $P_m^K$ is selected for further processing. However, with some estimate of the signal power level $A^2$, detection is performed on the highest value of $P_m^K$ to eliminate the possibility that none of the frequencies $f_m^K$ are close to the true frequency $f_0$. The probability of this is a function of M, $N_I$, Nf, and the SNR $\gamma$ and may be indicated as the highest power out of the M values $P_m^K$ being relatively very small.

For the frequency $f_m^K$ close to $f_0$, the expected value of the corresponding power $P_m^K$ obtained from (136) or from the equations (121) and (133) with $f_{dm}$ in (121) equal to 0 will be close to $P_a = A^2 + 2\sigma_n^2/M$. The actual power level may have mean $P_a$ with an error with a variance that is a function of $N_1$ and $\gamma$. The actual power will exceed the value $P_a$ with a probability of 0.5. Thus a threshold value $P_T$ on the power level $P_m^K$ can determine whether or not the corresponding frequency $f_m^K$ is close to $f_m$. However, if $P_T$ is too high, one may miss detecting the correct frequency $f_m^K$ whereas lowering the threshold to a relatively small value may result in a false detection. As an example, with $A^2=1$, $\sigma_n^2=2.5$ corresponding to the SNR $\gamma=0.2$, and with M=20, one obtains $P_a=1.25$ and a threshold value of $P_T=0.8$ may be selected. If the highest value of $P_m^K$, m=0, 1, ..., M−1, does not exceed $P_T$, then the sum of the two highest powers $P_m^K$ is compared with the threshold $P_{T2}$. If the sum does exceed the threshold $P_{T2}$ and the corresponding two frequencies are within $\Delta f/2$ of each other, then the frequency with the highest power $P_m^K$ among the two frequencies is accepted as the correct intermediate estimate of the frequency $f_0$. Alternatively the average value of the two frequencies may be taken as the correct intermediate estimate of the frequency $f_0$. For the example with $P_a=1.25$, a value for $P_{T2}$ equal to 1 is selected. However, if none of the two threshold conditions are satisfied then the received sequence $z_c(k)$ is further processed as follows.

For a specified number of trials $N_r=2^\kappa$ for some integer $\kappa \geq 0$, the steps of correlating the received sampled signal $z_c(k)$ with the complex exponential signals with M frequencies $f_m = -B + m\Delta f$; m=0, 1, ..., M−1, selecting $N_f$ of these frequencies with the highest correlation values, running the AKF with each of these $N_f$ frequencies as the initial frequency estimates, correlating z(k) with the $N_f$ final frequency estimates provided by the AKF, and comparing the correlation values with the two thresholds, are repeated until the threshold on the correlation value is satisfied or the number of such runs exceeds $N_{r-1}$. In each such run, the M frequencies $f_m$ defined in (114) are offset by a different value of $\delta f$. The offset values of $\delta f$ in different runs are selected from the set of values $\{i \Delta f/N_r; i=1, 2, ..., N_r-1\}$. However, the sequence in which these offset values may be taken may not be in an increasing order. For example, with $N=2^\kappa$ for an integer $\kappa$, the values may be taken in the order $[2^{\kappa-1}, 2^{\kappa-2}\times(1, 3), ..., (1, 3, ..., N_r-1)]\Delta f/N_r$. For example with $N_r=8$, the order is [4, 2, 6, 1, 3, 5, 7]$\Delta f/8$ or $$\left[\frac{1}{2}, \frac{1}{4}, \frac{3}{4}, \frac{1}{8}, \frac{3}{8}, \frac{5}{8}, \frac{7}{8}\right]\Delta f.$$

The correlation $P_m^d$ between $z_c(k)$ and the complex exponential signals with M frequencies $f_m^d = -B + m\Delta f + \delta f$; m=0, 1, ..., M−1, can be obtained in terms of generalized FFT as for the case of $\delta f=0$.

$$P_m^d = \frac{1}{N_I}\sum_{i=0}^{N_I-1}|r_m^d(i)|^2; m = 0, 1, ..., M-1 \tag{137}$$

$$r_m^d(i) = \frac{1}{M}\exp(-j2\pi m/M)z_{if}^d(m) \tag{138}$$

$$z_{if}^d(m) = \sum_{k=1}^{M} z_c^d[k + (i-1)M]\exp(-j2\pi km/M); i = 0, 1, ..., N_I - 1 \tag{139}$$

$$z_c^d(k) = (-1)^{k+1}z_c(k+1)\exp[-j2\pi kl/(MN_r)];$$
$$\delta f = (l\Delta f/N_r); m = 0, 1, ..., M-1$$

In equation (139), $z_{if}^d(m)$ m=0, 1, ..., M−1, is the DFT of the $i^{th}$ segment of length M of the modified signal $z_c^d(k)$ obtained from $z_c(k)$ as shown in equation (139) and thus can be evaluated by an FFT algorithm.

Denoting by $f_I$ the estimate obtained by the combined FFT and EKF algorithms, a further refinement in the estimate is achieved by demodulating the signal $z_c(k)$ by the complex exponential signal at frequency $f_I$ which is equivalent to changing the frequency of the signal to $f_r = (f_0 - f_I)$, averaging the resulting signal over segments of length M, and processing the averaged signal by the AKF. Thus $$z_s(k) = z_c(k)\exp[-j2\pi k f_I/F_s]; k = 1, 2, ..., N_s \tag{140}$$

$$z_a(k) = \frac{1}{M}\sum_{i=1}^{M} z_s[i + (k-1)M]; k = 1, 2, ..., N_I - 1 \tag{141}$$

In (141), the signal $z_s(k)$ is averaged over M consecutive samples thus reducing the sampling rate to $F_{sa}=F_s/M$. This is in view of the fact that in the absence of a detection error, the frequency estimation error in $f_I$ is limited in magnitude to $\Delta f/2$ instead of $F_s/2$. Thus the sampling rate is reduced by a factor of $F_s/\Delta f=M$. The averaging process reduces the noise variance also by the factor M. However, the normalized frequency uncertainty $[(f_0-f_I)F_{sa}]$ lies in the range of $(-\pi, \pi)$ and therefore the initial covariance matrix P(0/0) may be set equal to $\epsilon_a I_2$ with $\epsilon_a = (\pi/3)^2 \cong 1$ assuming a Gaussian distribution for the initial frequency estimation error with 3σ value equal to π. In the AKF, the sampling time $T_s$ is replaced by $T_{sa}=MT_s$. The final estimate of the unknown frequency $f_0$ is given by $$\hat{f}_0 = f_I + \hat{f}_r \tag{142}$$

where $\hat{f}_r$ denotes the estimate of the frequency $f_r=(f_0-f_I)$ by the AKF. Finally accurate estimates of the amplitude A and phase $\phi$ are obtained by correlating $z_c(k)$ with the complex exponential function of frequency $\hat{f}_0$. Thus the estimates of the amplitude A denoted by $\hat{A}$ and that of $\phi$ denoted by $\hat{\phi}$, respectively, are given by $$\hat{A} = |r|; \hat{\phi} = \arg(r) \tag{143}$$

where $$r = \frac{1}{N_s}\sum_{k=1}^{N_s} z_c(k)\exp[-j2\pi k \hat{f}_0 T_s] \tag{144}$$

Figure 39:
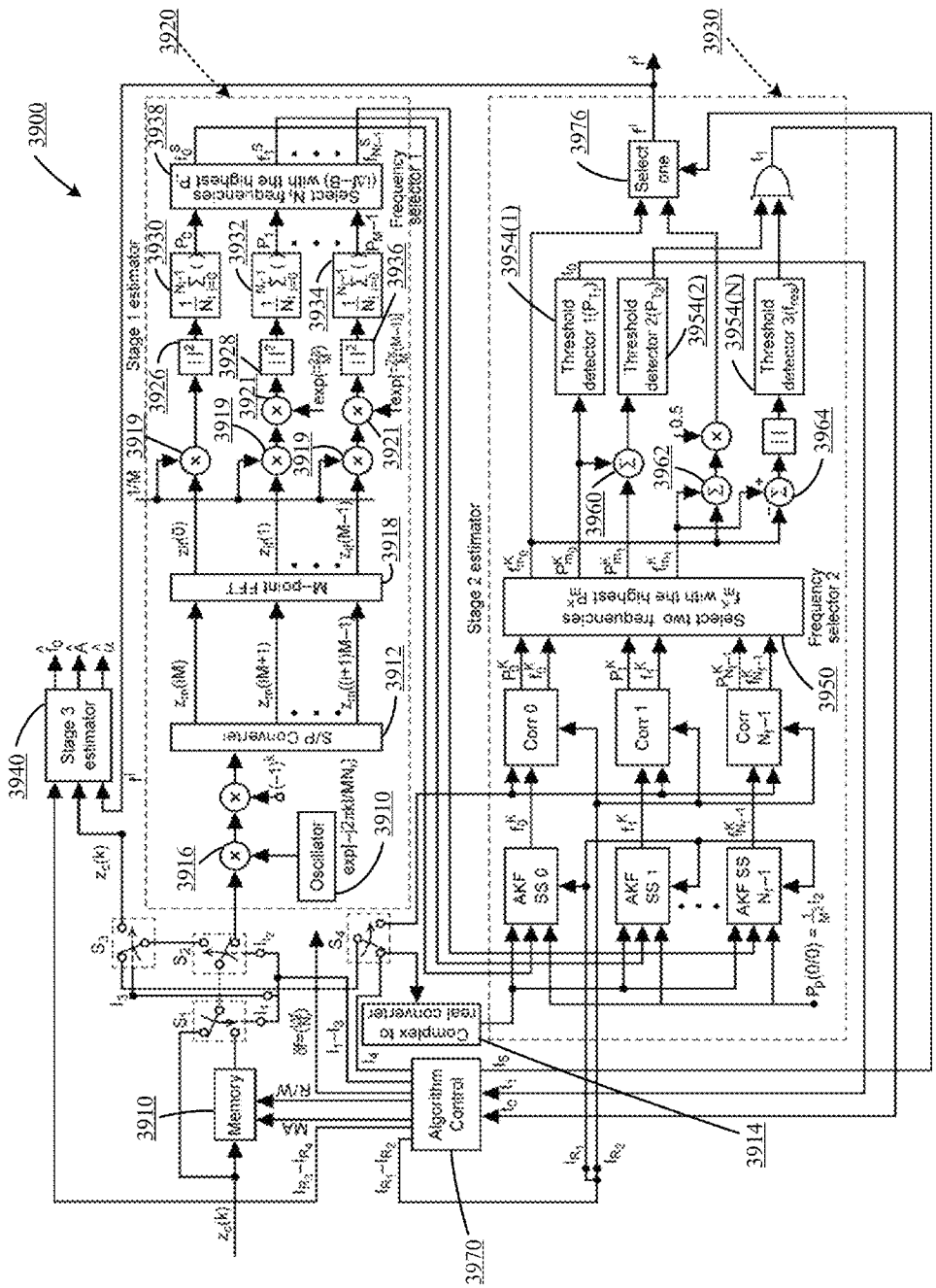
FIG. 39 is a block diagram illustrating an example architecture for providing signal parameter estimation using correlation detection in a low signal-to-noise environment, in accordance with embodiments of the disclosure.

FIG. 39 is a block diagram illustrating an architecture 3900 according to another embodiment of the disclosure for the case of very low signal-to-noise ratio. The input complex signal may be connected to the input of a memory block 3910 and to a switch $S_1$. The output of the switch can be selected either directly from the input or read from the memory 3910. The output of the switch $S_1$ may be connected to the input of switch $S_2$ and depending upon the state of switch $S_2$ and $S_3$ it may be routed to stage 1 estimator 3920, stage 2 estimator 3930, or stage 3 estimator 3940. With the position of switches $S_1$ and $S_2$ as depicted in FIG. 39, the input signal $z_c(k)$ may be shifted in frequency by $\delta f = l \Delta f/N_r$ by a frequency converter 3916 with $N_r = 2^\kappa$ for an integer $\kappa > 0$, $l = 0, 1, \ldots, N_r - 1$, $\Delta f = F_s/M$, and M is the FFT size. The output of the frequency converter 3916 is multiplied by $(-1)^k$. The modified signal $z_m(k)$ is input to serial to parallel S/P converter 3912 that splits the input signal $z_m(k)$ into M outputs. The M outputs of the S/P converter are input to the M-point FFT block 3918 that evaluates the M-point FFT transform of the input and provides the FFT transform $[z_{if}(0)\ z_{if}(1) \ldots z_{if}(M-1)]$ at the output. For the case of $i^{th}$ input block of size M, and for the case of 0 frequency shift, $\delta f = 0$, the operation on $z_c(k)$ resulting in the FFT transform is described by (117). The M outputs of the FFT block are multiplied by $(1/M)\exp[-j2\pi m/M]$; $m = 0, 1, \ldots, M-1$ in multipliers 3919 and 3921 according to (116) illustrated for the case of $i = 0^{th}$ block, providing the correlation values $r_0(i), \ldots, r_{M-1}(i)$ at the outputs of multipliers.

When the correlation values are input to a cascade of mod square and averaging blocks $0, 1, \ldots, M-1$ 3926 to 3936 providing the estimated average power $P_0, P_1, \ldots, P_{M-1}$ present during the $N_s$ samples corresponding to $N_f$ blocks of M samples each in the respective passbands of the M FFT filters, the FFT transform may be treated as a bank of M FFT filters. Referring to (114)-(117), the $m^{th}$ output of the FFT block 3918 corresponds to shifting the input signal frequency by $f_m = -B + m\Delta f$, and averaging the frequency shifted signal over an interval of M samples. The two operations of frequency shifting and averaging are equivalent to bandpass filtering the signal with a complex bandpass filter of center frequency $f_m$ and zero crossing bandwidth equal to $2\Delta f$, and down converting the filtered signal to baseband. The power levels $P_0, P_1, \ldots, P_{M-1}$ at the output of M averaging blocks are input to the frequency selector 1 3938 block that selects $N_f$ frequencies from the set of frequencies $f_m$, $m = 0, 1, \ldots, M-1$ with the highest power levels. The selected frequencies $\{f_0^s, f_1^s, \ldots, f_{N_f-1}^s\}$ are input to the respective AKF subsystems $AKFSS0, \ldots, AKFSS(N_f-1)$ of the stage 2 estimator 3930 as the initial frequency estimates for the respective AKFSS $0, \ldots, N_f-1$.

The block diagram of the adaptive Kalman filter subsystem (AKFSS) as discussed in reference to FIG. 2 may include the matrices given by $Q(k-1) = \epsilon_Q I_2$ and $R(k) = \sigma^2 I_2$, $\sigma^2 = \sigma_n^2/M$, $Q_p(k-1) = \epsilon_{Qp} I_2$ with $\epsilon_{Qp}$ possibly equal to 0, and $F_p(k-1) = I_2$. With continuing reference to FIG. 39, the input signal $z_c(k)$ may be read from the memory 3910 and provided to a complex to real converter 3914 to generate signal $z(k)$ at the output. The signal $z(k)$ may be input to the AKF subsystems AKFSS $0, \ldots, N_f-1$ that also receive the frequencies $\{f_0^s, f_1^s, \ldots, f_{N_f-1}^s\}$ as the initial frequency estimates with the initial parameter error covariance matrix to all the AKFSSs given by $P_p(0/0) = (1/M^2) I_2$. The input signal $z(k)$, $k = 1, 2, \ldots, N_s$ is processed by the $(N_f-1)$ AKFSSs and may generate the final estimates of frequencies $f_0^K, f_1^K, \ldots, f_{N_f-1}^K$, respectively. The reset input $I_{R1}$ from the algorithm control block 3970 may provide the initialization for the AKFSS. At the end of processing by the AKFSSs, the frequency estimates $f_0^K, f_1^K, \ldots, f_{N_f-1}^K$ may be provided to correlator blocks corr $0, \ldots,$ corr $(N_f-1)$ blocks which are selected via the switch $S_4$ from the memory 3910. The correlator blocks corr $0, \ldots,$ corr $(N_f-1)$ may estimate the average power present in the input signal at the frequencies $f_0^K, f_1^K, \ldots, f_{N_f-1}^K$, respectively.

The frequencies $f_0^K, f_1^K, \ldots, f_{N_f-1}^K$, along with the estimates of the average power levels $P_0^K, P_1^K, \ldots, P_{N_f-1}^K$ present at these frequencies, are provided to the frequency selector 2 3950. The frequency selector 2 3950 selects and outputs the two frequencies $f_{m_0}^K$ and $f_{m_1}^K$, with highest average power levels $P_{m_0}^K$ and $P_{m_1}^K$, respectively, from the $N_f$ input frequencies. The highest power level $P_{m_0}^K$ may be input to the threshold detector 1 3954(1) with associated threshold level $P_{T_1}$. The output of the threshold detector $t_0$ may be equal to 1 if $P_{m_0}^K \geq P_{T_1}$ and may be 0 otherwise. The sum of $P_{m_0}^K$ and $P_{m_1}^K$ may be input to the threshold detector 2 3954(2) with associated threshold level $P_{T_2}$. The absolute value of the difference between $f_{m_0}^K$ and $f_{m_1}^K$ may be input to the threshold detector 3 3954(3) where it may be compared to the resolution frequency $f_{res}$ and the output of the threshold detector may be 1 if $|f_{m_0}^K - f_{m_1}^K| \leq f_{res}$ and 0 otherwise. The outputs of threshold detectors 2 and 3 3954(2), 3954(3) may be input to an AND gate 3960 that has output $t_1$ equal to 1 if both the inputs are 1 and 0 otherwise. Both the signals $t_0$ and $t_1$ may be provided to the algorithm control block 3970. The frequency $f_{m_0}^K$ and the average frequency $0.5(f_{m_0}^K + f_{m_1}^K)$ may be input to a frequency selector 3 3976. On the command $I_5$ from the algorithm control block 3970, the frequency selector 3 3976 may output one of the two frequencies at the output denoted by $f^r$.

Based on the values of $t_0$ and $t_1$ the algorithm control block 3970 may generate the signal $I_5$ which has 3 possible values of 0, 1, and 2. Based on $I_5$, the frequency selector 3 selects frequency $f_{m_0}^K$ if $t_0 = 1$, selects frequency $0.5(f_{m_0}^K + f_{m_1}^K)$ if $t_0 = 0$ and $t_1 = 1$, and selects none if both $t_0$ and $t_1$ are equal to 0.

If either $t_0 = 1$ or $t_1 = 1$, the first and second steps of the estimator are complete. However if both $t_0$ and $t_1$ are equal to 0, the algorithm control block 3970 may select a different value of $l$ or $\delta f = l \Delta f/N_r$ and the estimation procedure is repeated until either the threshold condition is satisfied or all of $N_r$ values of $\delta f$ have been processed. The frequency estimate $f^r$ at the completion of step 1 and 2 may be taken as the final estimate of the unknown frequency $f_0$. However, a further refinement in the frequency estimate may be made by the stage 3 of the estimator block 3940.

Figure 40:
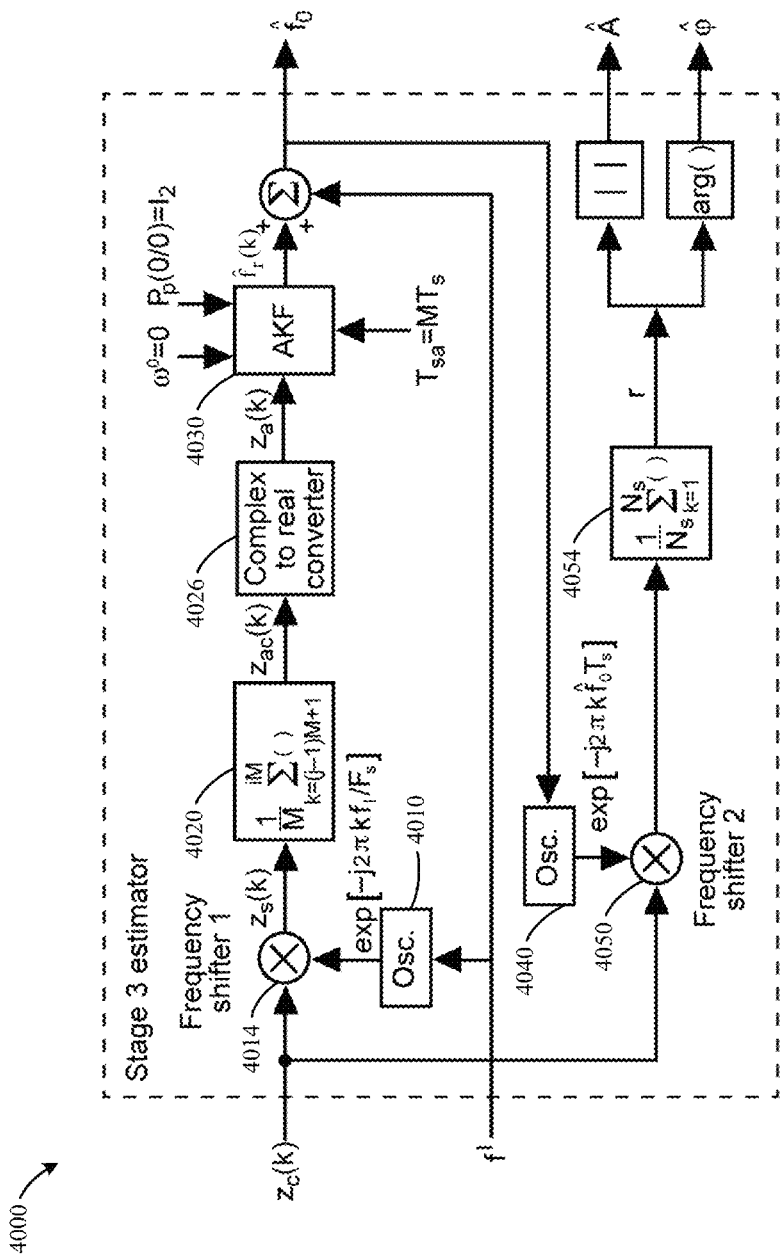
FIG. 40 is a block diagram illustrating an example estimator, such as a third stage estimator of FIG. 39, in accordance with embodiments of the disclosure.

FIG. 40 illustrates a block diagram of an example estimator 4000. The estimator 4000 may be implemented as the stage 3 estimator 3940 of FIG. 39. The complex signal $z_c(k)$ is input to a frequency shifter that shifts the frequency of the signal $z_c(k)$ by $f^r$. The frequency estimate $f^r$ at the output of the stage 2 of the estimator 3930 of FIG. 39 may be inputted to an oscillator 4010 of FIG. 40 to set the frequency of the oscillator to $f^r$. The output of the oscillator 4010 may be connected to a first frequency shifter 4014. The output $z_s(k)$ of the first frequency shifter 4014 given by (140) may be input to an averaging circuit 4020 that is configured to average the input $z_s(k)$ over an interval of M samples and generates at its output an average signal $z_{ac}(k)$ according to (141). The output of the averaging circuit 4020 may be input to a complex to real converter 4026 that may be configured to convert the complex signal into a real vector signal $z_a(k)$ that may be inputted to an AKF block 4030. The sample time to the AKF block 4030 may be set to $T_{sa} = MT_s$ with the initial estimates for the frequency $\omega^0$, and the parameter estimation error covariance matrix $P(0/0)$ is set to 0 and $I_2$, respectively. The measurement error covariance matrix $R(k)$ is set equal to $(\sigma_n^2/M)I_2$. The AKF block 4030 may process the $N_s/M$ samples of the signal $z_a(k)$ to generate the frequency estimate $\hat{f}_r(k)$ that is the estimate of the error $(f_0 - f^r)$. Adding the frequency estimate $f^r$ from stage 2 of the estimator to $\hat{f}_r(k)$ provides the final estimate $\hat{f}_0$ for the unknown frequency $f_0$.

$\hat{f}_0$ may control the frequency of a second oscillator 4040 that generates the complex exponential signal at frequency $\hat{f}_0$ which may be input to the second frequency shifter 4050. The other input of the second frequency shifter 4050 may be with the complex signal $z_c(k)$. The output of the second frequency shifter 4050 may be inputted to an averaging circuit 4054 that may average out the $N_s$ samples as the output of the second frequency shifter 4050 and generate the output r according to (145). The output of the averaging circuit 4054 may be inputted to the absolute value ∥ ∥ and the arg( ) blocks, respectively, to provide the estimate of the amplitude $\hat{A}$ and phase $\hat{\phi}$, respectively of the input signal. When the expected RMS frequency estimation error is not insignificant as may be assessed from the C-R bound, instead of using the coherent averaging in the estimation of $\hat{A}$, a quasi coherent correlation may be used in the estimation of the amplitude A. A switch (not shown) at the input of stage 3 estimator 4000 may route the input $z_c(k)$ to either the first or second frequency shifter 4014, 4050 as needed by the algorithm control block 3970 of FIG. 39.

Figure 41:
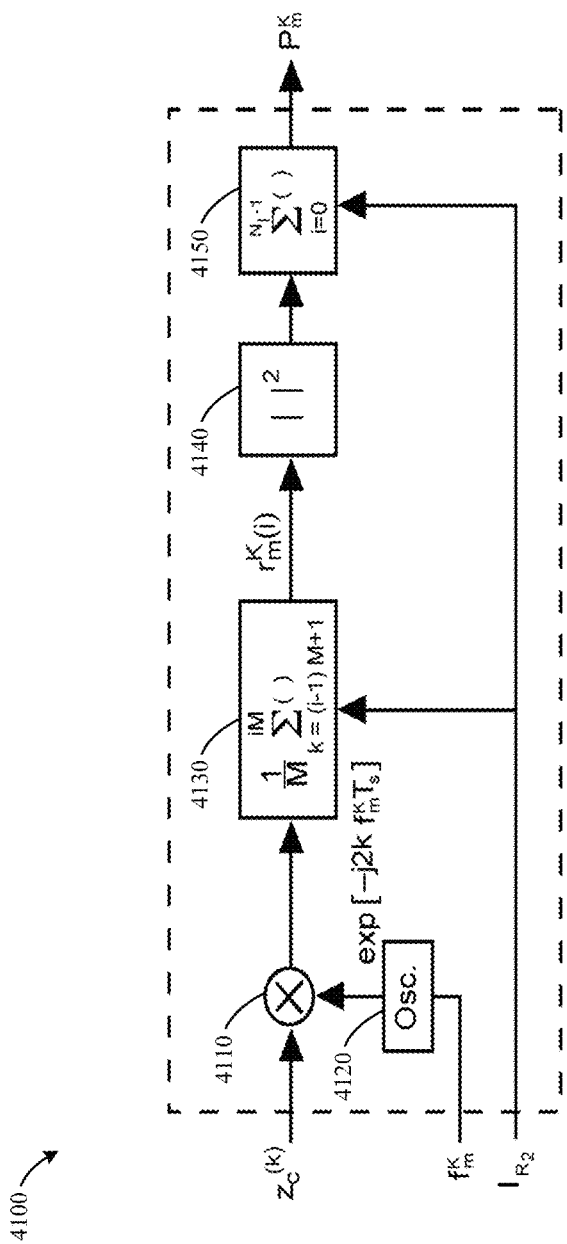
FIG. 41 is a block diagram illustrating an example correlation block as included in the example architecture of FIG. 39, in accordance with embodiments of the disclosure.

Referring now to FIG. 41 a block diagram of an example correlation block 4100 according to embodiments of the disclosure is discussed. The corr m blocks of FIG. 39 may be implemented as correlation block 4100 of FIG. 41. The complex signal $z_c(k)$ may be inputted to a frequency shifter 4110. The other input of the frequency shifter 4110 may be connected to the output of an oscillator 4120. The oscillator 4120 frequency may be set equal to $f_m^K$ as provided by the AKSSS m of FIG. 39. The output of the frequency shifter 4110 may be input to a first averaging circuit 4130 which may be configured to average the input over an interval of M samples generating $r_m^K$ at its output. The output signal $r_m^K$ may be inputted to a $\|\|^2$ block 4140 that provides the absolute value squared of the input. The $\|\|^2$ block 4140 output $|r_m^K|^2$ may be inputted to a second averaging circuit 4150 that averages out its input over the $N_I$ samples providing the output $P_m^K$ according to (137a). The reset input $I_{R2}$ from the algorithm control block 3970 of FIG. 39 may provide the initialization for the averaging circuits 4130, 4150.

Estimation of Multiple Frequencies with the AKF-EFT-CD Algorithm

Figure 42:
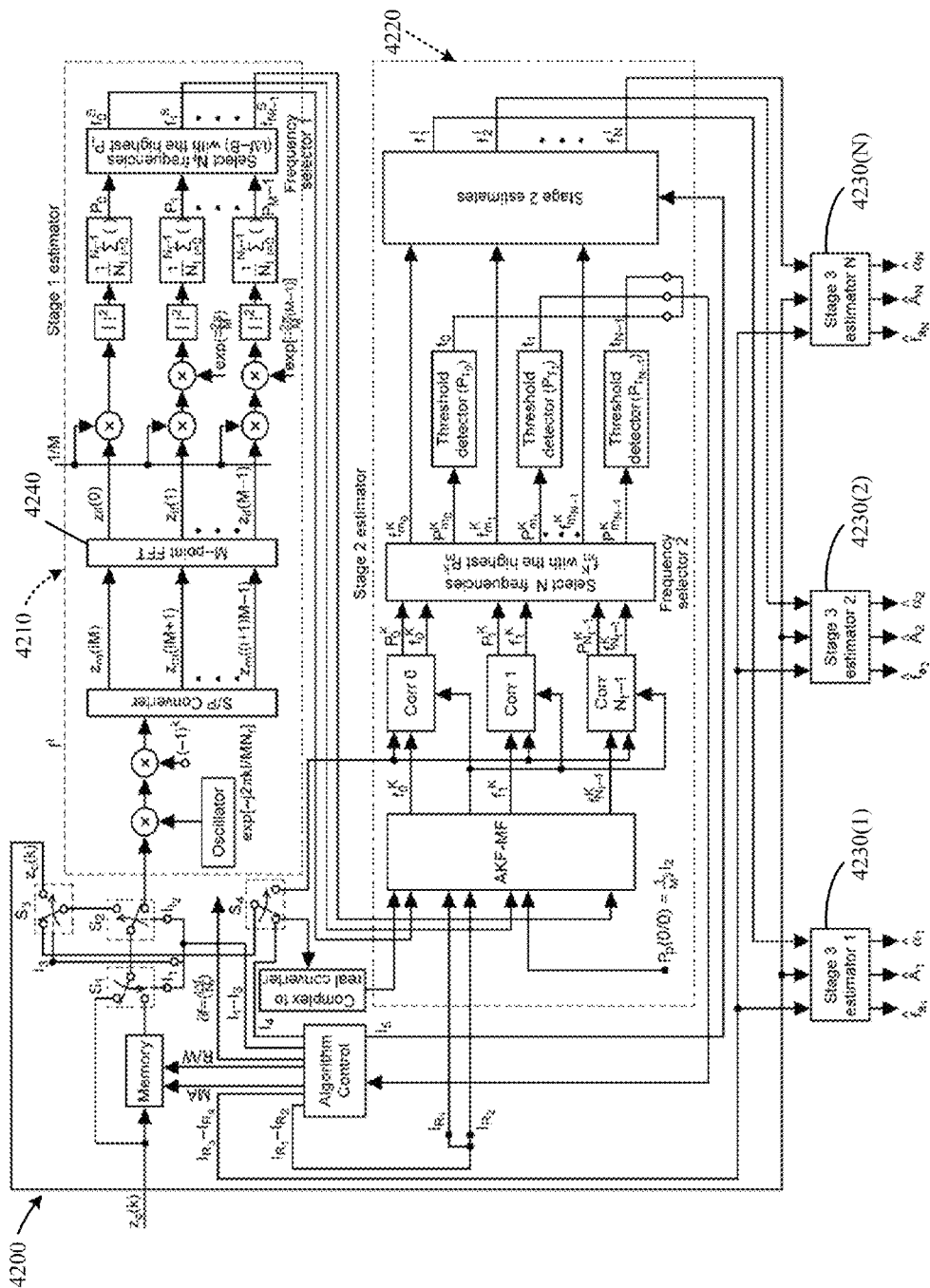
FIG. 42 is a block diagram illustrating an example architecture for providing signal parameter estimation using correlation detection in a low signal-to-noise environment for a multi-frequency signal, in accordance with embodiments of the disclosure.

The AKF-EFT-CD algorithm can be applied to the case of the input signal that includes N signals of different frequencies as in (74). FIG. 42 shows the block diagram of the FFT-AKF-CD estimator 4200 for the estimation of multiple frequencies. In a first stage 4210 of the estimator, the interval $\Delta f$ in (114) may be selected so that the minimum spacing among the input frequencies present in the input signal is higher than $2\Delta f$ and thus $M=F_s/\Delta f$ is higher than 2N. As for the case of single frequency, the average power $P_m$ may be estimated from (114) to (118) for m=0, 1, ..., M−1. The number of frequencies $N_f$ with the highest power $P_m$ may be selected for the AKF estimation with $N \le N_f \le M$, wherein a relatively higher value of $N_f$ may result in a relatively small probability of missing any of the input frequencies in the set of $N_f$ selected frequencies. The set of frequencies thus selected are denoted by $f_m^s$, m=0, 1, ..., $N_f$−1.

In a second stage 4220 of the estimator, the AKF algorithm is applied to the signal model described in (74) to (87) with N replaced by $N_f$ therein. In the signal model, the ($N_f$−N) of the amplitudes $A_m$ are zero as the number of frequencies $N_f$ selected is higher than N. With $f_m^K$, m=0, 1, ..., $N_f$−1 denoting the final frequency estimates obtained by the AKF corresponding to the $N_f$ initial frequencies $f_m^s$, the average power $P_m^K$ at these frequencies is evaluated by equation (136). The N frequencies with the highest power estimates $P_m^K$ are selected as the frequency estimates are obtained. However, if any two frequency estimates are within the resolution frequency $f_{res}$ of each other, with $f_{res}$ equal to a predetermined fraction of $\Delta f$, then these two estimates are considered to be the estimates of a single frequency out of the N frequencies. The two such frequency estimates are averaged to provide the overall estimate of the frequency with the corresponding power estimates added to obtain the overall estimate of the power at that frequency. After such a combining of the powers, the N frequencies with the highest power estimates are selected as the N frequency estimates form the step 2 of the algorithm.

As an option, a threshold on the estimates of the power levels of the individual frequencies or a threshold on the total power in all of the N frequencies may be performed as for the case of single frequency estimation. If the threshold condition is not satisfied, then the procedure may be repeated with the M frequencies $f_m$=B+m$\Delta f$, m=0, 1, ..., M−1 offset by $1\Delta f/2^\kappa$ for a selected integer $\kappa$. with the offset integer taking possible values 1, 2, ..., $2^\kappa$−1, as for the case of the single frequency estimation, to obtain a new set of initial frequencies $f_m^s$, m=0, 1 ..., $N_f$−1, running the AKF algorithm with these new estimates and obtaining the frequency estimates $f_m^K$, m=0, 1, ..., $N_f$−1 and selecting N frequencies out of the $N_f$ estimates based on their power estimates. The procedure may be repeated with different values of the offset integer i until the threshold condition is satisfied or all the $2^\kappa$−1 values of l are exhausted.

In the third stage 4230(1)-(N) estimator, the estimates $f_m^I$ of each of the N frequencies obtained from the second stage 4220 are further individually refined. In this step, the signal $z_c(k)$ may be multiplied by complex exponential function of frequency $f_m^I$ and the product averaged over an interval of $M=F_s/\Delta f$ samples as in (140)-(141) to obtain the averaged signal $z_{a,m}(k)$ that is applied to the AKF algorithm with the dimension of the state vector equal to 2 to obtain the estimate $\hat{f}_m^r$ of the residual frequency $f_m^r$ that is equal to the error in the frequency estimate. The final frequency estimate is given by (145) similar to the estimate in (142) for the single frequency case.

$$\hat{f}_m = +f_m^I + \hat{f}_m^r, m=1,2,\ldots N \qquad (145)$$

In the estimation of multiple frequencies, the signal $z_c(k)$ may be segmented into multiple signals by a polyphase filter or the bank of FFT filters 4240 as in (94-96), and the AKF-FFT-CD algorithm is applied to each of these segments to reduce the dimension of the state vector in the AKF algorithm and thus the computational requirements.

Figure 43:
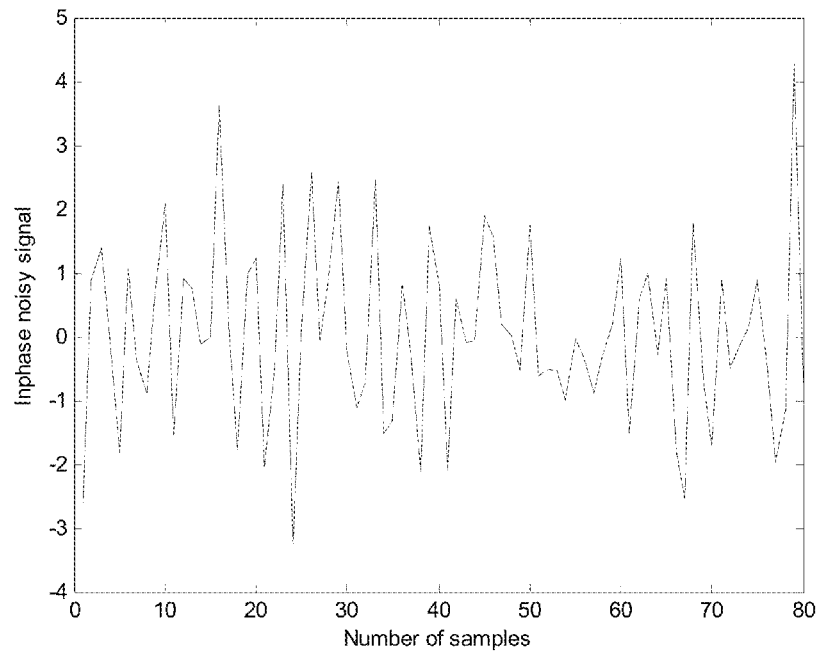
FIG. 43 shows a plot of example simulation results derived from the architecture of FIG. 39, in accordance with embodiments of the disclosure.
Figure 44:
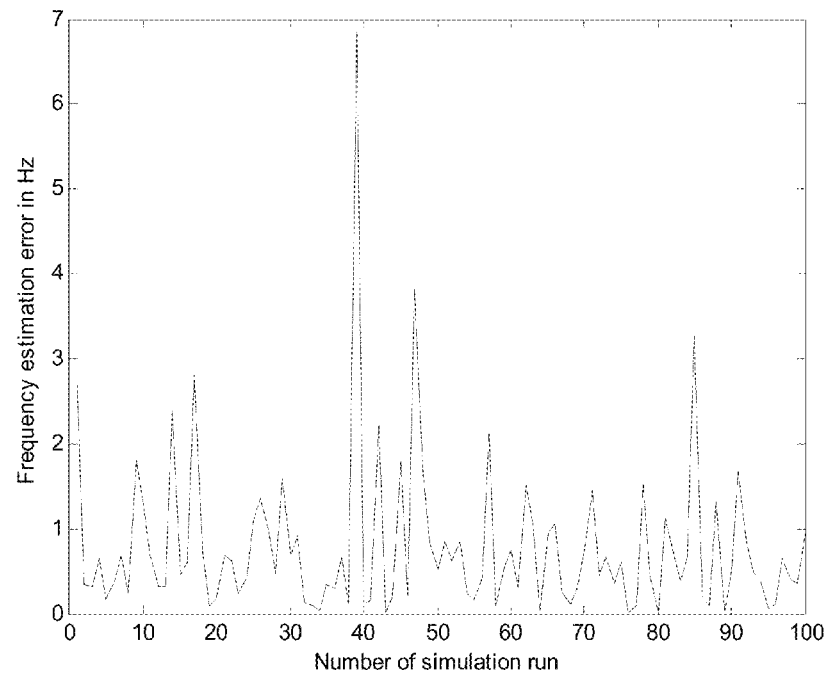
FIG. 44 shows a plot of example simulation results derived from the architecture of FIG. 39, in accordance with embodiments of the disclosure.
Figure 45:
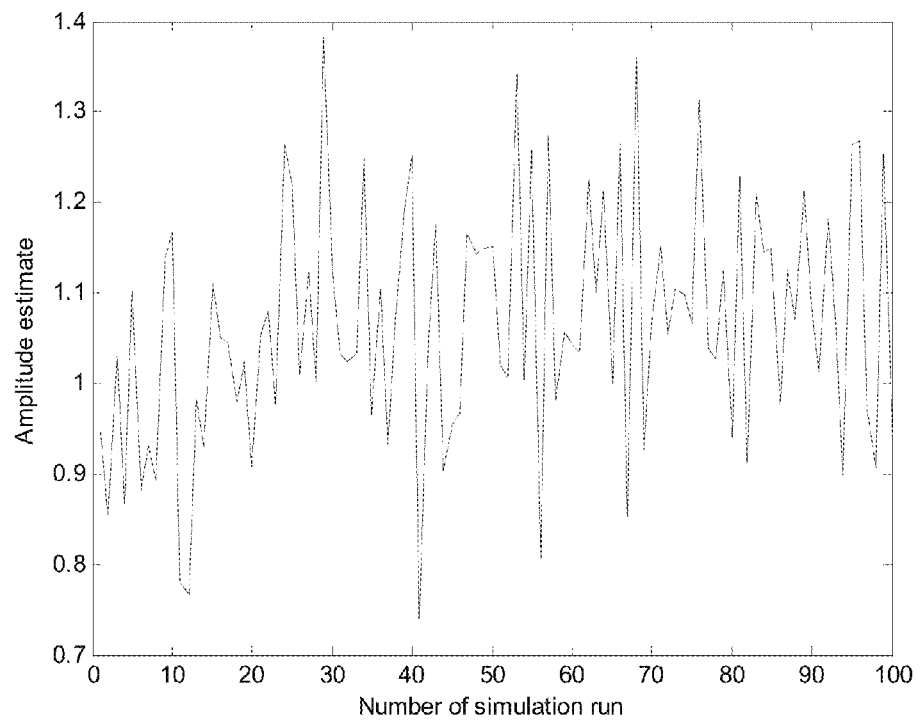
FIG. 45 shows a plot of example simulation results derived from the architecture of FIG. 39, in accordance with embodiments of the disclosure.

Akf-Fft-Cd Algorithm Without the Last Step of Frequency Translation and Decimation Simulation results are presented first for the case when the refinement step of frequency translation and decimation in equations (140) and (141) followed by the application of the AKF to the resulting signal is not performed. Instead the estimate based on selecting one of the $N_f$ estimates obtained by the AKF on the basis of the correlation detection performed on these estimates is used as the final estimate. FIG. 43 shows an example in-phase component of the received complex signal $z_c(k)$ with amplitude 1 volt and frequency of 121.2 Hz with an SNR of $\gamma$=−5 dB that appears like noise because the noise power is 3 times higher than the signal power. The AKF-FFT-CD algorithm is applied for the estimation of the frequency and amplitude with the number of simulation runs equal to 100 with the initial covariance matrix equal to $4I_2$ as in the previous examples corresponding to the frequency range of [−200, 200] Hz. The value of M is selected equal to 20. FIG. 44 shows a plot of the frequency estimation error at the end of 80 samples for the 100 simulation runs corresponding to a cumulative SNR defined as $\gamma_c$=10 log($N_s\gamma$) of 14 dB. The RMS frequency error from the 100 simulation runs is equal to 1.23 Hz compared to 0.4 Hz from the C-R bound. FIG. 45 plots the amplitude estimates obtained from equation (143) for the 100 simulation runs.

Figure 46:
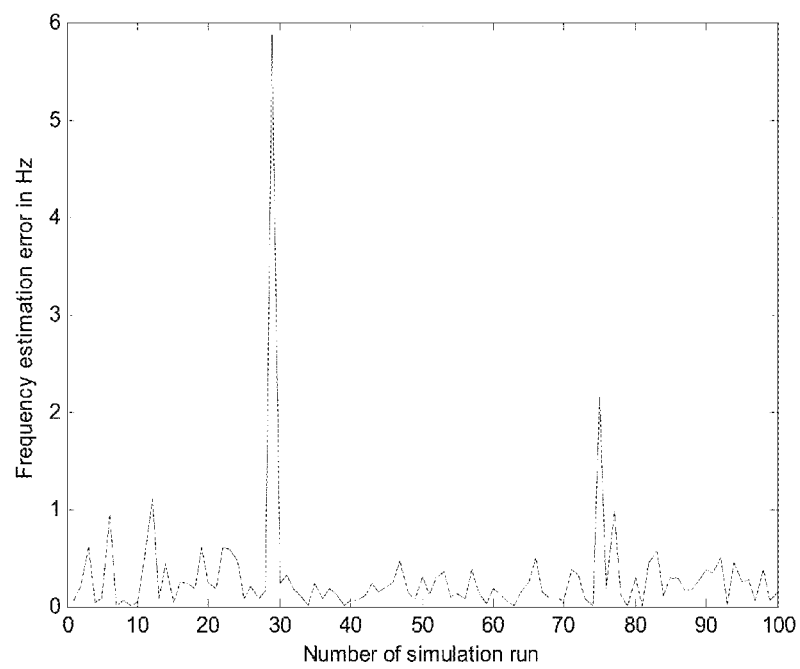
FIG. 46 shows a plot of example simulation results derived from the architecture of FIG. 39, in accordance with embodiments of the disclosure.

FIG. 46 plots the result for the case of SNR=−7 dB after processing 160 samples. The signal frequency selected randomly was −160.5 Hz for this case. The initial covariance matrix $P_p(0/0)$ is equal to $2I_2$ and the RMS frequency error is 0.70 Hz. However, if the two outliers are not included in the RMS error, the RMS error is only 0.32 Hz compared to the C-R bound of 0.17 Hz.

Figure 47:
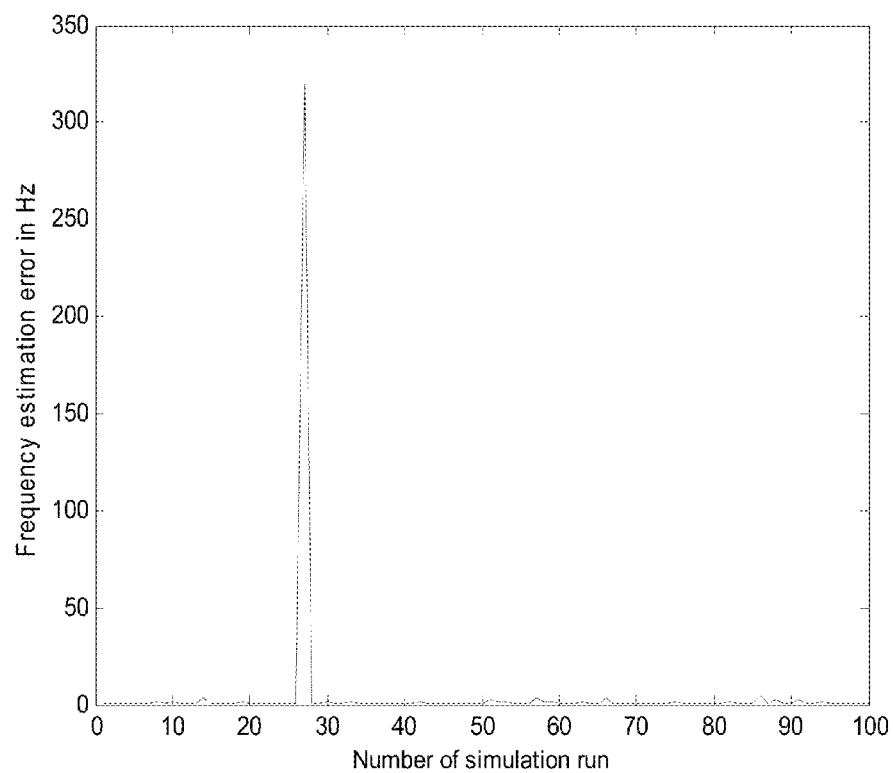
FIG. 47 shows a plot of example simulation results derived from the architecture of FIG. 39, in accordance with embodiments of the disclosure.
Figure 48:
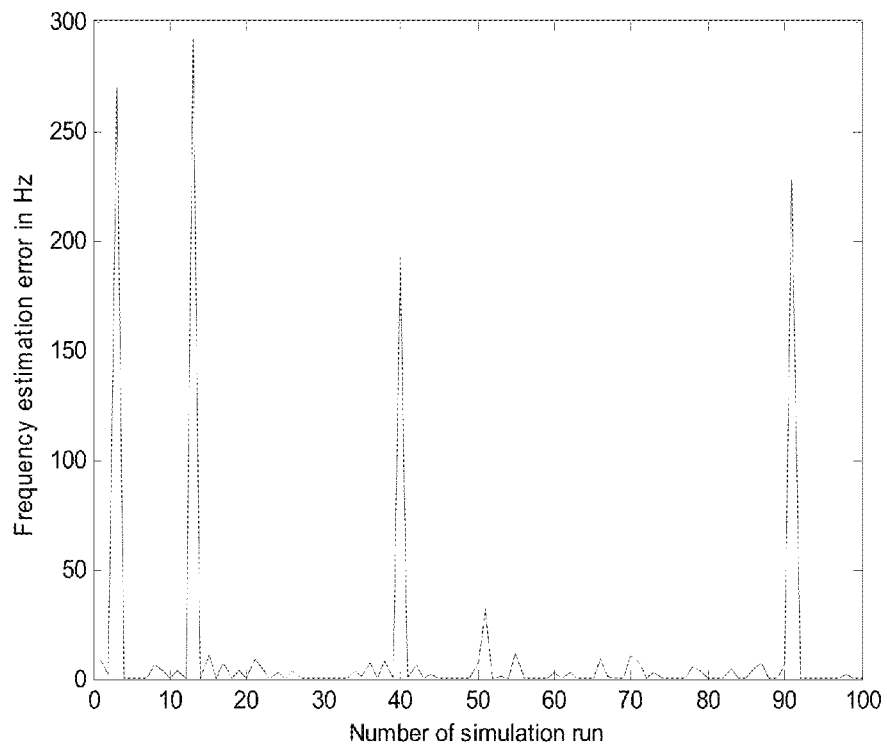
FIG. 48 shows a plot of example simulation results derived from the architecture of FIG. 39, in accordance with embodiments of the disclosure.
Figure 49:
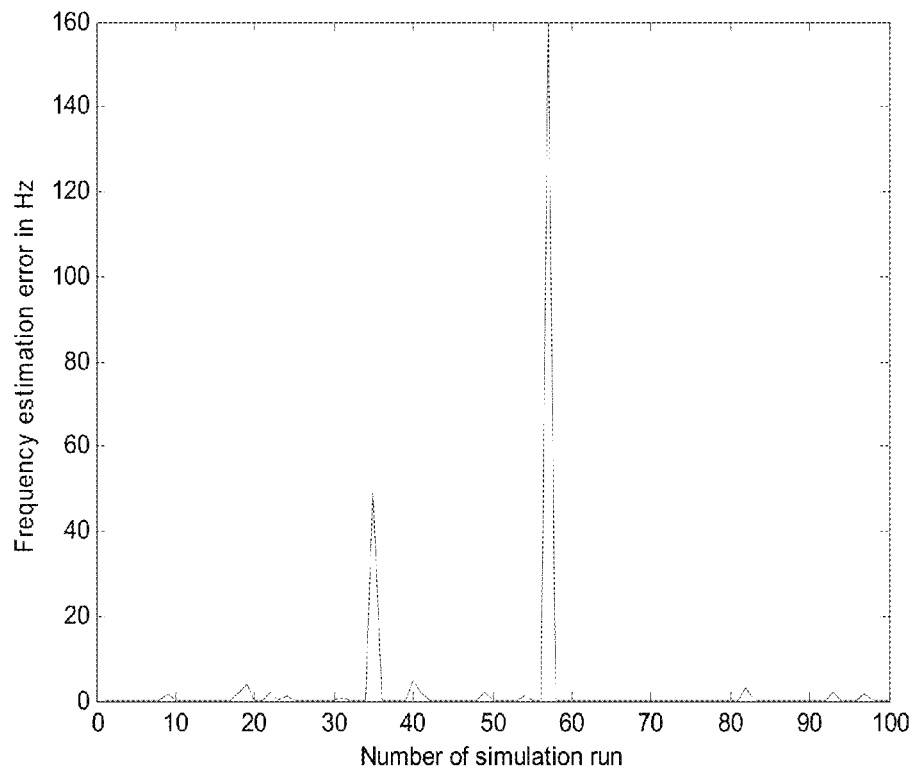
FIG. 49 shows a plot of example simulation results derived from the architecture of FIG. 39, in accordance with embodiments of the disclosure.
Figure 50:
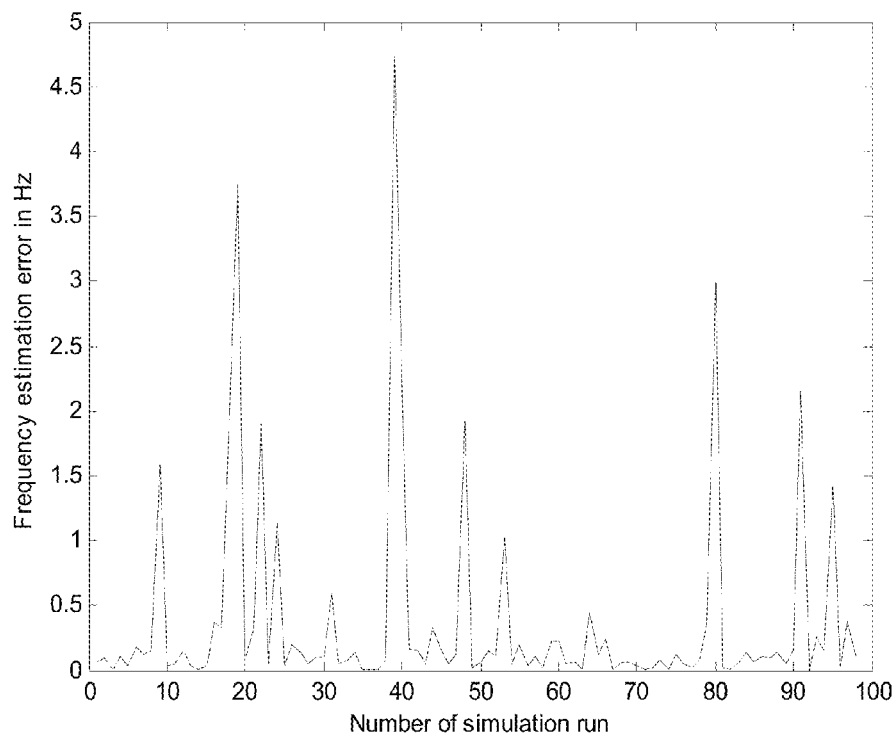
FIG. 50 shows a plot of example simulation results derived from the architecture of FIG. 39, in accordance with embodiments of the disclosure.

FIG. 47 plots the magnitude of the frequency estimation error for the case of SNR=−10 dB after processing 200 samples corresponding to $\gamma_c$ equal to 13.0 dB. The signal frequency selected randomly was −138.5 Hz for this case. The RMS frequency estimation error for this case is 1.07 Hz after rejecting 1 outlier at 325 Hz or equivalently at −75 Hz. The RMS frequency error can be further reduced to bring it in line with the C-R bound by increasing the value of $N_f$ and/or $N_r$. However, in view of the relatively small value of the resulting RMS error, increase in the values of $N_f$ or $N_r$ may not be necessary for this case. For still lower SNRs, for example, at an SNR of −12 dB even after processing 500 samples corresponding to $\gamma_c$ equal to 15 dB, there may be 5 outliers as shown in FIG. 48, the modulo $F_s$ estimation error for the outliers as lies in the range of about 10 Hz to 90 Hz. However, increasing $N_f$ to 10 from 5 and $N_r$ to 8 from 4 reduces the number of outliers is reduced to 2 as shown in FIG. 49. Further increase in $N_f$ and/or $N_r$ may remove the remaining two outliers. FIG. 50 shows the estimation error after removing the 2 outliers with an RMS error of 0.88 Hz.

Figure 51:
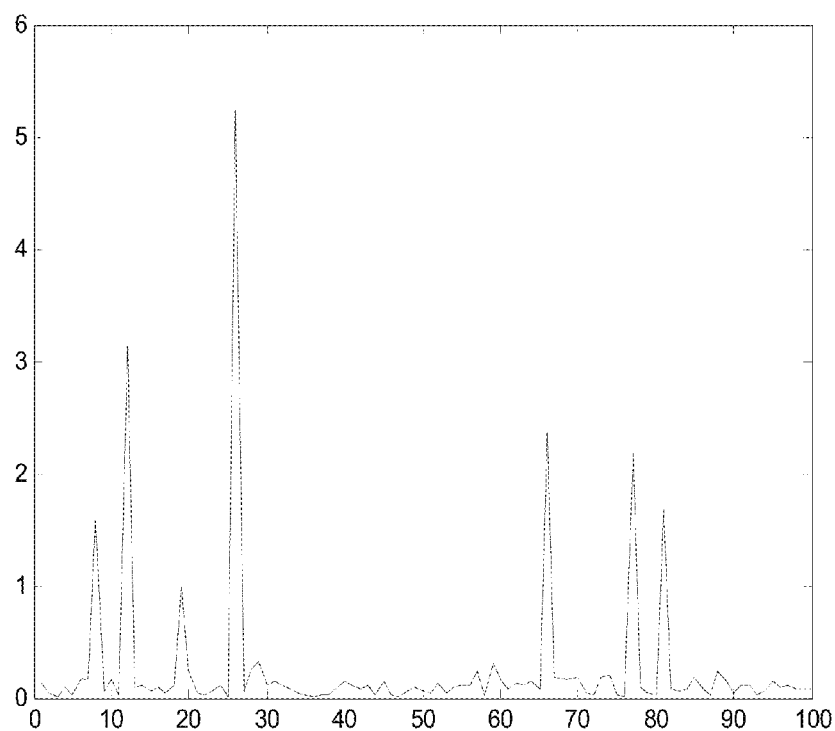
FIG. 51 shows a plot of example simulation results derived from the architecture of FIG. 39, in accordance with embodiments of the disclosure.
Figure 52:
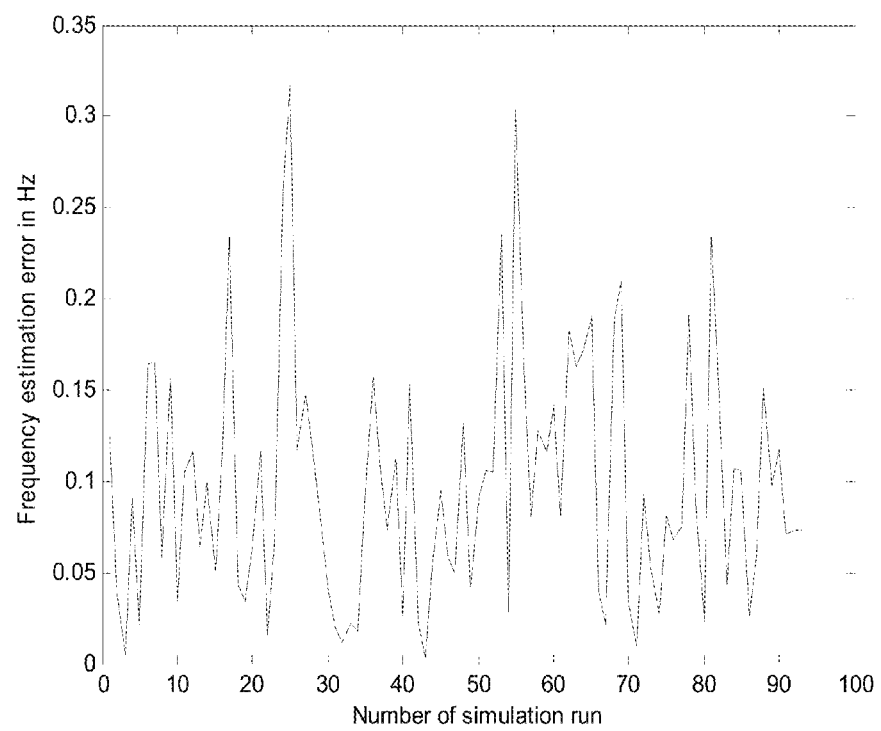
FIG. 52 shows a plot of example simulation results derived from the architecture of FIG. 39, in accordance with embodiments of the disclosure.

The estimation error can be further reduced by including the frequency translation and decimation step in (140) and (141) followed by the application of the AKF on the resulting signal. FIG. 51 plots the magnitude of the frequency estimation error for the case of SNR=−10 dB after processing 280 samples corresponding to $\gamma_c$ equal to 14.5 dB. The signal frequency selected randomly was −42.6 Hz for this case. There is no outlier in this case. The RMS frequency estimation error for this case is equal to 0.74 Hz. Examination of FIG. 51 shows that unlike the case of Gaussian distribution, some of the errors are much higher than 3×0.74=2.2 Hz. For a Gaussian distribution with RMS value of 0.74 Hz, the probability of having a value with its magnitude higher than 2.2 Hz is 0.0026 and thus among 100 simulation runs the expected number of runs with the magnitude of the estimation error exceeding 2.2 Hz is 0.26. If the simulation runs with the magnitude of the estimation error exceeding 7 times the C-R bound of 0.11 Hz is excluded from the statistics then the resulting RMS error is only 0.12 Hz for the 93 runs. FIG. 52 shows the magnitude of the estimation error for those simulation runs for which the estimation error is less than 7 times the C-R bound of $f_{crb}$=0.11. Thus, except for a few simulation runs, the RMS estimation error is very close to the C-R bound. With the increase in the number of samples $N_s$ the number of simulation runs for which the error exceeds $7f_{crb}$ is expected to reduce.

Applications

A frequency estimation system is one of the most important subsystems of communication, navigation, radar and various other engineering systems. In some cases, the efficient and precise estimation may be the critical component in the system design and may significantly limit the performance of these systems with respect to various metrics of performance. For example, in application to high dynamic GPS receivers, the ability to acquire and track the GPS carrier signal under dynamic conditions limits the performance and applicability of these receivers to various important applications. The present disclosure can drastically increase the performance capability of such systems over the existing ones.

In terms of communication systems, precise frequency and phase of the carrier are important in communication systems involving coherent modulation techniques such as MQAM and MPSK. In traditional communication applications, either the techniques that use square law loops or Costas type loops are used to derive the carrier frequency and phase from the modulated signal or a pilot signal is used which is tracked. The use of square law loops or Costas type loops results in significant loss in terms of phase noise of the reference carrier and phase ambiguity problems wherein there is phase ambiguity in the carrier phase equal to integer multiple of $2\pi/M$ for an MPSK signal. The use of pilot carrier results in a loss of signal power because a significant part of available power is used up in the pilot. The ability to provide fast and accurate frequency and phase estimates at very low SNRs can reduce the loss due to pilot carrier to an insignificant value. For example with the pilot signal 10 dB below the modulated signal power, the loss is only 0.45 dB, operation at 14 dB below results in only 0.17 dB loss compared to a loss of 1-3 dB in a traditional system. These numbers are based on the assumption that the carrier frequency uncertainty is nearly equal to the modulation signal bandwidth.

More recently precise and fast frequency acquisition and tracking have become very important with the evolution of the OFDM (Orthogonal Frequency Division Multiplexing) in mobile communication systems. The OFDM modulation scheme offers several advantages. For example, it has reduced problems of inter-symbol interference (ISI) caused by multipath propagation. It has superior performance in selective fading environments. Due to these advantages, OFDM has become part of various important standards such as WiMax. However, because the OFDM is based on the orthogonality among various subcarrier signals, it is very important that this orthogonality be maintained when these subcarriers are received at the receiver. However, the mobile wireless channels introduce frequency offsets which cause the disruption of the orthogonality among the subcarriers resulting in mutual interference among the various subcarriers. Therefore, it is very important to precisely estimate such frequency offsets and correct them to avoid the problem of intercarrier interference. The offsets may be functions of time and may be different for different subcarriers. Thus it is necessary that precise estimation of the frequency offset be made with minimum requirements on the estimation time and SNR which is also limited in systems involving error correction coding techniques. The disclosure can virtually eliminate the need for pilot carriers that are provided for the purpose of estimating the carrier offsets resulting in increased efficiency and yet are capable of providing precise estimates for these offsets.

In various radar systems, for example in Doppler and FM chirp radars, the ability to provide accurate acquisition and tracking in very low SNR conditions can result in a drastic reduction in transmit power resulting in "quiet radar." In certain embodiments, the systems and methods disclosed herein may be applied to various multi-tracking applications including, but not limited to RADAR multi-target tracking, SONAR multi-target tracking, LIDAR multi-target tracking, or combinations thereof. The above only provides a few examples where the disclosure can be exploited. The disclosure can be exploited in diverse applications including satellite communication, terrestrial wireless communication, digital TV, radars, broadcasting, radio astronomy, aeronautical and space systems, structural vibrations, seismology, general instrumentation, etc.

In general, it will be apparent that the embodiments described herein may be implemented in many different embodiments of software, firmware, and/or hardware, for example, based on Field Programmable Gate Array (FPGA) chips or implemented in Application-Specific Integrated Circuits (ASICS). The software and firmware code may be executed by a computer or computing device comprising a processor (e.g., a DSP or any other similar processing circuit) including, for example, the computing device described below. The processor may be in communication with memory or another computer-readable medium comprising the software code. The software code or specialized control hardware that may be used to implement embodiments is not limiting. For example, embodiments described herein may be implemented in computer software using any suitable computer software language type, using, for example, conventional or object-oriented techniques. Such software may be stored on any type of suitable computer-readable medium or media, such as, for example, a magnetic or optical storage medium. According to various embodiments, the software may be firmware stored at an EEPROM and/or other non-volatile memory associated with a DSP or other similar processing circuit. The operation and behavior of the embodiments may be described without specific reference to specific software code or specialized hardware components. The absence of such specific references is feasible, because it is clearly understood that artisans of ordinary skill would be able to design software and control hardware to implement the embodiments based on the present description with no more than reasonable effort and without undue experimentation.

Figure 53:
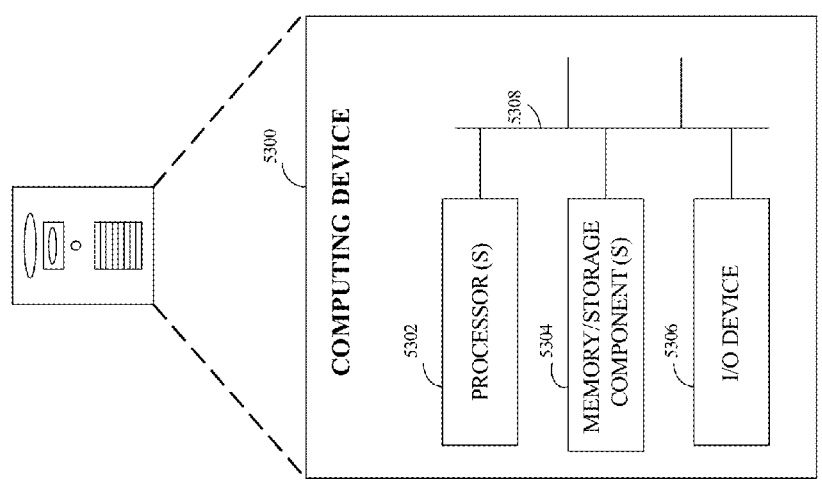
FIG. 53 illustrates an example computing system configured to execute any of the example architectures and/or algorithms disclosed herein, in accordance with embodiments of the disclosure.

FIG. 53 shows an example of a computing device 5300 according to one embodiment. For the sake of clarity, the computing device 5300 is illustrated and described here in the context of a single computing device. However, it is to be appreciated and understood that any number of suitably configured computing devices can be used to implement a described embodiment. For example, in at least some implementations, multiple communicatively linked computing devices may be used. One or more of these devices can be communicatively linked in any suitable way such as via one or more networks. One or more networks can include, without limitation: the Internet, one or more local area networks (LANs), one or more wide area networks (WANs) or any combination thereof.

In the example of FIG. 53, the computing device 5300 comprises one or more processor circuits or processing units 5302, one or more memory and/or storage circuit component(s) 5304 and one or more input/output (I/O) devices 5306. Additionally, the computing device 5300 comprises a bus 5308 that allows the various circuit components and devices to communicate with one another. The bus 5308 represents one or more of any of several types of bus structures, including a memory bus or memory controller, a peripheral bus, an accelerated graphics port, and a processor or local bus using any of a variety of bus architectures. The bus 5308 may comprise wired and/or wireless buses.

The processing unit 5302 may be responsible for executing various software programs such as system programs, application programs, and/or program modules/blocks to provide computing and processing operations for the computing device 5300. The processing unit 5302 may be responsible for performing various voice and data communications operations for the computing device 5300 such as transmitting and receiving voice and data information over one or more wired or wireless communications channels. Although the processing unit 5302 of the computing device 5300 is shown in the context of a single processor architecture, it may be appreciated that the computing device 5300 may use any suitable processor architecture and/or any suitable number of processors in accordance with the described embodiments. In one embodiment, the processing unit 5302 may be implemented using a single integrated processor. The processing unit 5302 may be implemented as a host central processing unit (CPU) using any suitable processor circuit or logic device (circuit), such as a general purpose processor. The processing unit 5302 also may be implemented as a chip multiprocessor (CMP), dedicated processor, embedded processor, media processor, input/output (I/O) processor, co-processor, microprocessor, controller, microcontroller, application-specific integrated circuit (ASIC), field programmable gate array (FPGA), programmable logic device (PLD), or other processing device in accordance with the described embodiments.

As shown, the processing unit 5302 may be coupled to the memory and/or storage component(s) 5304 through the bus 5308. The bus 5308 may comprise any suitable interface and/or bus architecture for allowing the processing unit 5302 to access the memory and/or storage component(s) 5304. Although the memory and/or storage component(s) 5304 may be shown as being separate from the processing unit 5302 for purposes of illustration, it is worthy to note that in various embodiments some portion or the entire memory and/or storage component(s) 5304 may be included on the same integrated circuit as the processing unit 5302. Alternatively, some portion or the entire memory and/or storage component(s) 5304 may be disposed on an integrated circuit or other medium (e.g., hard disk drive) external to the integrated circuit of the processing unit 5302. In various embodiments, the computing device 5300 may comprise an expansion slot to support a multimedia and/or memory card, for example.

The memory and/or storage component(s) 5304 represent one or more computer-readable media. The memory and/or storage component(s) 5304 may be implemented using any computer-readable media capable of storing data such as volatile or non-volatile memory, removable or non-removable memory, erasable or non-erasable memory, writeable or re-writeable memory, and so forth. The memory and/or storage component(s) 5304 may comprise volatile media (e.g., random access memory (RAM)) and/or non-volatile media (e.g., read only memory (ROM), Flash memory, optical disks, magnetic disks and the like). The memory and/or storage component(s) 5304 may comprise fixed media (e.g., RAM, ROM, a fixed hard drive, etc.) as well as removable media (e.g., a Flash memory drive, a removable hard drive, an optical disk). Examples of computer-readable storage media may include, without limitation, RAM, dynamic RAM (DRAM), Double-Data-Rate DRAM (DDRAM), synchronous DRAM (SDRAM), static RAM (SRAM), read-only memory (ROM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory, ovonic memory, ferroelectric memory, silicon-oxide-nitride-oxide-silicon (SONOS) memory, magnetic or optical cards, or any other type of media suitable for storing information.

The one or more I/O devices 5306 allow a user to enter commands and information to the computing device 5300, and also allow information to be presented to the user and/or other components or devices. Examples of input devices include data ports, analog to digital converters (ADCs), digital to analog converters (DACs), a keyboard, a cursor control device (e.g., a mouse), a microphone, a scanner and the like. Examples of output devices include data ports, ADCs, DACs, a display device (e.g., a monitor or projector, speakers, a printer, a network card). The computing device 5300 may comprise an alphanumeric keypad coupled to the processing unit 5302. The keypad may comprise, for example, a QWERTY key layout and an integrated number dial pad. The computing device 5300 may comprise a display coupled to the processing unit 5302. The display may comprise any suitable visual interface for displaying content to a user of the computing device 5300. In one embodiment, for example, the display may be implemented by a liquid crystal display (LCD) such as a touch-sensitive color (e.g., 76-bit color) thin-film transistor (TFT) LCD screen. The touch-sensitive LCD may be used with a stylus and/or a handwriting recognizer program.

The processing unit 5302 may be arranged to provide processing or computing resources to the computing device 5300. For example, the processing unit 5302 may be responsible for executing various software programs including system programs such as operating system (OS) and application programs. System programs generally may assist in the running of the computing device 5300 and may be directly responsible for controlling, integrating, and managing the individual hardware components of the computer system. The OS may be implemented, for example, as a Microsoft® Windows OS, Symbian OS™, Embedix OS, Linux OS, Binary Run-time Environment for Wireless (BREW) OS, JavaOS, or other suitable OS in accordance with the described embodiments. The computing device 5300 may comprise other system programs such as device drivers, programming tools, utility programs, software libraries, application programming interfaces (APIs), and so forth.

In various embodiments disclosed herein, a single component may be replaced by multiple components, and multiple components may be replaced by a single component to perform a given function or functions. Except where such substitution would not be operative, such substitution is within the intended scope of the embodiments.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

Embodiments may be provided as a computer program product including a non-transitory machine-readable storage medium having stored thereon instructions (in compressed or uncompressed form) that may be used to program a computer (or other electronic device) to perform processes or methods described herein. The machine-readable storage medium may include, but is not limited to, hard drives, floppy diskettes, optical disks, CD-ROMs, DVDs, read-only memories (ROMs), random access memories (RAMs), EPROMs, EEPROMs, flash memory, magnetic or optical cards, solid-state memory devices, or other types of media/machine-readable medium suitable for storing electronic instructions. Further, embodiments may also be provided as a computer program product including a transitory machine-readable signal (in compressed or uncompressed form). Examples of machine-readable signals, whether modulated using a carrier or not include, but are not limited to, signals that a computer system or machine hosting or running a computer program can be configured to access, including signals downloaded through the Internet or other networks. For example, the distribution of software may be an Internet download.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed:

1. A method, comprising:
    deconstructing, by one or more processors, a received input signal comprising a plurality of constituent signals, into a first plurality of component signals, wherein each of the first plurality of component signals includes a corresponding one or more second component signals;
    iteratively performing, by the one or more processors, a first adaptive linear estimation on each of the one or more second component signals to generate a state vector corresponding to each of the one or more second component signals;
    iteratively performing, by the one or more processors, one or more second adaptive linear estimations on each of the state vectors to generate a plurality of parameter vectors corresponding to each of the state vectors;
    iteratively estimating, by the one or more processors, based at least in part on the each of the plurality of parameter vector and its corresponding state vector, one or more component parameters associated with the corresponding second component signal;
    combining, by the one or more processors, the estimated one or more component parameters to generate signal parameters associated with the constituent signals;
    calculating, by the one or more processors, respective correlations between the input signal and reference signals generated based at least in part on the signal parameters; and
    determining, by the one or more processors, that the respective correlations between the input signal and reference signals meet a threshold condition.

2. The method of claim 1, wherein the input signal is a complex baseband signal that is a down conversion of and time sampling of a radio frequency (RF) signal.

3. The method of claim 1, wherein the input signal is an Orthogonal Frequency Division Multiple Access (OFDM) baseband signal comprising of a plurality of subcarrier signals and wherein estimating the signal parameters comprises estimating at least one of: (i) a frequency offsets of the subcarrier signals; (ii) a phase of the subcarrier signals; or (iii) amplitude fades of the subcarrier signals introduced by the frequency selective fading channel during the transmission of the OFDM baseband signal.

4. The method of claim 1, wherein performing the first adaptive linear estimation on each of the second component signals comprises using a first adaptive Kalman filter and performing the one or more second adaptive linear estimations on each of the state vectors comprises using a second set of adaptive Kalman filters.

5. The method of claim 1, wherein deconstructing the received input signal into the first plurality of component signals comprises applying the input signal to at least one of a bank of fast Fourier transform (FFT) filters or a bank of polyphase filters.

6. The method of claim 1, wherein iteratively estimating the one or more component parameters further comprises:
generating a reference signal based at least in part on the one or more component parameters corresponding to a second component of a first component signal of the plurality of component signals;
calculating a correlation between the reference signal and the first component signal;
generating a new estimate of the one or more component parameters until the correlation is below a threshold.

7. The method of claim 6, wherein the threshold is based at least in part on the one or more component parameters corresponding the second component signal.

8. The method of claim 6, wherein the correlation is inversely related to an estimation error between the first reference signal and a second component of the first component signal.

9. The method of claim 6, wherein the correlation is performed between a reference signal based at least in part on the one or more signal parameters corresponding to a first constituent signal and the input signal.

10. The method of claim 1, further comprising generating a new estimates of the one or more signal parameters using a plurality of second stage adaptive Kalman filters.

11. The method of claim 1, wherein the respective sets of first component signals include sinusoidal signals and the one or more estimated signal parameters comprise at least one of: (i) one or more amplitudes of the input signal; (ii) one or more phases of the input signal; (iii) one or more frequencies of the input signal; (iv) one or more first derivatives of the frequencies of the input signal; (v) one or more higher order derivatives of the frequencies of the input signal; or (vi) one or more slew rates of the input signal.

12. The method of claim 1, wherein the input signal comprises a baseband version of a received frequency chirp Radar signal.

13. The method of claim 1, wherein combining the one or more estimated component parameters to generate signal parameters associated with the input signal comprises applying the one or more estimated component parameters to a combiner or collator.

14. A system, comprising:
a memory configured to store time series samples of an input signal comprising a plurality of constituent signals;
one or more filters for deconstructing the time series of input signal to a time series of a plurality of first component signals, wherein each of the plurality of first component signals comprise one or more second component signals;
a plurality of multi-frequency adaptive Kalman filters configured to receive the time series samples of the first component signals and generate at least one parameter estimate corresponding to each of the one or more second component signals of the time series associated with the first component signal;
one or more collators for combining the parameter estimates corresponding to each of the plurality of second component signals to generate estimates of signal parameters associated with the input signal;
one or more correlation calculators for calculating the correlation between the time series samples of the input signal and a reference signal generated based at least in part on the signal parameter estimates;
a plurality of correlation threshold detectors, each correlation threshold detector configured to compare a magnitude of each of the correlation from the one or more correlation calculators with corresponding respective threshold levels;
an algorithm controller configured to generate at least one control signal based at least in part on at least one of the plurality of correlation signals and provide the at least one control signal one of the (i) memory, or (ii) the plurality of multi-frequency adaptive Kalman filter.

15. The system of claim 14, wherein each of the plurality of multi-frequency adaptive Kalman filters comprise:
a state vector Kalman filter configured to receive the time series samples of the constituent signals and generate a state vector time series associated with the constituent signals;
a vector splitter configured to receive the state vector time series and generate a plurality of state vector time series subsets;
a plurality of parameter vector Kalman filters, each parameter vector Kalman filter corresponding to a respective state vector time series subset and configured to generate a parameter vector time series based at least in part on the corresponding state vector time series subset;
a signal parameter estimator configured to receive the plurality of parameter vector time series and the state vector time series to generate at least one estimated signal parameter time series associated with the input signal.

16. The system of 15, wherein the signal parameter estimates are a first signal parameter estimates and further comprising a plurality of second stage adaptive Kalman filters, wherein each of the second stage adaptive Kalman filters is configured to receive the first signal parameter estimates and generate a second signal parameter estimates with a reduced estimation error.

17. The system of claim 16, wherein each of the second stage adaptive Kalman filters comprise:
a first Kalman filter configured to receive a corresponding respective signal parameter estimate time series associated with the input signal and generate a second state vector time series;
a second Kalman filter configured to receive the second state vector time series and generate a second parameter vector time series based at least in part on the received second state vector time series;
a signal parameter estimator configured to receive the second parameter vector time series and the second state vector time series and generate at least one estimated signal parameter associated with the input signal.

18. The system of claim 14, wherein the input signal is an Orthogonal Frequency Division Multiple Access (OFDM) baseband signal comprising of a plurality of subcarrier signals and wherein estimating the signal parameters comprises estimating at least one of: (i) a frequency offsets of the subcarrier signals; (ii) a phase of the subcarrier signals; or (iii) amplitude fades of the subcarrier signals introduced by the frequency selective fading channel during the transmission of the OFDM baseband signal.

19. The system of claim 14, wherein each the threshold levels are based at least in part on estimates of the signal parameters associated with the plurality of component signals.

20. The system of claim 14, wherein the corresponding respective correlation signal is indicative of a convergence of the estimate of the signal parameters associated with the plurality of constituent signals.

21. The system of claim 14, wherein the constituent signals comprise sinusoidal signals and the one or more estimated signal parameters comprise at least one of: (i) one or more amplitudes of the input signal; (ii) one or more phases of the input signal; (iii) one or more frequencies of the input signal; (iv) one or more first derivatives of the frequencies of the input signal; (v) one or more higher order derivatives of the frequencies of the input signal; or (vi) one or more slew rates of the input signal.

22. At least one non-transitory computer-readable medium comprising computer- executable instructions that, when executed by one or more processors, executes a method comprising:
deconstructing a received input signal, comprising one or more constituent signals, into one or more component signals;
performing a first adaptive linear estimation on each of the component signals to generate at least one state vector corresponding to each of the component signals;
separating elements of each of the at least one state vectors into one or more corresponding respective subsets;
performing one or more second adaptive linear estimations on each of the subsets to generate at least one parameter vector corresponding to each subset;
estimating, based at least in part on the at least one parameter vector and the at least one state vector, one or more signals parameters associated with the constituent signal;
calculating respective correlations between the input signal and reference signals generated based at least in part on the one or more signal parameters; and
determining that the respective correlations between the input signal and reference signals meet a threshold condition.

23. The at least one non-transitory computer-readable medium of claim 22, wherein the one or more signal parameters comprise at least one of: (i) one or more amplitudes of the input signal; (ii) one or more phases of the input signal; (iii) one or more frequencies of the input signal; (iv) one or more first derivatives of the frequencies of the input signal; (v) one or more higher order derivatives of the frequencies of the input signal; or (vi) one or more slew rates of the input signal.

24. The at least one non-transitory computer-readable medium of claim 22, further comprising combining the one or more signal parameters corresponding to the component signals to generate the signal parameters associated with the constituent signals.

25. The at least one non-transitory computer-readable medium of claim 24, wherein combining the one or more signal parameters corresponding to the component signals comprises applying the signal parameters corresponding to each of the component signals to a combiner or collator.

* * * * *